(12) United States Patent
Shirai et al.

(10) Patent No.: US 12,021,010 B2
(45) Date of Patent: *Jun. 25, 2024

(54) ELECTRONIC DEVICE WITH DIE PADS AND LEADS

(71) Applicant: Rohm Co., Ltd., Kyoto (JP)

(72) Inventors: Katsutoki Shirai, Kyoto (JP); Yoshio Higashida, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/717,875

(22) Filed: Apr. 11, 2022

(65) Prior Publication Data

US 2022/0238420 A1 Jul. 28, 2022

Related U.S. Application Data

(63) Continuation of application No. 16/827,049, filed on Mar. 23, 2020, now Pat. No. 11,404,356.

(30) Foreign Application Priority Data

Mar. 25, 2019 (JP) .................................. 2019-056013
Sep. 3, 2019 (JP) .................................. 2019-160292

(51) Int. Cl.
*H01L 23/495* (2006.01)
*H01L 21/48* (2006.01)
(Continued)

(52) U.S. Cl.
CPC .... *H01L 23/49544* (2013.01); *H01L 21/4825* (2013.01); *H01L 23/3114* (2013.01);
(Continued)

(58) Field of Classification Search
CPC .......... H01L 23/49544; H01L 21/4825; H01L 23/3114; H01L 23/49503; H01L 23/49517;
(Continued)

(56) References Cited

U.S. PATENT DOCUMENTS 5,666,009 A 9/1997 Kumano et al.
6,563,203 B2 * 5/2003 Nishimura .............. H01L 24/06
257/676

(Continued)

FOREIGN PATENT DOCUMENTS

JP 2008-294384 A 12/2008
JP 2012-015203 A 1/2012
(Continued)

OTHER PUBLICATIONS

Form PTO-892 issued in U.S. Appl. No. 16/827,049, filed Apr. 26, 2022 (1 pages).

(Continued)

*Primary Examiner* — Duy T Nguyen
(74) *Attorney, Agent, or Firm* — HSML P.C.

(57) ABSTRACT

An electronic device includes an electronic component provided with a first electrode pad, a die pad including an obverse surface facing in a first direction with the electronic component mounted on the obverse surface, a first lead, a second lead, and a first connection member electrically connecting the first electrode pad and the first lead to each other. The first lead and the second lead are disposed, as viewed in the first direction, on a same side of the die pad in a second direction perpendicular to the first direction. The first lead includes a first pad portion and a first extended portion. The first connection member is bonded to the first pad portion. The first extended portion extends from the first pad portion up to a position located between the die pad and the second lead as viewed in the first direction.

17 Claims, 38 Drawing Sheets

(51) Int. Cl.
 *H01L 23/31* (2006.01)
 *H02M 3/158* (2006.01)
(52) U.S. Cl.
 CPC .. *H01L 23/49503* (2013.01); *H01L 23/49517* (2013.01); *H01L 23/49562* (2013.01); *H01L 23/49575* (2013.01); *H02M 3/158* (2013.01)
(58) Field of Classification Search
 CPC ......... H01L 23/49562; H01L 23/49575; H01L 23/3107; H01L 23/4952; H01L 23/49541; H01L 23/49582; H01L 2224/0603; H01L 2224/48247; H01L 2224/4903; H01L 2224/49113; H01L 2224/92247; H01L 2924/181; H02M 3/158; H02M 3/003
 USPC ....................................................... 257/674
 See application file for complete search history.

(56) References Cited

U.S. PATENT DOCUMENTS

| | | | | |
|---|---|---|---|---|
| 8,519,545 | B2* | 8/2013 | Otremba | H01L 24/49 438/126 |
| 2003/0122239 | A1* | 7/2003 | Song | H01L 23/49575 257/686 |
| 2003/0141579 | A1* | 7/2003 | Oda | H01L 24/97 257/690 |
| 2008/0315408 | A1* | 12/2008 | Ko | H01L 23/49575 257/E23.068 |
| 2013/0049231 | A1 | 2/2013 | Miyoshi et al. | |
| 2013/0207252 | A1 | 8/2013 | Muto et al. | |
| 2013/0241041 | A1 | 9/2013 | Yu et al. | |
| 2014/0306328 | A1 | 10/2014 | Mikado et al. | |
| 2014/0306330 | A1* | 10/2014 | Williams | H01L 23/49551 438/123 |
| 2015/0206834 | A1* | 7/2015 | Tiu | H01L 23/49558 438/123 |
| 2015/0311144 | A1* | 10/2015 | Williams | H01L 24/40 438/122 |
| 2018/0108597 | A1* | 4/2018 | Haga | H01L 23/49555 |

FOREIGN PATENT DOCUMENTS

| | | |
|---|---|---|
| JP | 2012-222185 A | 11/2012 |
| JP | 2014-165425 A | 9/2014 |

OTHER PUBLICATIONS

Office Action received in the corresponding Japanese Patent application, dated Dec. 5, 2023, and machine translation.

* cited by examiner

ELECTRONIC DEVICE WITH DIE PADS AND LEADS

FIELD

The present disclosure relates to an electronic device, a method for manufacturing an electronic device, and a lead frame.

BACKGROUND

Conventionally, a semiconductor device that is manufactured using a lead frame has been known as an example of various kinds of electronic devices. One example of such a semiconductor device is described in JP-A-2012-222185, for example. The conventional semiconductor device disclosed in the above JP document includes a semiconductor chip, a die pad, a bonding portion, a lead, a connection member (wire), and a sealing resin. The semiconductor chip is mounted on a die pad. The bonding portion and the lead are formed integrally and are spaced apart from the die pad. The two end portions of the wire are respectively bonded to the semiconductor chip and the bonding portion. The sealing resin covers the semiconductor chip, the die pad, the bonding portion, and the wire.

The wire is bonded to the bonding portion through wedge bonding. In wedge bonding, pressure and vibration are applied to the end portions of the wire. The pressure and the vibration are also applied to the bonding portion (target to be bonded to). At this time, there is a risk that bonding of the wire cannot be suitably performed due to the bonding portion shaking or deforming.

SUMMARY

In view of the foregoing circumstance, the present disclosure aims to provide an electronic device according to which a connection member can be suitably bonded to a target. The present disclosure also aims to provide a method for manufacturing such an electronic device, and a lead frame used for the manufacturing method.

According to an aspect of the present disclosure, there is provided an electronic device comprising: an electronic component provided with a first electrode pad; a die pad including an obverse surface facing in a first direction, the electronic component being mounted on the obverse surface; a first lead spaced apart from the die pad; a second lead spaced apart from the die pad and the first lead; and a first connection member electrically connecting the first electrode pad and the first lead to each other. The first lead and the second lead are disposed, as viewed in the first direction, on a same side of the die pad in a second direction perpendicular to the first direction. The first lead includes a first pad portion and a first extended portion. The first connection member is bonded to the first pad portion. The first extended portion extends from the first pad portion up to a position located between the die pad and the second lead as viewed in the first direction.

Other features and advantages of the present disclosure will become clear through the following detailed description given with reference to the attached drawings.

EMBODIMENTS

Figure 1:
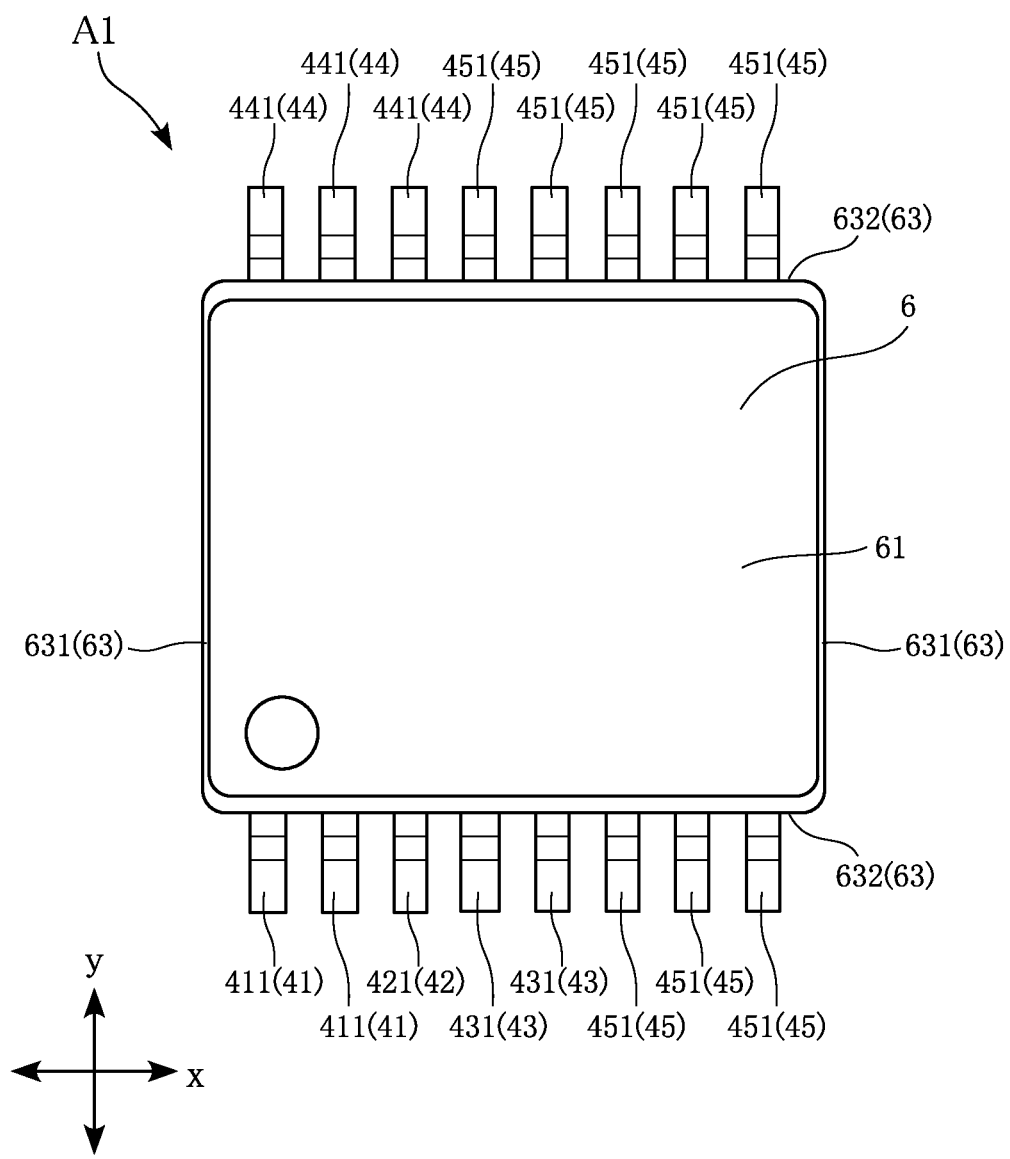
FIG. 1 is a plan view showing an electronic device according to a first embodiment of a first aspect.

Various configurations based on first and second aspects of the present disclosure will be described hereinafter with reference to the drawings. Note that identical or similar configurational elements are denoted by identical reference numerals, and redundant description thereof is omitted as appropriate.

In the present disclosure, the phrases "a certain object A is formed on a certain object B" and "a certain object A is formed above a certain object B" include "a certain object A being formed directly on a certain object B" and "a certain object A being formed on a certain object B with another object interposed between the certain object A and the certain object B", unless otherwise specified. Similarly, the phrases "a certain object A is arranged on a certain object B" and "a certain object A is arranged above a certain object B" include "a certain object A being arranged directly on a certain object B" and "a certain object A being arranged on a certain object B with another object interposed between the certain object A and the certain object B", unless otherwise specified. Similarly, the phrase "a certain object A is located above a certain object B" includes "a certain object A being located on a certain object B, the certain object A being in contact with the certain object B" and "a certain object A being located above a certain object B with another object interposed between the certain object A and the certain object B", unless otherwise specified. Similarly, the phrases "a certain object A is stacked on a certain object B" and "a certain object A is stacked above a certain object B" include "a certain object A being stacked directly on a certain object B" and "a certain object A being stacked on a certain object B with another object interposed between the certain object A and the certain object B", unless otherwise specified. Also, the phrase "a certain object A overlapping with a certain object B when viewed in a certain direction" includes "a certain object A overlapping with all of a certain object B" and "a certain object A overlapping with a portion of a certain object B", unless otherwise specified.

Figure 2:
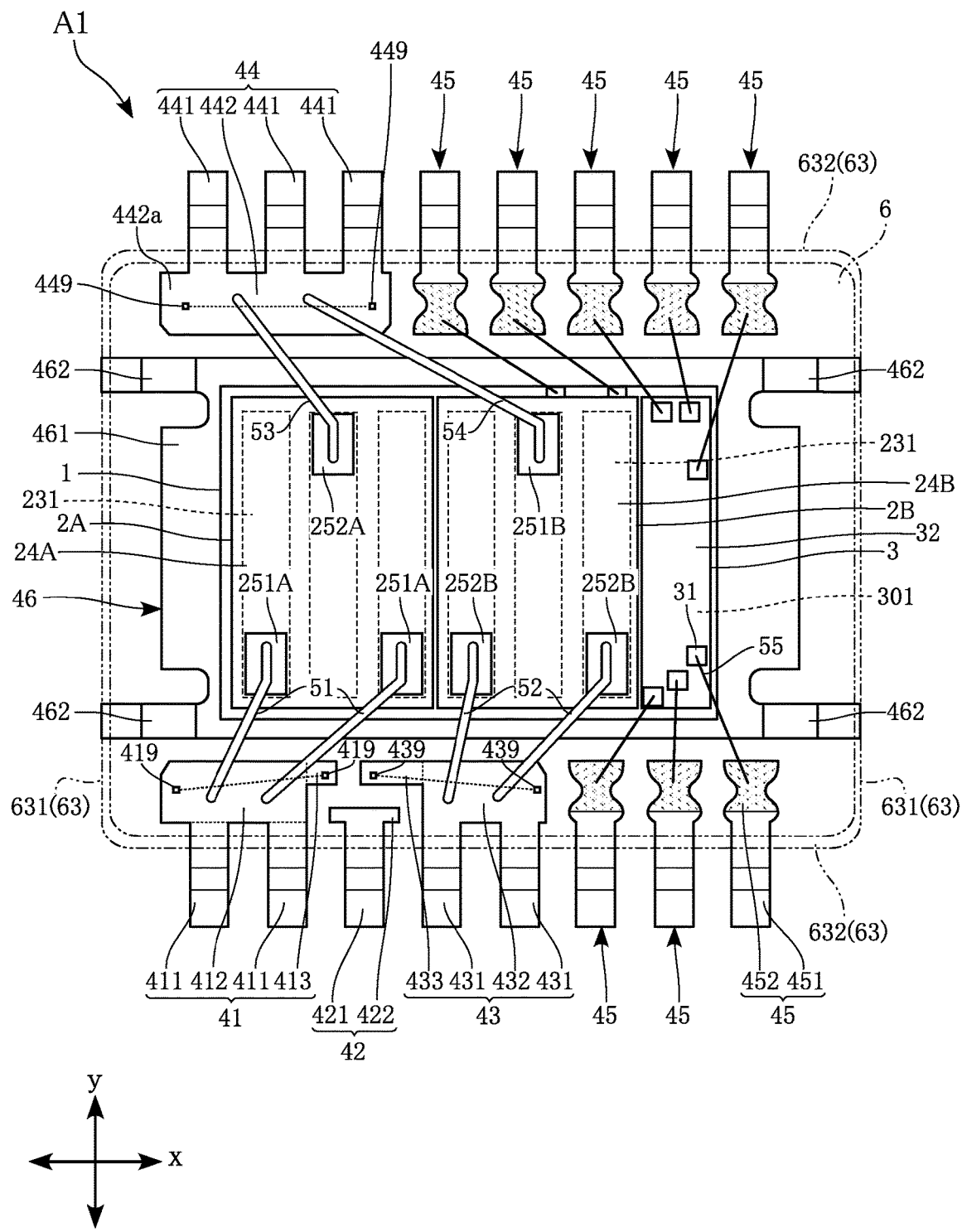
FIG. 2 is a plan view showing the electronic device according to the first embodiment on the first aspect, viewed through a resin member.
Figure 3:
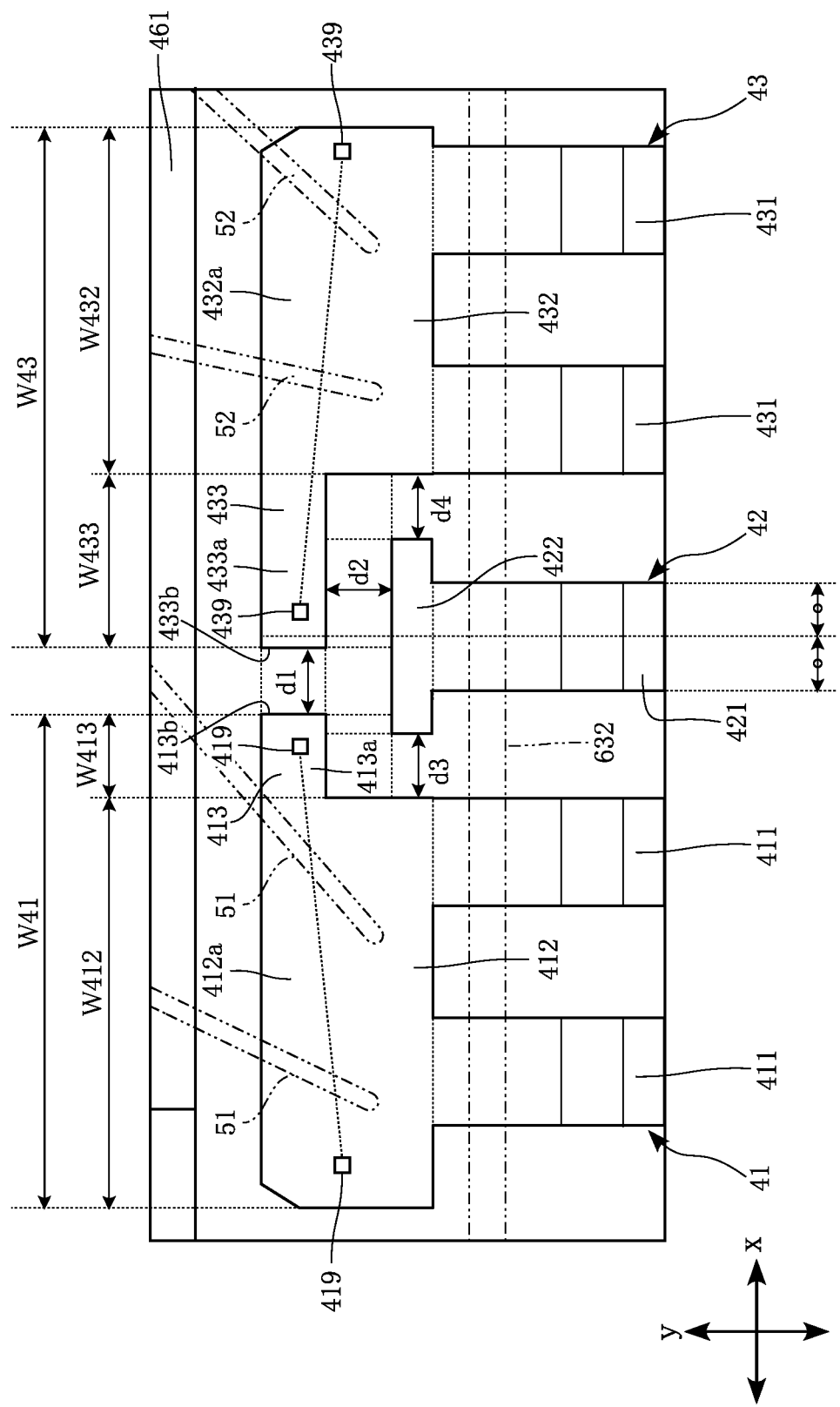
FIG. 3 is an enlarged view showing a portion of FIG. 2.
Figure 4:
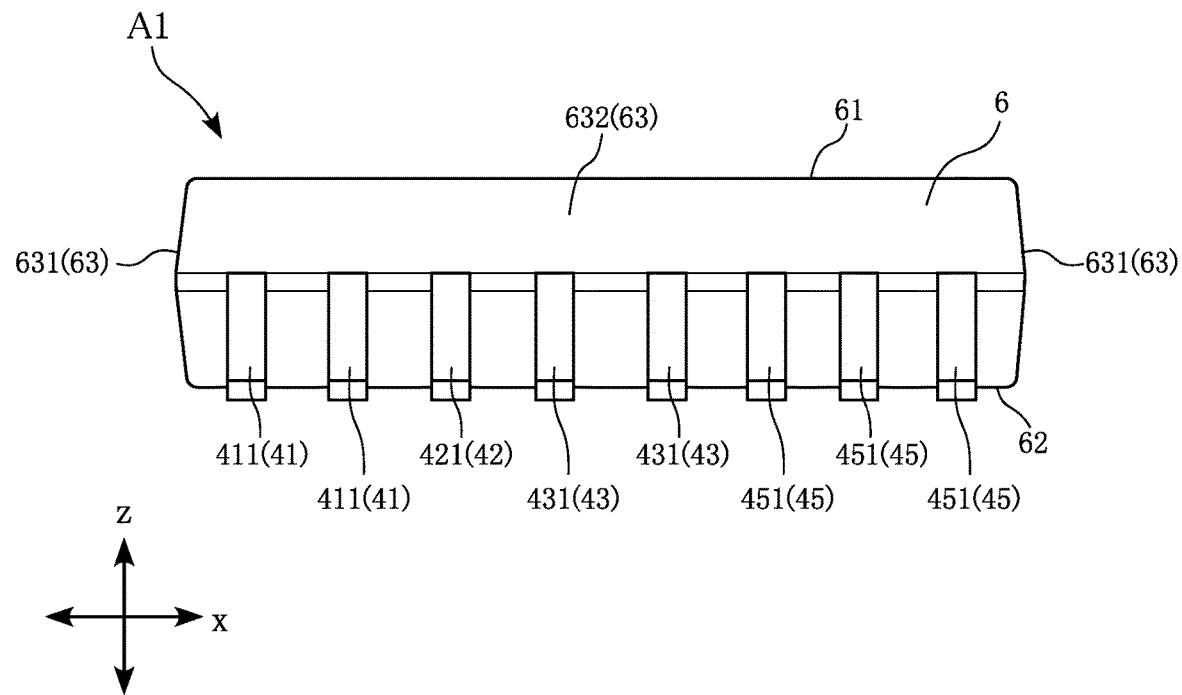
FIG. 4 is a front view showing the electronic device according to the first embodiment of the first aspect.
Figure 5:
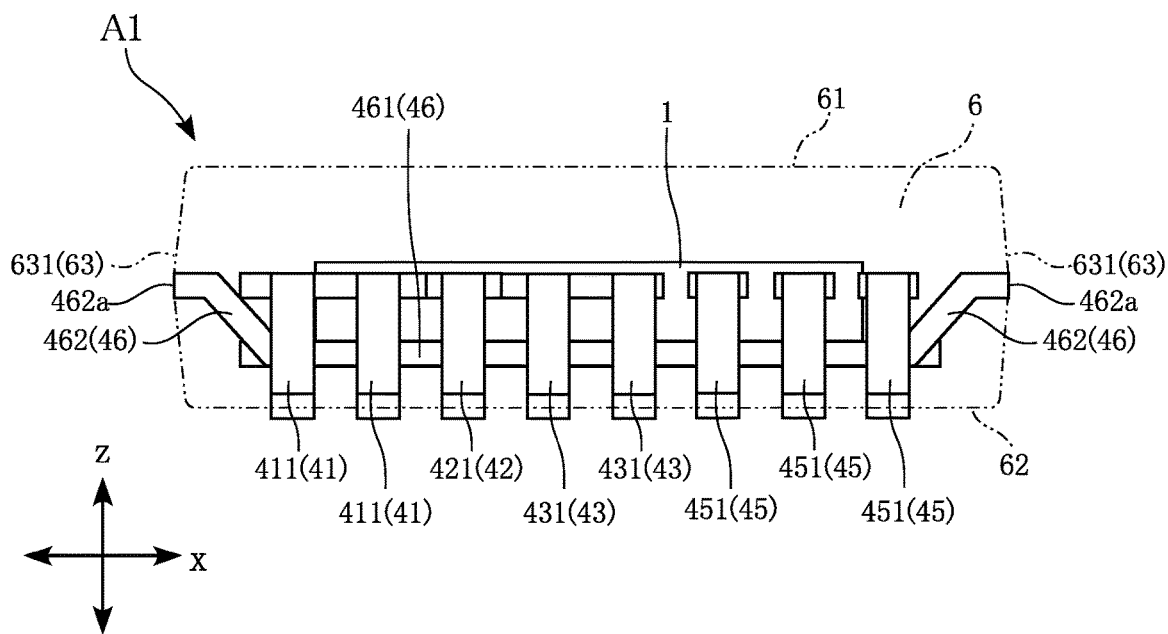
FIG. 5 is a front view showing the electronic device according to the first embodiment of the first aspect, viewed through a resin member.
Figure 6:
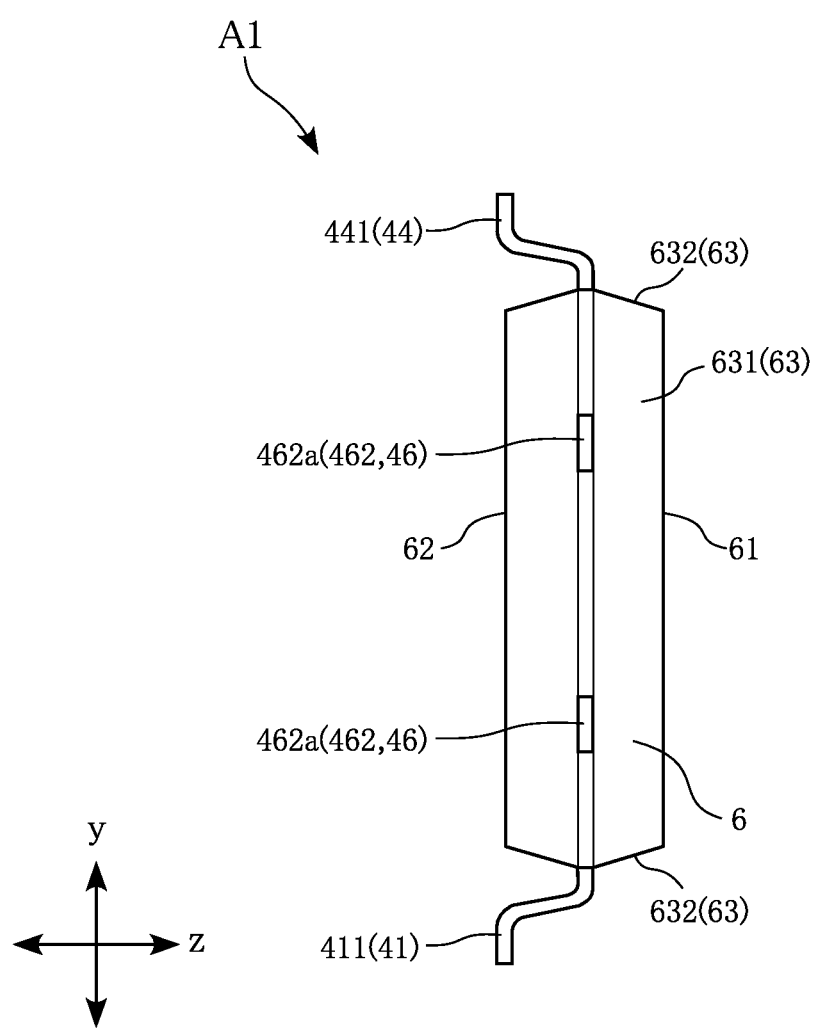
FIG. 6 is a side view showing the electronic device according to the first embodiment of the first aspect.
Figure 7:
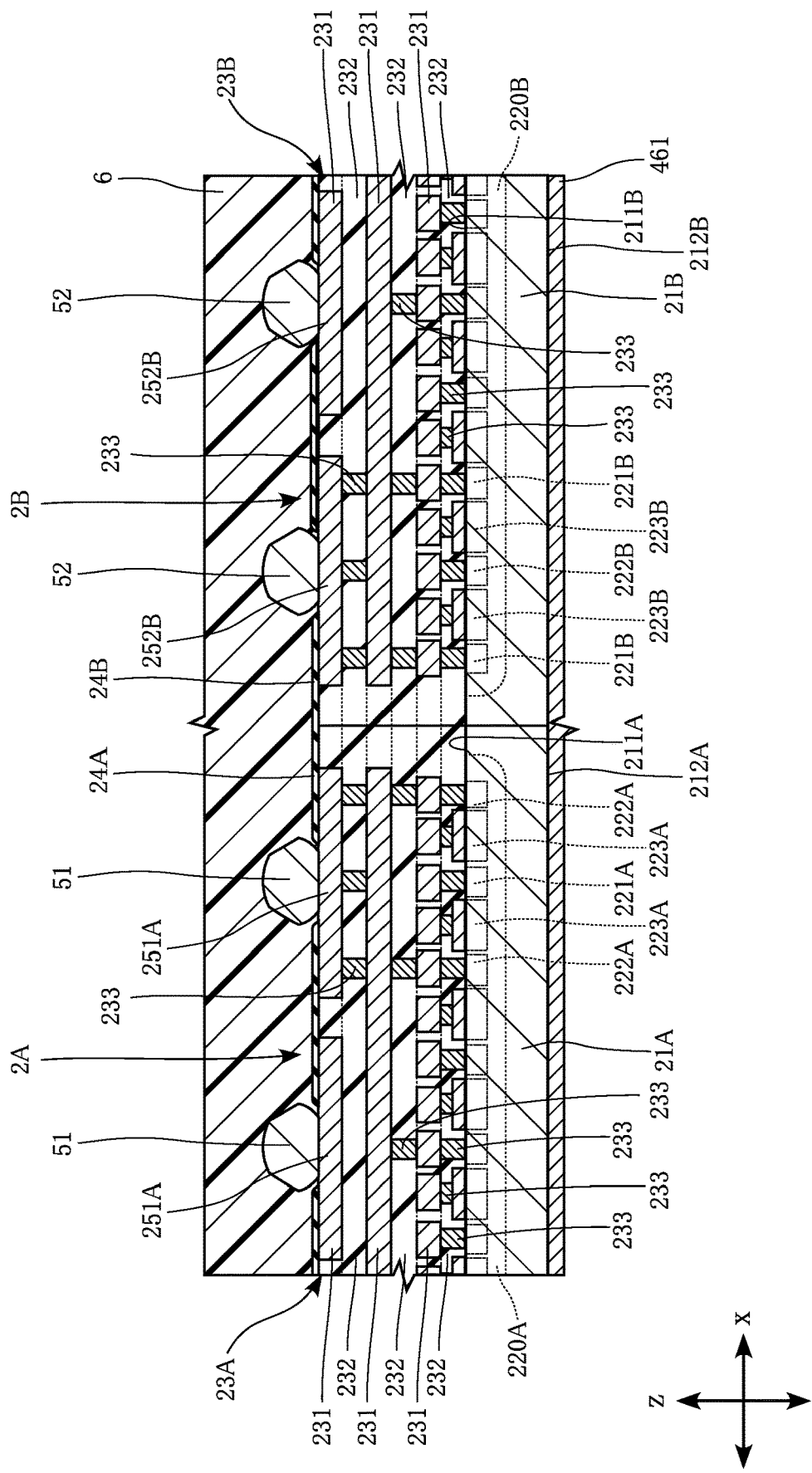
FIG. 7 is a schematic cross-sectional view showing an electronic component of the first embodiment of the first aspect.

FIGS. 1 to 7 show an electronic device based on a first embodiment of a first aspect. An electronic device A1 shown in the drawings is surface-mounted on a circuit board for various electronic apparatuses and the like. The electronic device A1 is, for example, a package called an SOP (Small Outline Package). The electronic device A1 is, for example, a power source IC. The electronic device A1 includes an electronic component 1, a lead frame 4, connection members 5, and a resin member 6. The connection members 5 are, for example, wires. However, the present disclosure is not necessarily limited thereto. In FIG. 2, the resin member 6 shown in FIG. 1 is indicated by an imaginary line (two-dot chain line). In FIG. 5, the resin member 6 shown in FIG. 4 is indicated by an imaginary line. In FIG. 5, the connection members 5 are omitted. FIG. 6 is a left-side view of the electronic device A1. FIG. 7 is a schematic cross-sectional view showing the electronic component 1 (first semiconductor elements 2A and 2B).

For the sake of convenience in the description, in FIGS. 1 to 7, three directions that are perpendicular to each other are an x direction, a y direction, and a z direction. The z direction corresponds to the thickness direction of the electronic device A1. In the following description, one direction (or sense) in the z direction (up in FIG. 4) will be called upward, and the other direction in the z direction (down in FIG. 4) will be called downward in some cases, but the orientation of the electronic device A1 is not limited. The same applies also to the other electronic devices according to the present disclosure. Further, the z direction may be referred to as a "first direction", the y direction as a "second direction" and the x direction as a "third direction" as appropriate.

The electronic component 1 is the functional center of the electronic device A1. The electronic component 1 is bonded to the lead frame 4 (die pad 46) via a bonding material. The electronic component 1 includes two first semiconductor elements 2A and 2B and a second semiconductor element 3.

The first semiconductor elements 2A and 2B are, for example, MOSFETs, but there is no limitation thereto, and the first semiconductor elements 2A and 2B may also be other transistors (e.g., bipolar transistors, IGBT, etc.), or diodes.

As shown in FIGS. 2 and 7, the first semiconductor element 2A includes a first semiconductor substrate 21A, a wiring layer 23A, an insulating protective film 24A, and electrode pads 251A and 252A.

The semiconductor substrate 21A is composed of, for example, a semiconductor material such as Si (silicon), SiC (silicon carbide), GaN (gallium nitride), and $Ga_2O_3$ (gallium oxide). As shown in FIG. 7, the semiconductor substrate 21A includes a substrate main (or obverse) surface 211A and a substrate underside (or reverse) surface 212A. The substrate main surface 211A and the substrate underside surface 212A are spaced apart from each other in the z direction. The substrate main surface 211A faces upward in the z direction. The substrate underside surface 212A faces downward in the z direction.

As shown in FIG. 7, a first active region 220A is formed on the substrate main surface 211A side of the semiconductor substrate 21A. The active region 220A includes semiconductor regions 221A, 222A, and 223A. The semiconductor regions 221A are, for example, drain regions. The semiconductor regions 222A are, for example, source regions. The semiconductor regions 223A are, for example, gate regions (first control regions).

As shown in FIG. 7, the wiring layer 23A is formed above the substrate main surface 211A of the semiconductor substrate 21A. For example, in the wiring layer 23A, conductive layers 231 and insulating layers 232 are stacked alternatingly on each other. The conductive layers 231 are electrically connected via vias 233 that are formed so as to penetrate through the insulating layers 232. The wiring layer 23A shown in FIG. 7 is one example, and the present disclosure is not limited thereto.

As shown in FIG. 7, the protective layer 24A is formed above the wiring layer 23A and covers the upper surface of the wiring layer 23A. As shown in FIG. 2, openings are formed in portions of the protective layer 24A, and the electrode pads 251A and 252A are exposed from the openings. The protective layer 24A is, for example, an $Si_3Ni_4$ layer or an $SiO_2$ layer that is formed through plasma CVD, or a polyimide resin layer that is formed through coating. Alternatively, the protective layer 24A may also be formed through a combination of plasma CVD and coating.

The electrode pads 251A and 252A are terminals of the first semiconductor element 2A. The electrode pads 251A are electrically connected to the semiconductor regions 221A via the wiring layer 23A. The electrode pads 251A are drain terminals of the first semiconductor element 2A. Some of the connection members 5 (e.g. wires 51) are bonded to the electrode pads 251A. The electrode pad 252A is electrically connected to the semiconductor regions 222A via the wiring layer 23A. The electrode pad 252A is the source terminal of the first semiconductor element 2A. One of the connection members 5 (wire 53) is bonded to the electrode pad 252A.

As shown in FIGS. 2 and 7, the first semiconductor element 2B includes a semiconductor substrate 21B, a wiring layer 23B, a protective film 24B, and electrode pads 251B and 252B.

The semiconductor substrate 21B is composed of, for example, a semiconductor material such as Si (silicon), SiC (silicon carbide), GaN (gallium nitride), and $Ga_2O_3$ (gallium oxide). As shown in FIG. 7, the semiconductor substrate 21B includes a substrate main surface 211B and a substrate underside surface 212B. The substrate main surface 211B and the substrate underside surface 212B are spaced apart from each other in the z direction. The substrate main surface 211B faces upward in the z direction. The substrate underside surface 212B faces downward in the z direction.

As shown in FIG. 7, a second active region 220B is formed on the substrate main surface 211B side of the semiconductor substrate 21B. The active region 220B includes semiconductor regions 221B, 222B, and 223B. The semiconductor regions 221B are, for example, drain regions. The semiconductor regions 222B are, for example, source regions. The semiconductor regions 223B are, for example, gate regions (second control regions).

In the example shown in FIG. 7, the respective semiconductor regions 221A may correspond to a "first semiconductor region", the respective semiconductor regions 222B to a "second semiconductor region", the respective semiconductor regions 222A to a "third semiconductor region", and the respective semiconductor regions 221B to a "fourth semiconductor region", for example.

As shown in FIG. 7, the wiring layer 23B is formed above the substrate main surface 211B of the semiconductor substrate 21B. The wiring layer 23B can be constituted similarly to the wiring layer 23A. That is, for example, in the wiring layer 23B, conductive layers 231 and insulating layers 232 are stacked alternatingly on each other. The conductive layers 231 are electrically connected via vias 233 that are formed so as to penetrate through the insulating layers 232. Note that the wiring layer 23B shown in FIG. 7 is one example, and the present disclosure is not limited thereto.

As shown in FIG. 7, the protective film 24B is formed on the wiring layer 23B and covers the upper surface of the wiring layer 23B. As shown in FIG. 2, openings are formed in portions of the protective film 24B, and electrode pads 251B and 252B are exposed from the openings. The protective layer 24B is, for example, an $Si_3Ni_4$ layer or an $SiO_2$ layer that is formed through plasma CVD, or a polyimide resin layer that is formed through coating. Alternatively, the protective layer 24A may also be formed through a combination of plasma CVD and coating. The protective film 24A and the protective film 24B may also be formed in one piece.

The electrode pads 251B and 252B are terminals of the first semiconductor element 2B. The electrode pad 251B is electrically connected to the semiconductor regions 221B via the wiring layer 23B. The electrode pad 251B is the drain terminal of the first semiconductor element 2B. One of the connection members 5 (wire 54) is bonded to the electrode pad 251B. The electrode pads 252B are electrically connected to the semiconductor regions 222B via the wiring layer 23B. The electrode pads 252B are the source terminals of the first semiconductor element 2B. Some of the connection members 5 (wires 52) are bonded to the electrode pads 252B.

In the present disclosure, the respective electrode pads 251A may be referred to as a "first electrode pad", the respective electrode pads 252B as a "second electrode pad", and the respective electrode pads 252A, 251B as a "third electrode pad", for example.

A second semiconductor element 3 is, for example, a control IC. The second semiconductor element 3 performs drive control of the first semiconductor elements 2A and 2B. The second semiconductor element 3 is electrically connected to the first semiconductor elements 2A and 2B. For example, the second semiconductor element 3 is electrically connected to the semiconductor regions 223A (gate regions) of the first semiconductor element 2A and controls the first semiconductor element 2A by outputting control signals to the semiconductor regions 223A (gate regions). Similarly, the second semiconductor element 3 is electrically connected to the semiconductor regions 223B (gate regions) of the first semiconductor element 2B and controls the first semiconductor element 2B by outputting control signals to the semiconductor regions 223B (gate regions).

The second semiconductor element 3 has an element main surface 301 that faces upward in the z direction. The element main surface 301 is covered by a protective film 32 that is similar to the protective films 24A and 24B. Openings are formed in portions of the protective film 32, and electrode pads 31 are exposed from the open portions. In the example shown in the drawings, electrode pads 31 are formed on the second semiconductor element 3.

Some of the connection members 5 (wires 55) are connected to the electrode pads 31.

The lead frame 4 forms a conductive path between the electronic component 1 and a circuit board for electronic apparatuses and the like, due to the electronic device A1 being mounted on the circuit board. The lead frame 4 supports the electronic component 1. The constituent material of the lead frame 4 is, for example, Cu (copper), or a Cu alloy. The lead frame 4 can be formed of a metal plate. The plate thickness of the metal plate is, for example, about 0.2 mm. For example, Ni plating is applied to the outer surface of the lead frame 4. As shown in FIG. 2, the lead frame 4 includes a lead 41, a lead 42, a lead 43, a lead 44, leads 45, and a die pad 46. The lead 41, the lead 42, the lead 43, the lead 44, the leads 45, and the die pad 46 are spaced apart from each other.

As shown in FIGS. 2 and 3, the lead 41 includes two terminal portions 411, a pad portion 412, and an extended portion 413. Portions of the terminal portions 411 are exposed from the resin member 6. Each terminal portion 411 is connected to the pad portion 412 at a portion covered by the resin member 6. Each terminal portion 411 is bent in the z direction at a portion exposed from the resin member 6. Some of the connection members 5 (wires 51) are bonded to the pad portion 412. The extended portion 413 extends from the pad portion 412. In the example shown in the drawings, the extended portion 413 extends from the edge of the pad portion 412 that opposes the lead 42. In a plan view (i.e. as viewed in the z direction), the extended portion 413 extends from the pad portion 412 to the space between the lead 42 and the die pad 46.

As shown in FIG. 3, in the lead 41, the pad portion 412 has a main surface 412a that faces upward in the z direction. The extended portion 413 has an extended surface 413a that faces upward in the z direction. The pad main surface 412a and the extended surface 413a are both flat and level with each other. As shown in FIG. 3, the extended portion 413 has an end portion 413b. The end portion 413b overlaps with the lead 42 (pad portion 422) in a view in the y direction. A dimension W412 in the x direction of the pad portion 412 is, for example, about 0.935 mm, and a dimension in the y direction of the pad portion 412 is, for example, about 0.4 mm. A dimension W413 in the x direction of the extended portion 413 is, for example, about 0.2 mm, and the dimension in the y direction of the extended portion 413 is, for example, about 0.15 mm.

As shown in FIGS. 2 and 3, a pair of pressing marks 419 are formed on the lead 41. The pair of pressing marks 419 are formed in a step of bonding the wires 51. One of the pair of pressing marks 419 is formed on the extended portion 413 and has a form that is slightly recessed from the extended surface 413a. The other of the pair of pressing marks 419 is formed on the pad portion 412 and has a form that is slightly recessed from the pad main surface 412a. The shapes of the pressing marks 419 in a plan view are not limited to the shapes shown in FIGS. 2 and 3, and for example, depend on the shapes of tip portions of clamp members 90.

As shown in FIGS. 2 and 3, the lead 42 includes a terminal portion 421 and a pad portion 422. A portion of the terminal portion 421 is exposed from the resin member 6. The terminal portion 421 is connected to the pad portion 422 at a portion covered by the resin member 6. The terminal portion 421 is bent in the z direction at the portion exposed from the resin member 6. The pad portion 422 is covered by the resin member 6. The pad portion 422 is not connected to any of the connection members 5. The pad portion 422 is electrically insulated from the electronic component 1. The dimension in the x direction of the pad portion 422 is greater than that of the terminal portion 421 in a plan view. The dimension in the x direction of the terminal portion 421 is, for example, about 0.25 mm, and the dimension in the x direction of the pad portion 422 is, for example, about 0.45 mm. Also, the dimension in the y direction of the pad portion 422 is, for example, about 0.1 mm.

In the example shown in FIG. 2, the electronic component 1 is mounted on the die pad 46 and provided with at least one first electrode pad 251A, which is connected to the first lead via the connection member 51. The second lead 42, electrically insulated from the electronic component 1, is disposed on the same side as the first lead 41 with respect to the die pad 46. In other words, the first and second leads 41, 42 are offset (spaced apart) from the die pad 46 in (one sense of) the y direction. Further, the first lead 41 includes the first pad portion 412 and the first extended portion 413 formed integral with the first pad portion 412, where one end of the connection member 51 is bonded to the first pad portion 412, and the first extended portion 413 extends in the x direction and terminates at a position located between the die pad 46 and (the pad portion 422 of) the second lead 42 as viewed in the first direction (z direction).

As shown in FIGS. 2 and 3, the third lead 43 includes two terminal portions 431, a pad portion 432, and an extended portion 433. Portions of the terminal portions 431 are exposed from the resin member 6. Each terminal portion 431 is connected to the pad portion 432 at a portion covered by the resin member 6. Each terminal portion 431 is bent in the z direction at a portion exposed from the resin member 6. Some of the connection members 5 (wires 52) are bonded to the pad portion 432. The extended portion 433 extends from the pad portion 432. The extended portion 433 extends from the edge of the pad portion 432 that opposes the lead 42. In a plan view, the extended portion 433 extends from the pad portion 432 to the space between the lead 42 and the die pad 46. The extended portion 413 and the extended portion 433 overlap with each other in a view in the x direction. A dimension W432 in the x direction of the pad portion 432 is, for example, about 0.8 mm, and a dimension in the y direction of the pad portion 432 is, for example, about 0.4 mm. A dimension W433 in the x direction of the extended portion 433 is, for example, about 0.4 mm, and the dimension in the y direction of the extended portion 433 is, for example, about 0.15 mm.

As shown in FIG. 3, in the lead 43, the pad portion 432 has a main surface 432a that faces upward in the z direction. The extended portion 433 has an extended surface 433a that faces upward in the z direction. The pad main surface 432a and the extended surface 433a are both flat and level with each other. As shown in FIG. 3, the extended portion 433 has an end portion 433b. The end portion 433b overlaps with the pad portion 422 of the lead 42 when viewed in the y direction. The end portion 433b opposes the end portion 413b.

As shown in FIGS. 2 and 3, a pair of pressing marks 439 are formed on the lead 43. The pair of pressing marks 439 are formed in a step of bonding the wires 52. One of the pair of pressing marks 439 is formed on the extended portion 433 and has a form that is slightly recessed from the extended surface 433a. The other of the pair of pressing marks 439 is formed on the pad portion 432 and has a form that is slightly recessed from the pad main surface 432a. The shapes of the pressing marks 439 in a plan view are not limited to the shapes shown in FIGS. 2 and 3, and for example, depend on the shapes of tip portions of clamp members 90.

As shown in FIG. 2, the fourth lead 44 includes three terminal portions 441 and a pad portion 442. Portions of the terminal portions 441 are exposed from the resin member 6.

Each terminal portion 441 is connected to the pad portion 442 at a portion covered by the resin member 6. Each terminal portion 441 is bent in the z direction at a portion exposed from the resin member 6. Some of the connection members 5 (a wire 53 and a wire 54, which will be described later) are bonded to the pad portion 442. The pad portion 442 has a pad main surface 442a that faces upward in the z direction. The pad main surface 442a is flat.

As shown in FIG. 2, a pair of pressing marks 449 are formed in the lead 44. The pair of pressing marks 449 are formed in a step of bonding the wires 53 and 54. The pair of pressing marks 449 are formed on the pad portion 432 and have forms that are slightly recessed from the pad main surface 432a. The shapes of the pressing marks 449 in a plan view are not limited to the shapes shown in FIGS. 2 and 3, and for example, depend on the shapes of tip portions of clamp members 90.

As shown in FIG. 2, the leads 45 include terminal portions 451 and pad portions 452. Portions of the terminal portions 451 are exposed from the resin member 6. The terminal portions 451 are connected to the pad portions 452 at portions covered by the resin member 6. The terminal portions 451 are bent in the z direction at portions exposed from the resin member 6. Some of the connection members 5 (wires 55) are bonded to the pad portions 452. In the pad portions 452, for example, Ag plating is performed on Ni plating. For ease of comprehension, the regions to which Ag plating is applied are indicted by a dot pattern in FIG. 2. The pad portions 452 have shapes whose central portions in the y direction are narrowed in a plan view.

The electronic component 1 is mounted on the die pad 46. In the example shown in the drawings, the die pad 46 is not electrically connected to the electronic component 1, but the die pad 46 may also be electrically connected to the electronic component 1. As shown in FIGS. 2 and 5, the die pad 46 includes a pad portion 461 and extended portions 462. The electronic component 1 is mounted on the surface of the pad portion 461. The pad portion 461 has, for example, a rectangular shape in a plan view. Extended portions 462 extend from the pad portion 461. End surfaces 462a are exposed from the resin member 6 at the extended portions 462. In the example shown in the drawings, the surface of the pad portion 461 that faces downward in the z direction is covered by the resin member 6, but this surface may also be exposed from the resin member 6.

As shown in FIG. 2, the lead 41, the lead 42, the lead 43, and some of the leads 45 are arranged on one side in the y direction of the die pad 46 in the lead frame 4. The terminal portions 411, 421, 431, and 451 overlap with each other in a view in the x direction. The lead 44 and the other leads 45 are arranged on the other side of the die pad 46 in the y direction in a plan view. The terminal portions 441 and 451 overlap with each other in a view in the x direction.

As shown in FIGS. 2 and 3, the terminal portions 411 of the lead 41, the terminal portion 421 of the lead 42, and the terminal portions 431 of the lead 43 are arranged side by side in the x direction. In a plan view, the terminal portion 421 of the lead 42 is interposed between the terminal portions 411 of the lead 41 and the terminal portions 431 of the lead 43.

The pad portion 422 of the lead 42 overlaps with the pad portion 412 of the lead 41 and the pad portion 432 of the lead 43 in a view in the x direction. Both the extended portion 413 of the lead 41 and the extended portion 433 of the lead 43 partially overlap with the pad portion 422 of the lead 42 in a view in the y direction. A straight line connecting the center in the x direction of the lead 42 overlaps with the extended portion 433, as shown in FIG. 3.

A dimension W41 (see FIG. 3) in the x direction of the lead 41 and a dimension W43 in the x direction of the lead 43 are substantially the same. The dimension W433 in the x dimension of the extended portion 433 of the lead 43 is greater than the dimension W413 in the x direction of the extended portion 413 of the lead 41. As described above, the dimension W413 in the x direction of the extended portion 413 is, for example, about 0.2 mm, and the dimension W433 in the x direction of the extended portion 433 is, for example, about 0.4 mm. Also, the dimension W432 in the x direction of the pad portion 432 of the lead 43 is smaller than the dimension W412 of the x direction of the pad portion 412 of the lead 41. As described before, the dimension W412 in the x direction of the pad portion 412 is, for example, about 0.935 mm, and the dimension W432 in the x direction of the pad portion 432 is, for example, about 0.8 mm. As shown in FIG. 2, the lead 41 is adjacent to the lead 42 in the x direction, but no lead is arranged on the side opposite to the side on which the lead 42 is present. Accordingly, the dimension in the x direction of the pad portion 412 of the lead 41 can be increased as appropriate. On the other hand, the lead 43 is interposed between the lead 42 and a lead 45 (the leftmost lead 45) in the x direction, and thus there is a restriction on increasing the dimension in the x direction of the pad portion 432. In view of this, with the lead 43, the dimension W433 (see FIG. 3) in the x direction of the extended portion 433 is set to be greater than the dimension W413 in the x direction of the extended portion 413. Accordingly, the difference between the total surface area of the pad main surface 412a and the extended surface 413a and the total surface area of the pad main surface 432a and the extended surface 433a can be reduced (and by extension, the total surface areas can be made equal).

A separation distance d1 (see FIG. 3) in the x direction between the extended portion 413 and the extended portion 433 is, for example, about 0.13 to 0.20 mm. A separation distance d2 in the y direction between the pad portion 422 of the lead 42 and the extended portions 413 and 433 is, for example, about 0.13 to 0.20 mm. A separation distance d3 in the x direction between the pad portion 422 of the lead 42 and the pad portion 412 of the lead 41 is, for example, about 0.13 to 0.20 mm. A separation distance d4 in the x direction between the pad portion 422 of the lead 42 and the pad portion 432 of the lead 43 is, for example, about 0.13 to 0.20 mm.

The separation distances in the y direction between the leads 41, 43, 44, and 45 and the die pad 46 are substantially the same, and are each, for example, about 0.15 mm. Also, the separation distance in the y direction between the lead 42 and the die pad 46 is greater than each of the separation distances in the y direction between the leads 41, 43, 44, and 45 and the die pad 46.

The dimensions in the x direction of the terminal portions 411, 421, 431, 441, and 451 of the leads 41 to 45 are each, for example, about 0.25 mm. Also, the separation distance between two of the terminals 411, 421, 431, 441, and 451 that are adjacent to each other in the x direction is about 0.25 mm.

The connection members 5 each electrically connect two members that are spaced apart from each other. Each connection member 5 electrically connects the electronic component 1 (one of the first semiconductor elements 2A and 2B and the second semiconductor element 3) and the lead frame 4. The connection members 5 are linear members with circular cross-sections. The connection members 5 are bonding wires. As shown in FIG. 2, the connection members 5 include the two wires 51, the two wires 52, the wire 53, the wire 54, and the wires 55.

The two wires 51 electrically connect the electrode pads 251A of the first semiconductor element 2A and the pad portion 412 of the lead 41. As shown in FIG. 2, the wires 51 have first ends that are bonded to the electrode pads 251A and second ends that are bonded to the pad portion 412. In a plan view (see FIGS. 2 and 3), the second ends of the wires 51 are arranged so as to overlap with line segments connecting the pair of pressing marks 419 that are formed on the lead 41.

The two wires 52 electrically connect the electrode pads 252B of the first semiconductor element 2B and the pad portion 432 of the lead 43. As shown in FIG. 2, the wires 52 have first ends bonded to the electrode pads 252B and second ends bonded to the pad portion 432. In a plan view, the second ends of the wires 52 are arranged so as to overlap with a line segment connecting the pair of pressing marks 439 formed on the lead 43.

The wire 53 electrically connects the electrode pad 252A of the first semiconductor element 2A and the pad portion 442 of the lead 44. As shown in FIG. 2, the wire 53 has a first end bonded to the electrode pad 252A and a second end bonded to the pad portion 442. In a plan view, the second end of the wire 53 is arranged so as to overlap with a line segment connecting the pair of pressing marks 449 formed on the lead 44.

The wire 54 electrically connects the electrode pad 251B of the first semiconductor element 2B and the pad portion 442 of the lead 44. As shown in FIG. 2, the wire 54 has a first end bonded to the electrode pad 251B and a second end bonded to the pad portion 442. In a plan view, the second end of the wire 54 overlaps with a line segment connecting the pair of pressing marks 449 formed on the lead 44.

The wires 55 electrically connect the electrode pads 31 of the second semiconductor element 3 and the pad portions 452 of the leads 45. As shown in FIG. 2, the wires 55 each have one end bonded to an electrode pad 31 and another end bonded to a pad portion 452 of a lead 45.

The constituent material of the wires 51 to 54 is, for example, Al (aluminum). The thickness (diameter) of each of the wires 51 to 54 is the same, and is, for example, about φ 125 to 200 μm. The constituent material of the wires 55 is, for example, Au (gold). The constituent material of the wires 55 may also be Cu or Al. The thickness (diameter) of each wire 55 is smaller than the thickness (diameter) of each of the wires 51 to 54. The thickness (diameter) of each wire 55 is, for example, φ 10 to 50 μm. For example, if the first semiconductor elements 2A and 2B are both MOSFETs, the wires 51 to 54 are bonded to any of the drain terminals (electrode pads 251A and 251B) or the source terminals (electrode pads 252A and 252B) of the first semiconductor elements 2A and 2B. Relatively large currents flow in the drain terminals and source terminals. Accordingly, in order to allow larger currents compared to the wires 55, thick wires composed of Al are used as the wires 51 to 54.

In the example shown in the drawings, the wires 51 to 54 are bonding wires, but bonding ribbons may also be used instead.

As shown in FIGS. 1, 2, and 4 to 6, the resin member 6 covers the electronic component 1, part of the lead frame 4, and the connection members 5. The resin member 6 is composed of an insulating resin material. The constituent material of the resin member 6 is, for example, black epoxy resin. The resin member 6 has, for example, a rectangular shape in a plan view. The resin member 6 has a resin main surface 61, a resin underside surface 62, and resin side surfaces 63.

The resin main surface 61 and the resin underside surface 62 are spaced apart from each other in the z direction. The resin side surfaces 63 are connected to both the resin main surface 61 and the resin underside surface 62 and are interposed between the resin main surface 61 and the resin underside surface 62 in the z direction. In the example shown in the drawing, the resin member 6 has a pair of resin side surfaces 631 that are spaced apart from each other in the x direction, and a pair of resin side surfaces 632 that are spaced apart from each other in they direction. The leads 41 to 45 protrude from one of the pair of resin side surfaces 632.

Figure 8:
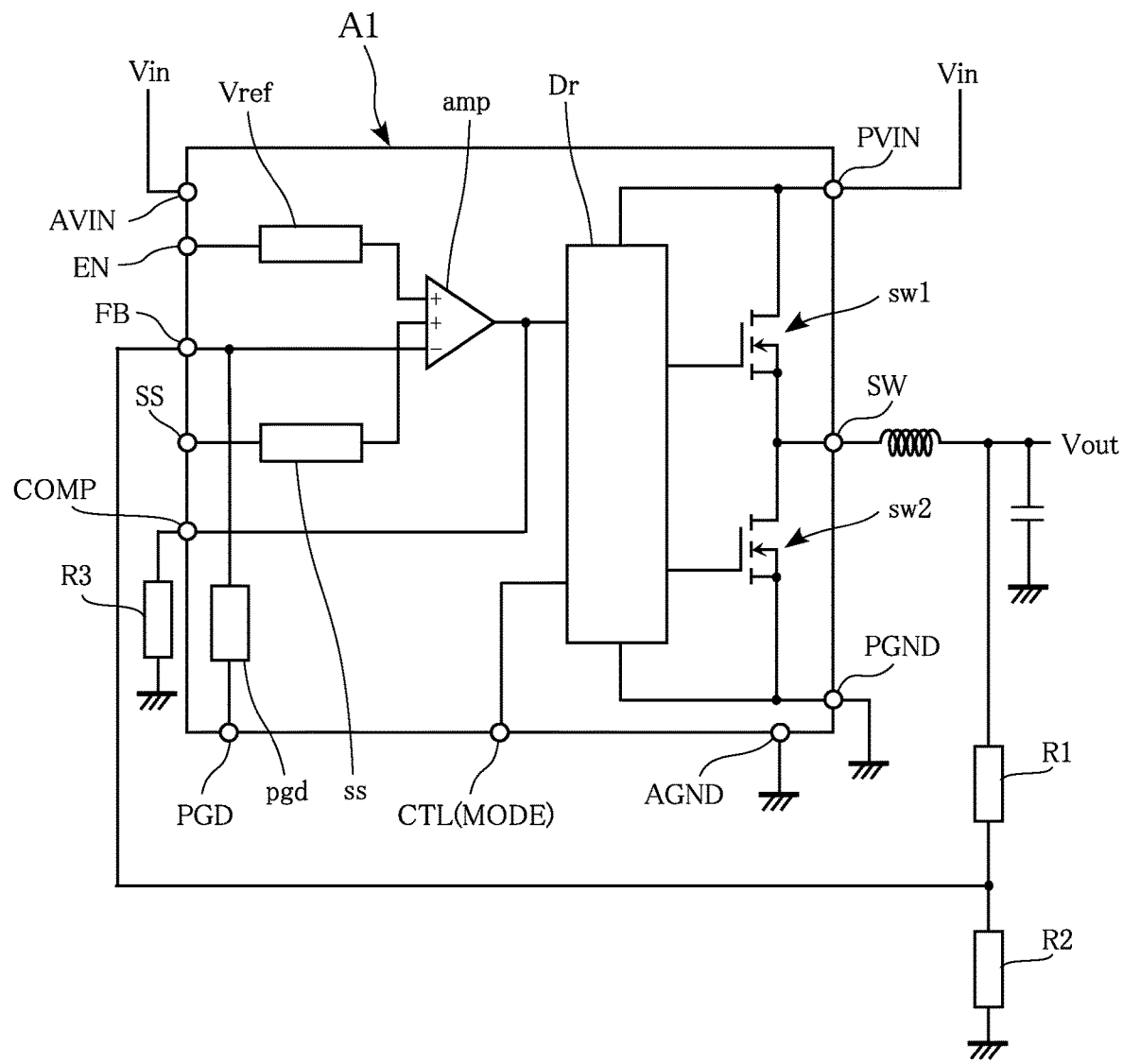
FIG. 8 is a circuit diagram for illustrating the electronic device according to the first embodiment of the first aspect.

FIG. 8 shows a circuit configuration of the electronic device A1. FIG. 8 is a circuit diagram obtained when the electronic device A1 is formed as a DC/DC converter.

In FIG. 8, reference signs sw1 and sw2 indicate switching elements. Reference sign Dr indicates a control circuit that controls the switching operations of the switching elements sw1 and sw2, various types of protective function operations, and the like. Reference signs R1 to R3 indicate resistors, reference sign Vref indicates an internal reference voltage circuit, reference sign ss indicates a soft start circuit, reference sign pgd indicates a power good circuit, and reference sign amp indicates an error amplifier that receives the Vref output voltage and the FB terminal voltage as inputs. For example, one of the switching elements sw1 and sw2 corresponds to the first semiconductor element 2A, and the other corresponds to the first semiconductor element 2B. The component including the internal reference voltage circuit Vref, the soft start circuit ss, the power good circuit pgd, the error amplifier amp, and the control circuit Dr corresponds to the second semiconductor element 3.

A terminal PVIN is a power source input terminal for a DC/DC converter. The terminal PVIN is connected to, for example, a terminal on a high potential side of a DC power source. The terminal PVIN corresponds to the lead 41 of the electronic device A1. A terminal PGND is a ground terminal of the DC/DC converter. The terminal PGND is connected to, for example, a terminal on a low potential side of the DC power source. The terminal PGND corresponds to the lead 43 of the electronic device A1. A terminal SW is an output terminal of the DC/DC converter. The terminal SW corresponds to the lead 44 of the electronic device A1.

A terminal AVIN is an analog portion power source input terminal. The terminal AGND is an analog portion ground terminal. A terminal EN is a device control terminal. A terminal FB is an output voltage feedback terminal. A terminal SS is a terminal for setting a soft start time. A terminal COMP is an ERRAMP output terminal. A terminal PGD is a power good terminal. A terminal CTL is a terminal for controlling various functions. A terminal MODE may also be used instead of the terminal CTL. The terminal MODE is a terminal for switching between various modes. The terminal AVIN, the terminal AGND, the terminal EN, the terminal FB, the terminal SS, the terminal COMP, the terminal PGD, and the terminal CTL (or the terminal MODE) each correspond to one of the leads 45.

Next, a method for manufacturing the electronic device A1 will be described with reference to FIGS. 9 to 13.

Figure 9:
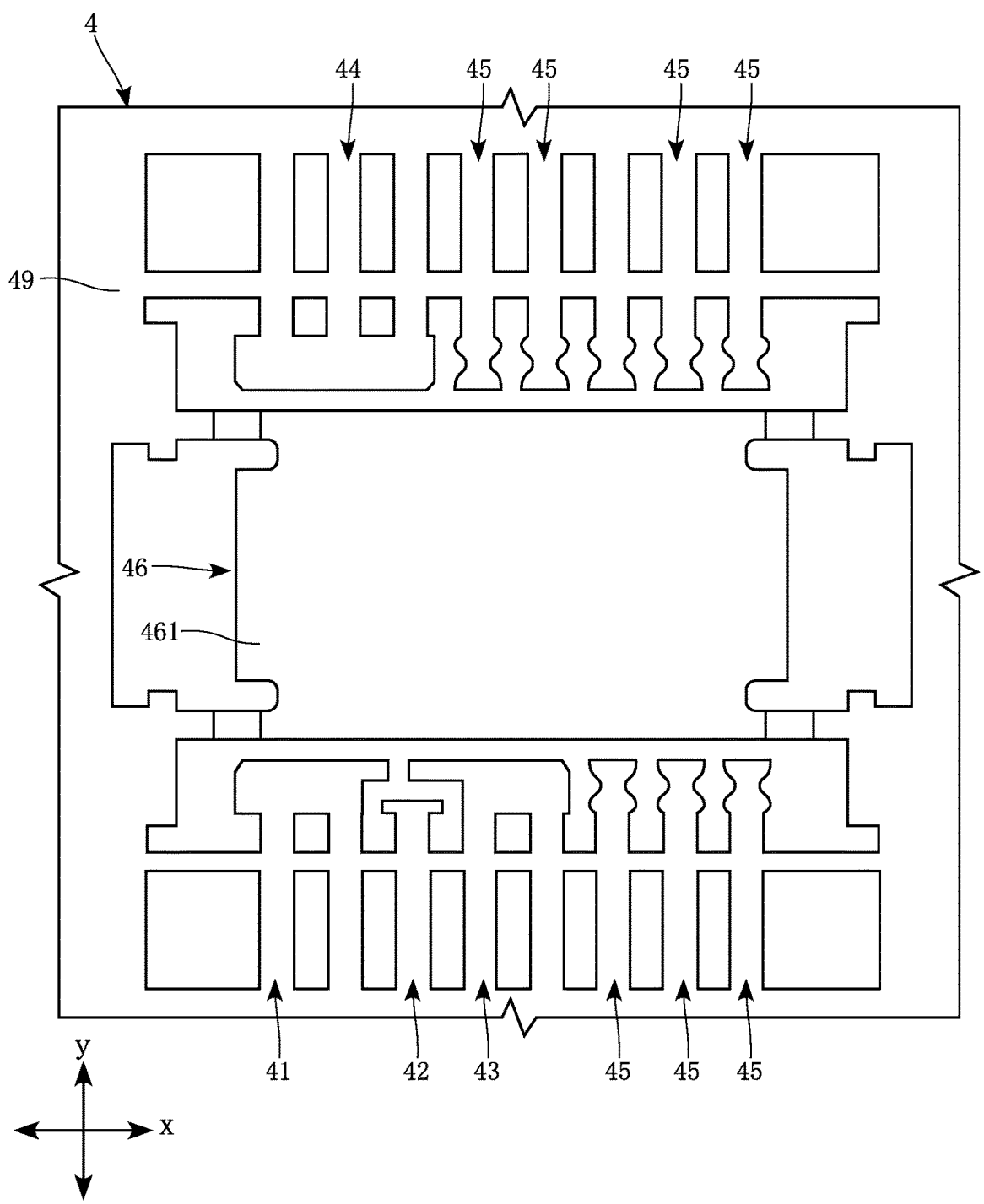
FIG. 9 is a plan view showing one step of a method for manufacturing the electronic device according to the first embodiment of the first aspect.

First, as shown in FIG. 9, the lead frame 4 is prepared (preparation step). For example, the lead frame 4 that is to be prepared can be formed by carrying out punching, etching, folding, and the like on a copper plate. As shown in FIG. 8, the lead frame 4 at this time includes the leads 41 to 45, the die pad 46, and a tie bar 49, and the leads 41 to 45 and the die pad 46 are connected by the tie bar 49.

Figure 10:
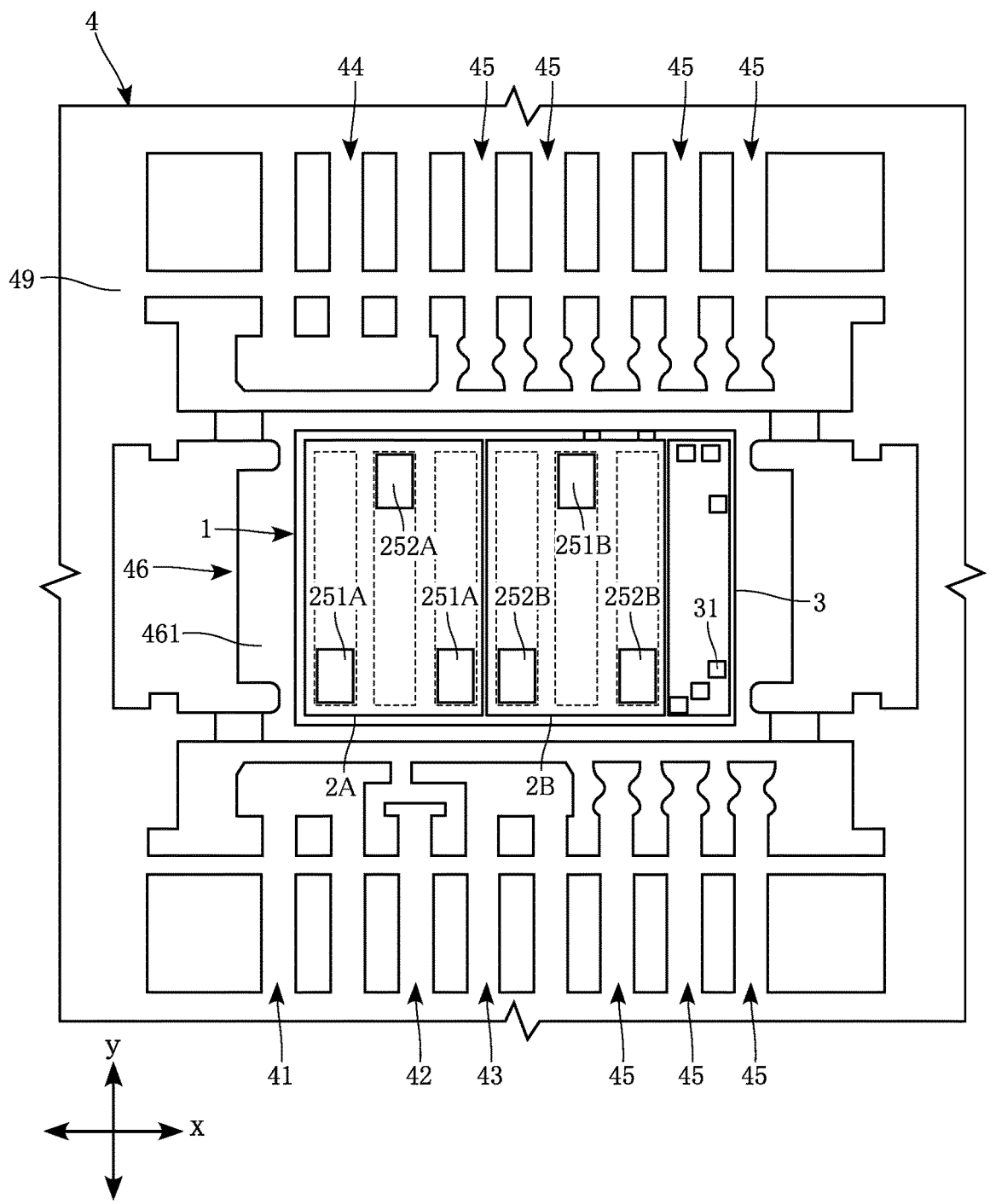
FIG. 10 is a plan view showing one step of the method for manufacturing the electronic device according to the first embodiment of the first aspect.

Next, as shown in FIG. 10, the electronic component 1 is mounted on the lead frame 4 (mounting step). Specifically, the electronic component 1 is adhered to the pad portion 461 of the die pad 46 via a bonding material. For example, if the bonding material is solder, solder paste is applied to the lead frame 4, and the electronic component 1 is mounted on the applied solder paste. At this time, the electronic component 1 is placed in an orientation in which the electrode pads 251A, 252A, 251B, 252B, and 31 face upward in the z direction. Next, reflow processing is performed, and the solder paste is melted and then allowed to solidify. Accordingly, the electronic component 1 is bonded to the pad portion 461 of the die pad 46. Ag paste, sintered metal, or the like may also be used instead of solder as the bonding material. The bonding material is not limited to being conductive, and may also be insulating.

Figure 11:
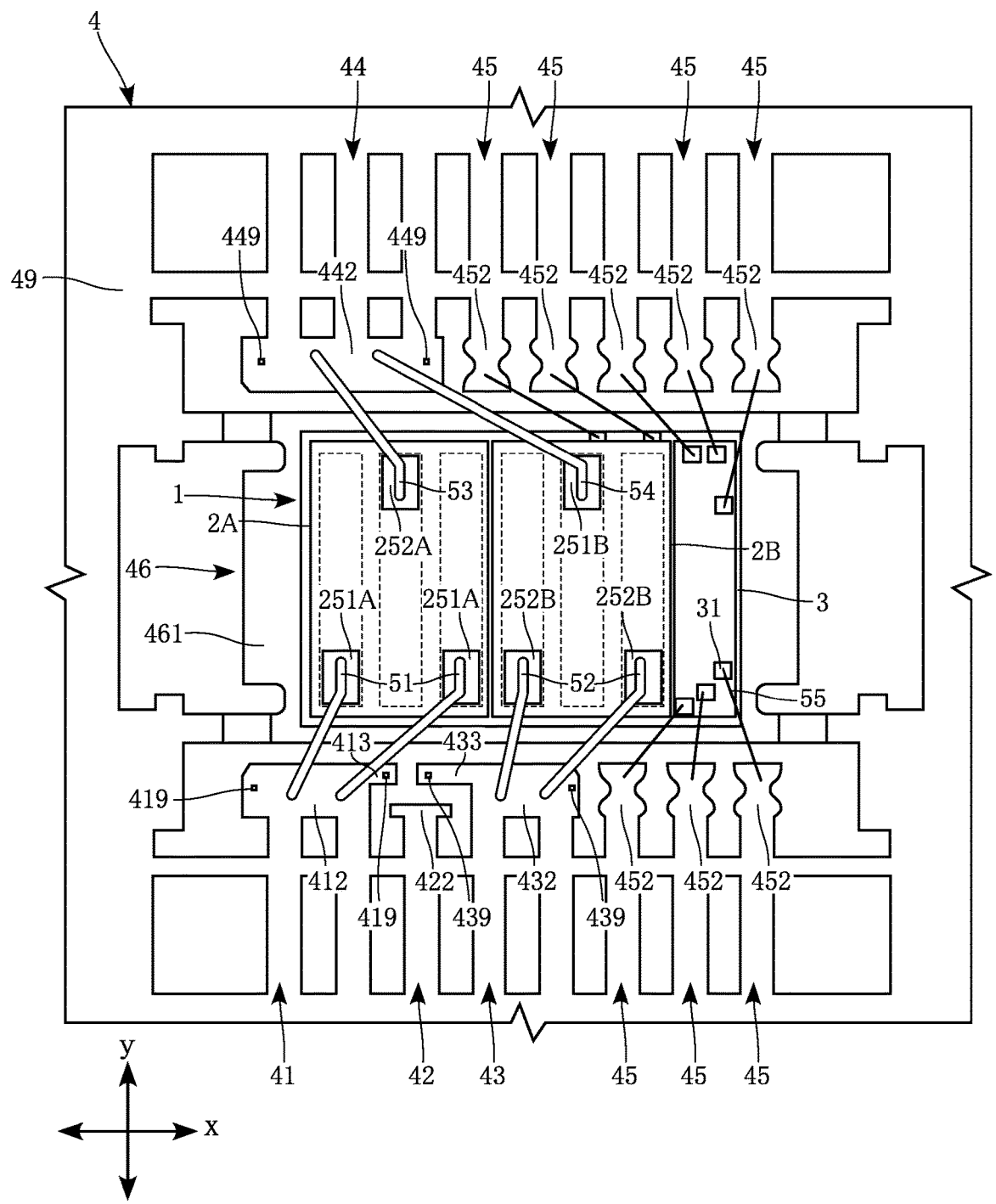
FIG. 11 is a plan view showing one step of the method for manufacturing the electronic device according to the first embodiment of the first aspect.

Next, as shown in FIG. 11, the connection members 5 (the wires 51 to 55) are bonded (bonding step). The wires 51 to 54 are, for example, Al bonding wires. The wires 51 to 54 are bonded through wedge bonding. The wires 55 are, for example, Au bonding wires. The wires 55 are bonded through ball bonding. It is sufficient to use a known bonding apparatus in the bonding of the wires 51 to 55. The bonding apparatus includes a capillary and a cutter.

Figure 12:
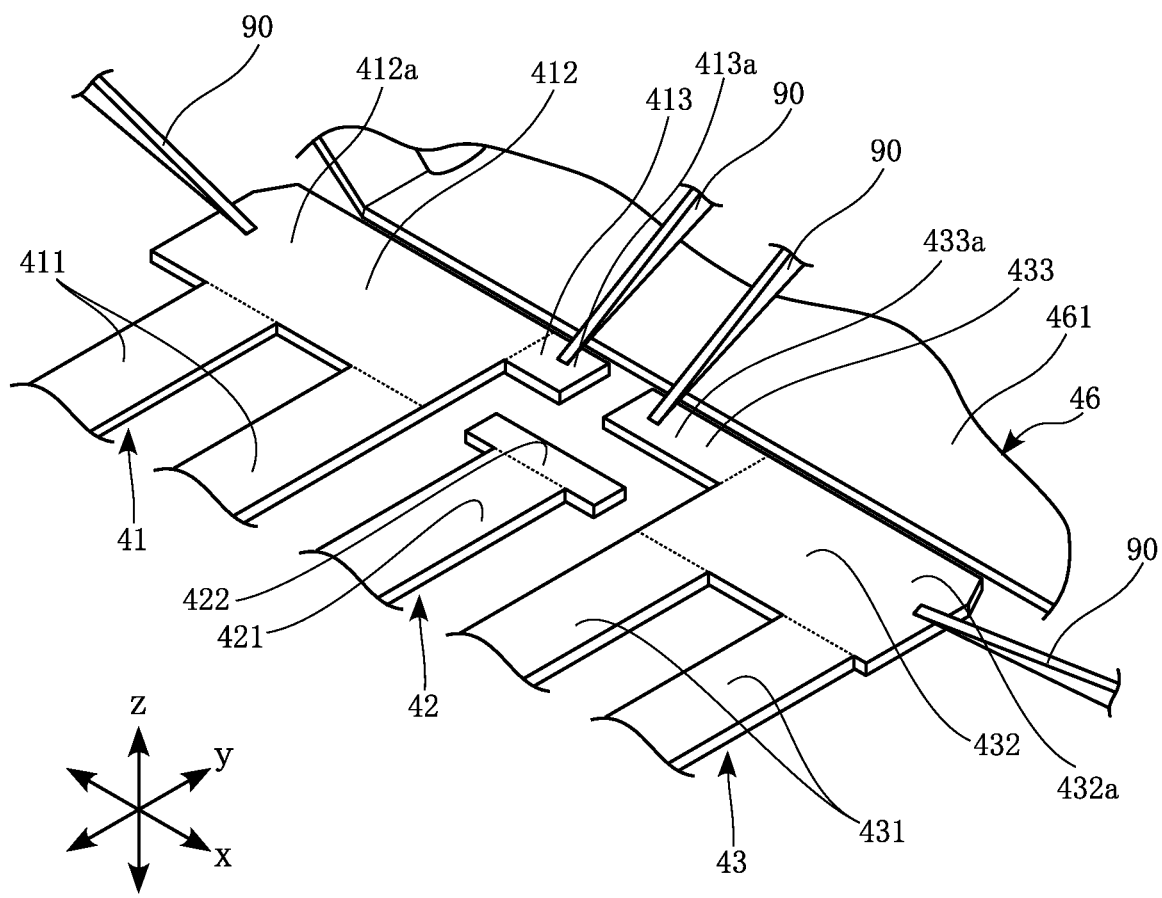
FIG. 12 is a perspective view showing one step of the method for manufacturing the electronic device according to the first embodiment of the first aspect.

Prior to the bonding to the wires 51 to 55, the lead frame 4 is set on a predetermined jig (not shown). The jig is formed so as to match the shape of the lead frame 4, and supports the lead frame 4 from a side opposite to the side on which the electronic component 1 is mounted. Next, as shown in FIG. 12, the leads 41, 43, and 44 are pressed down by the clamp members 90. The clamp members 90 also press down portions of the lead frame 4 other than the leads 41, 43, and 44 (e.g., the tie bar 49, etc.). The clamp members 90 each have a portion (tip portion) that is formed into a narrow metal rod shape, and press down the leads 41, 43, and 44 with these tip portions. Accordingly, the leads 41, 43, and 44 are fixed.

In the example shown in FIG. 12, one location on the extended portion 413 and one location on the pad portion 412 are pressed down by the clamp members 90 in order to fix the lead 41. At this time, as shown in FIG. 11, a pair of pressing marks 419 are formed due to the pressing force of the clamp members 90 at the portions pressed down by the clamp members 90. Also, one location on the extended portion 433 and one location on the pad portion 432 are pressed down by the clamp members 90 in order to fix the lead 43. At this time, as shown in FIG. 11, a pair of pressing marks 439 are formed due to the pressing force of the clamp members 90 at the portions pressed down by the clamp members 90. Furthermore, two locations on the pad portion 442 are pressed down by the clamp members 90 in order to fix the lead 44. In the leads 41, 43, and 44, the pressed-down positions are spaced apart from each other in the x direction. At this time, as shown in FIG. 11, a pair of pressing marks 449 are formed due to the pressing force of the clamp members 90 at the portions pressed down by the clamp members 90.

The wires 51 to 55 are bonded while the leads 41, 43, and 44 are put in a fixed state by the clamp members 90. The bonding of the wires 51 to 55 is performed using the following procedure.

In the bonding of the wires 51, first, the wires 51 are brought into contact with the electrode pads 251A of the electronic component 1 using the tip of a capillary. Then, the wires 51 are bonded to the electrode pads 251A by providing pressure and ultrasonic vibration from the capillary to the wires 51. Next, the tip of the capillary is moved from the electrode pads 251A to the pad portion 412 of the lead 41. Then, the wires 51 are bonded to the pad portion 412 by providing pressure and ultrasonic vibration to the wires 51 from the capillary. At this time, the portions of the wires 51 that are bonded to the pad portion 412 intersect with a line segment connecting the two locations of the lead 41 that are being pressed by the clamp members 90. After this bonding, the wires 51 are cut using a cutter. Thus, as shown in FIG. 11, the wires 51 each have one end bonded to an electrode pad 251A and another end bonded to the pad portion 412.

The bonding of the wires 52 to 54, which are composed of aluminum, is also performed similarly to the bonding of the wires 51. Accordingly, as shown in FIG. 11, the wires 52 each have one end bonded to the electrode pad 252B and another end bonded to the pad portion 432 of the lead 43. The portions of the wires 52 that are bonded to the pad portion 432 intersect a line segment connecting the two locations of the lead 43 that were pressed by the clamp members 90. Accordingly, as shown in FIG. 11, the wire 53 has one end bonded to the electrode pad 252A and another end bonded to the pad portion 442 of the lead 44. Also, as shown in FIG. 11, the wire 54 has one end bonded to the electrode pad 251B and another end bonded to the pad portion 442 of the lead 44. The portions of the wires 53 and 54 that are bonded to the pad portion 442 intersect a line segment connecting the two locations of the lead 44 that were pressed by the clamp members 90.

Thereafter, the wires 55 are respectively bonded to the electrode pads 31 and the pad portions 452 of the leads 45. Accordingly, as shown in FIG. 11, the electronic component 1 and the lead frame 4 are connected by the wires 51 to 55.

Figure 13:
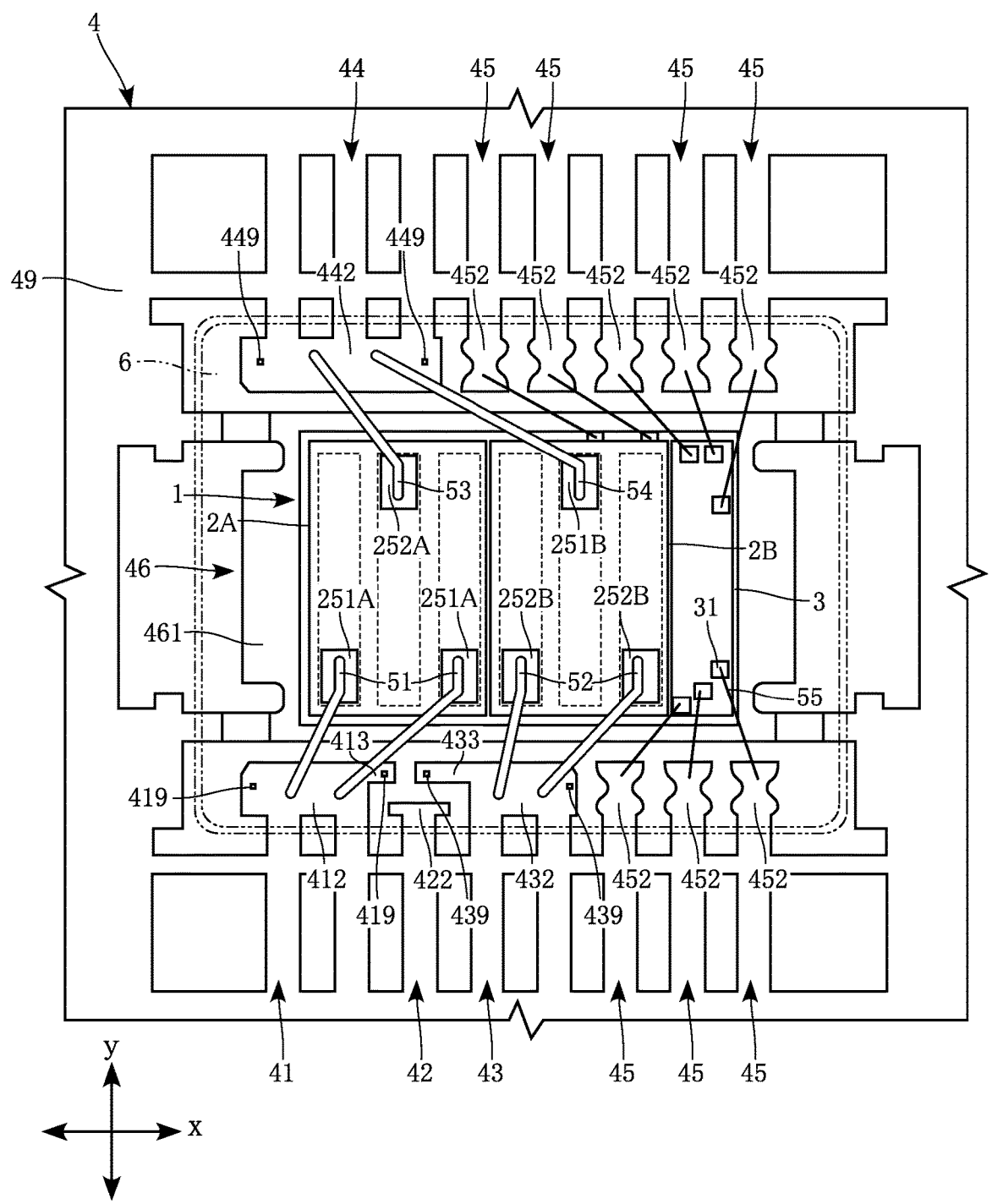
FIG. 13 is a plan view showing one step of the method for manufacturing the electronic device according to the first embodiment of the first aspect.

Next, as shown in FIG. 13, the resin member 6 is formed. The formation of the resin member 6 is performed through, for example, transfer molding. The constituent material of the resin member 6 is, for example, epoxy resin.

Next, the lead frame 4 is cut as appropriate and divided for each electronic component 1. The cutting of the lead frame 4 is performed through, for example, blade dicing.

The electronic device A1 shown in FIGS. 1 to 7 is formed through the above-described steps.

The actions and effects of the electronic device A1 configured as described above and the action and effects of the method for manufacturing the electronic device A1 are as follows.

The electronic device A1 includes an electronic component 1 that includes electrode pads 251A, a die pad 46 on which the electronic component 1 is mounted, a lead 41 that is spaced apart from the die pad 46, and wires 51 (connection members 5) that electrically connect the electrode pad 251A and the lead 41. The lead 41 includes a pad portion 412 to which the wires 51 (connection member 5) are bonded, and an extended portion 413 that extends from the pad portion 412. According to this configuration, when the wires 51 are bonded to the pad portion 412, clamp members 90 can be pressed down on the extended portion 413. Accordingly, the region to be pressed down by the clamp members 90 (extended portion 413) can be ensured while the region for bonding the wires 51 (pad portion 412) is ensured. Thus, the wires 51 (connection members 5) can be suitably bonded in the electronic device A1.

In particular, when the wires 51 are bonded through wedge bonding, greater pressure and vibration are applied to the target to be bonded to (the pad portion 412) compared to, for example, ball bonding. Also, the greater the thickness of the wires 51 is, the greater the pressure and vibration applied to the target to be bonded to (the pad portion 412) are. Accordingly, ensuring the extended portion 413 for fixing the lead 41 with the clamp members 90 is preferable when suitably bonding the wires 51.

The electronic device A1 includes a lead 42 that is spaced apart from the die pad 46 and the lead 41. The lead 41 and the lead 42 are arranged on one side of the die pad 46 in the y direction in a plan view. Also, in the lead 41, an extended portion 413 extends from the pad portion 412 to the space between the die pad 46 and the lead 42 in a plan view. Also, the lead 42 is not bonded to any of the connection members 5, and is electrically insulated from the electronic component 1. According to this configuration, a space for forming the extended portion 413 can be ensured by reducing the size of the lead 42 that is not electrically connected to the electronic component 1.

The electronic device A1 includes a lead 43 that is spaced apart from the lead 41, the lead 42, and the die pad 46, and wires 52 that electrically connect the lead 43 and the electrode pad 252B of the electronic component 1. The lead 43 includes a pad portion 432 to which the wires 52 (connection member 5) are bonded, and an extended portion 433 that extends from the pad portion 432. According to this configuration, when the wires 52 are bonded to the pad portion 432, clamp members 90 can be pressed down on the extended portion 433. Accordingly, the region pressed down by the clamp members 90 (extended portion 433) can be ensured while the region for bonding the wires 52 (pad portion 432) is ensured. Thus, the wires 52 (connection members 5) can be suitably bonded in the electronic device A1.

In particular, if the wires 52 are bonded through wedge bonding, a relatively large amount of pressure and vibration can be applied to the target to be bonded to (pad portion 432). Also, the greater the thickness of the wires 52 is, the greater the amount of pressure and vibration applied to the target to be bonded to (the pad portion 432) are. Accordingly, ensuring the extended portion 433 for fixing the lead 43 with the clamp members 90 is preferable when suitably bonding the wires 52.

In the electronic device A1, the lead 43 is arranged on the side on which the lead 41 and the lead 42 are arranged (one side in the y direction) with respect to the die pad 46, in a plan view. Also, in the lead 43, an extended portion 433 extends from the pad portion 432 to the space between the die pad 46 and the lead 42 in a plan view. Also, the lead 42 is not bonded to any of the connection members 5, and is electrically insulated from the electronic component 1. According to this configuration, a space for forming the extended portion 433 can be ensured by reducing the size of the lead 42 that is not electrically connected to the electronic component 1.

In the electronic device A1, a pair of pressing marks 419, which are marks resulting from the clamp members 90 pressing down during the bonding of the wires 51, are formed on the lead 41. One of the pair of pressing marks 419 is formed on the extended portion 413, and the other of the pair of pressing marks 419 is formed on the pad portion 412. Also, the portions of the wires 51 that are bonded to the pad portion 412 intersect a line segment connecting the pair of pressing marks 419. According to this configuration, it is possible to suitably prevent the pad portion 412 from shaking and deforming due to the pressure and vibration applied when bonding the wires 51 to the pad portion 412.

In the electronic device A1, a pair of pressing marks 439 are formed on the lead 43, one of the pair of pressing marks 439 is formed on the extended portion 433, and the other of the pair of pressing marks 439 is formed on the pad portion 432. Also, the portions of the wires 52 that are bonded to the pad portion 432 intersect a line segment connecting the pair of pressing marks 439. According to this configuration, it is possible to suitably prevent the pad portion 432 from shaking and deforming due to the pressure and vibration applied when bonding the wires 52 to the pad portion 432.

In the electronic device A1, the lead 42 includes a terminal portion 421 and a pad portion 422. The pad portion 422 has a larger dimension in the x direction than the terminal portion 421. According to this configuration, the pad portion 422 is in a state of protruding in the x direction past the terminal portion 421 in a plan view, and the protruding portion is covered by the resin member 6. Accordingly, it is possible to suppress a case in which the lead 42 comes out of the resin member 6 in the electronic device A1.

Figure 14:
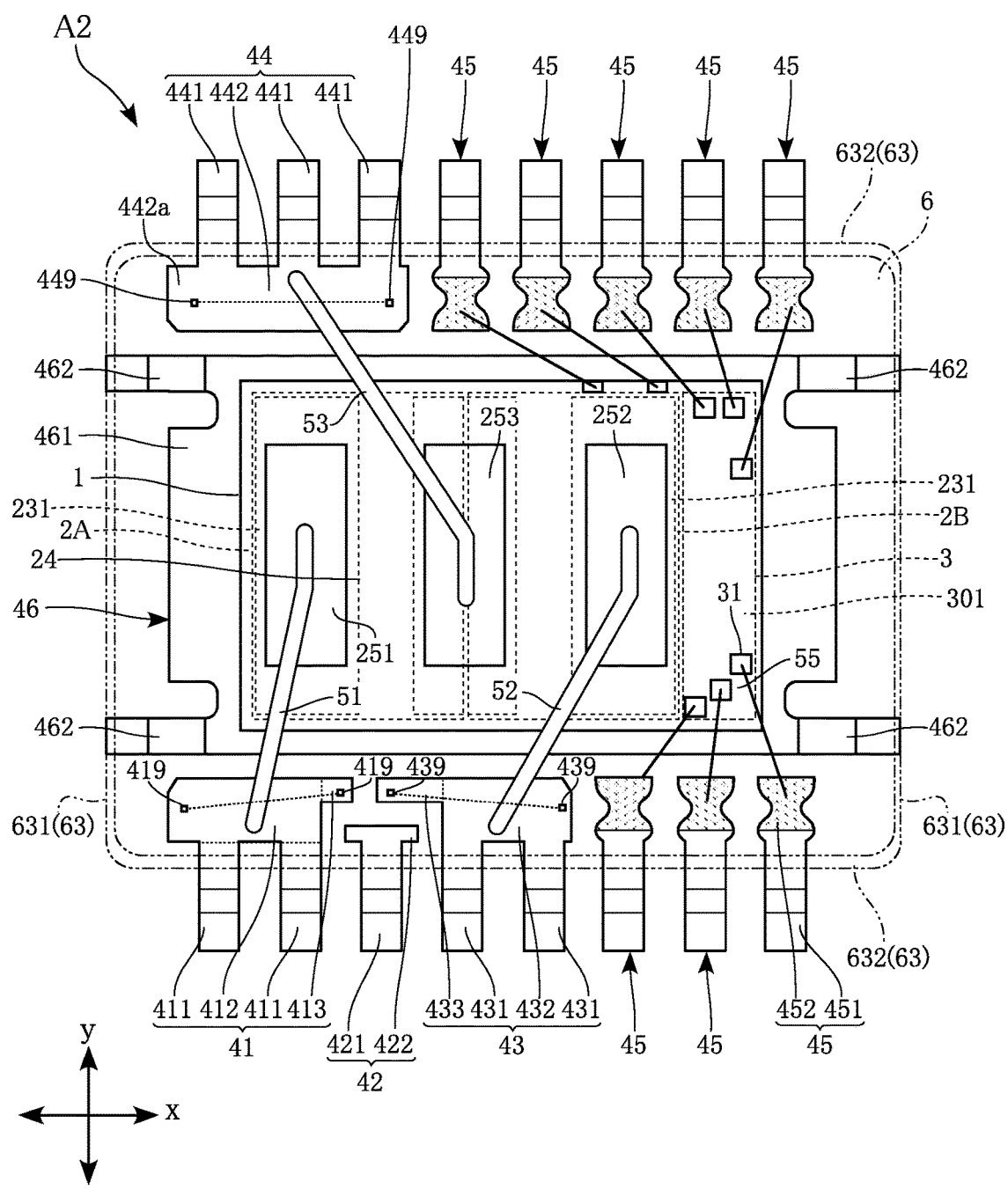
FIG. 14 is a plan view showing an electronic device according to a second embodiment of the first aspect.
Figure 15:
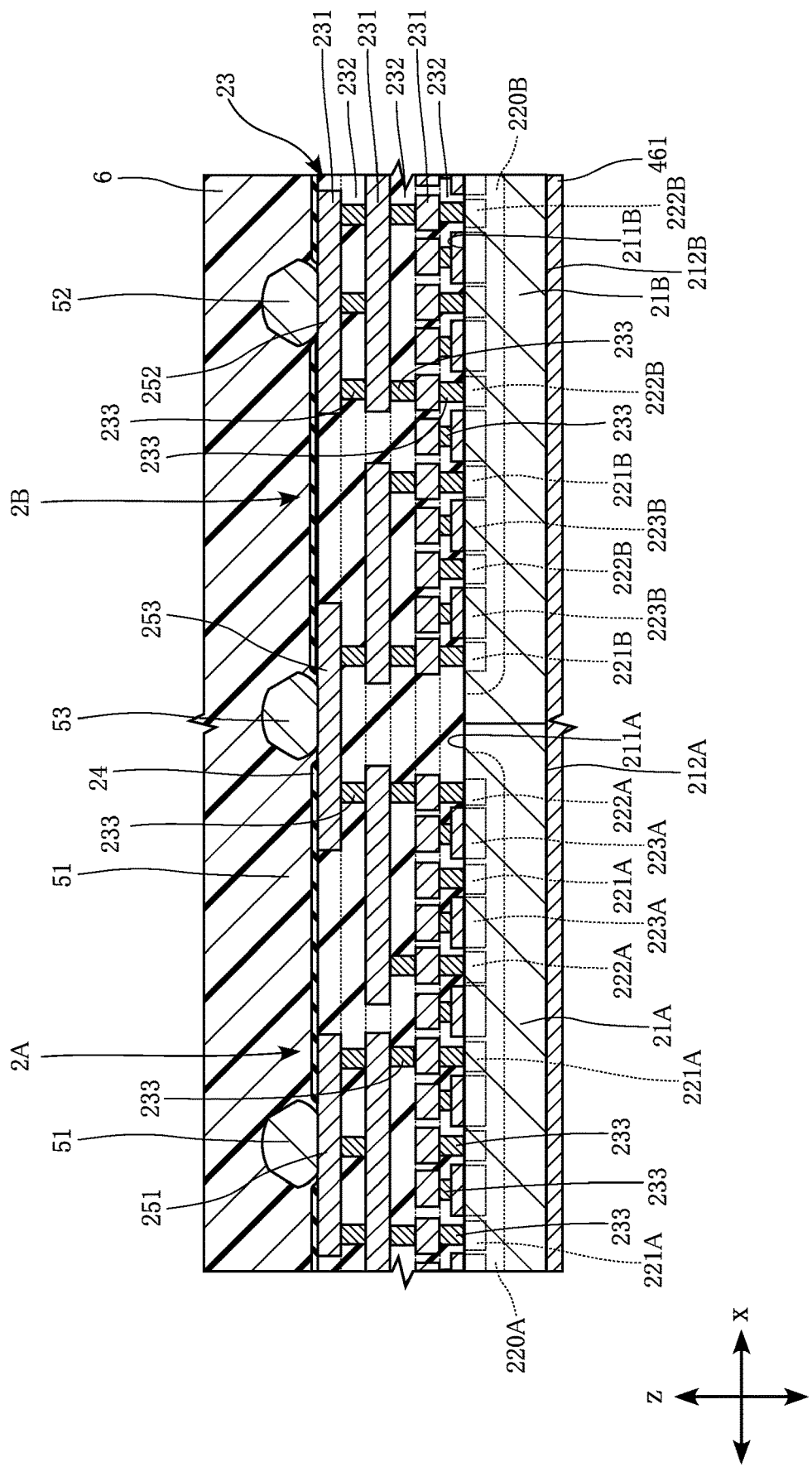
FIG. 15 is a schematic cross-sectional view showing an electronic component of the second embodiment of the first aspect.

FIGS. 14 and 15 show an electronic device based on a second embodiment on a first aspect. The electronic device A2 of the second embodiment on the first aspect has a different configuration of the electronic component 1, and accordingly also has a different configuration of the connection members 5. FIG. 14 is a plan view showing the electronic device A2, and the resin member 6 is indicated by an imaginary line. FIG. 15 is a schematic cross-sectional view showing the electronic component 1 of the electronic device A2.

As shown in FIG. 15, in the electronic component 1 of the electronic device A2, a common wiring layer 23 is formed above the semiconductor substrates 21A and 21B. The wiring layer 23 is obtained by making the above-described wiring layers 23A and 23B common, and similarly to the above-described wiring layers 23A and 23B, conductive layers 231 and insulating layers 232 are stacked alternatingly. Also, the conductive layers 231 are electrically connected via vias 233 that are formed so as to penetrate through the insulating layers 232. Note that the protective film 24 is also used in common, accompanying the common use of the wiring layer 23.

The electronic component 1 of the electronic device A2 includes electrode pads 251, 252, and 253. The electrode pads 251, 252, and 253 are exposed from the open portions of the protective film 24. The electrode pad 251 is electrically connected to the semiconductor regions 221A via the wiring layer 23. The electrode pad 252 is electrically connected to the semiconductor regions 222B via the wiring layer 23. The electrode pad 253 is electrically connected to the semiconductor regions 222A and the semiconductor regions 221B via the wiring layer 23. As stated before, the semiconductor regions 221A and 222A are respectively the drain regions and the source regions of the first semiconductor element 2A, and the semiconductor regions 221B and 222B are respectively the drain regions and the source regions of the first semiconductor element 2B. Accordingly, the electrode pad 251 is a drain terminal of the first semiconductor element 2A, the electrode pad 252 is a source terminal of the first semiconductor element 2B, and the electrode pad 253 is a common terminal of the source terminal of the first semiconductor element 2A and the drain terminal of the first semiconductor element 2B.

As shown in FIG. 14, the connection member 5 of the electronic device A2 includes the wires 51, 52, and 53, and the wires 55. In the electronic device A2, the wires 51, 52, and 53 are Al bonding wires, similarly to those of the electronic device A1. The thickness (diameter) of each of the wires 51, 52, and 53 is greater than that of each of the wires 51, 52, and 53 of the electronic device A1, and is, for example, about φ 300 μm.

The wire 51 has one end bonded to the electrode pad 251, and another end bonded to the pad portion 412. The electrode pad 251 and the pad portion 412 (lead 41) are electrically connected to each other via the wire 51.

The wire 52 has one end bonded to the electrode pad 252 and another end bonded to the pad portion 432. The electrode pad 252 and the pad portion 432 (lead 43) are electrically connected to each other via the wire 52.

The wire 53 has one end bonded to the electrode pad 253, and another end bonded to the pad portion 442. The electrode pad 253 and the pad portion 442 (lead 44) are electrically connected to each other via the wire 53.

According to the electronic device A2, similarly to the electronic device A1, the lead 41 includes a pad portion 412 to which the wire 51 (connection member 5) and an extended portion 413 that extends from the pad portion 412. Accordingly, when the wire 51 is bonded to the pad portion 412, clamp members 90 can be pressed down on the extended portion 413. Thus, similarly to the electronic device A1, in the electronic device A2, it is possible to ensure a region for bonding the wire 51 (pad portion 412) while ensuring a region pressed down by the clamp members 90 (extended portion 413), and therefore the wire 51 (connection member 5) can be suitably bonded.

According to the electronic device A2, similarly to the electronic device A1, the lead 43 includes a pad portion 432 to which the wire 52 (connection member 5) is bonded, and an extended portion 433 that extends from the pad portion 432. Accordingly, when the wire 52 is bonded to the pad portion 432, clamp members 90 can be pressed down on the extended portion 433. Thus, similarly to the electronic device A1, in the electronic device A2, it is possible to ensure a region for bonding the wire 52 (pad portion 432) while ensuring a region pressed down by the clamp members 90 (extended portion 433), and therefore the wire 52 (connection member 5) can be suitably bonded.

According to the electronic device A2, similarly to the electronic device A1, in the lead 41, the extended portion 413 extends from the pad portion 412 to the space between the die pad 46 and the lead 42 in a plan view. Also, in the lead 43, an extended portion 433 extends from the pad portion 432 to the space between the die pad 46 and the lead 42 in a plan view. Also, the lead 42 is not bonded to any of the connection members 5, and is electrically insulated from the electronic component 1. Accordingly, in the electronic device A2, similarly to the electronic device A1, a space for forming the extended portion 413 and the extended portion 433 can be ensured by reducing the size of the lead 42 that is not electrically connected to the electronic component 1.

Otherwise, the electronic device A2 can exhibit effects similar to those of the electronic device A1 using configurations held in common with the electronic device A1.

Figure 16:
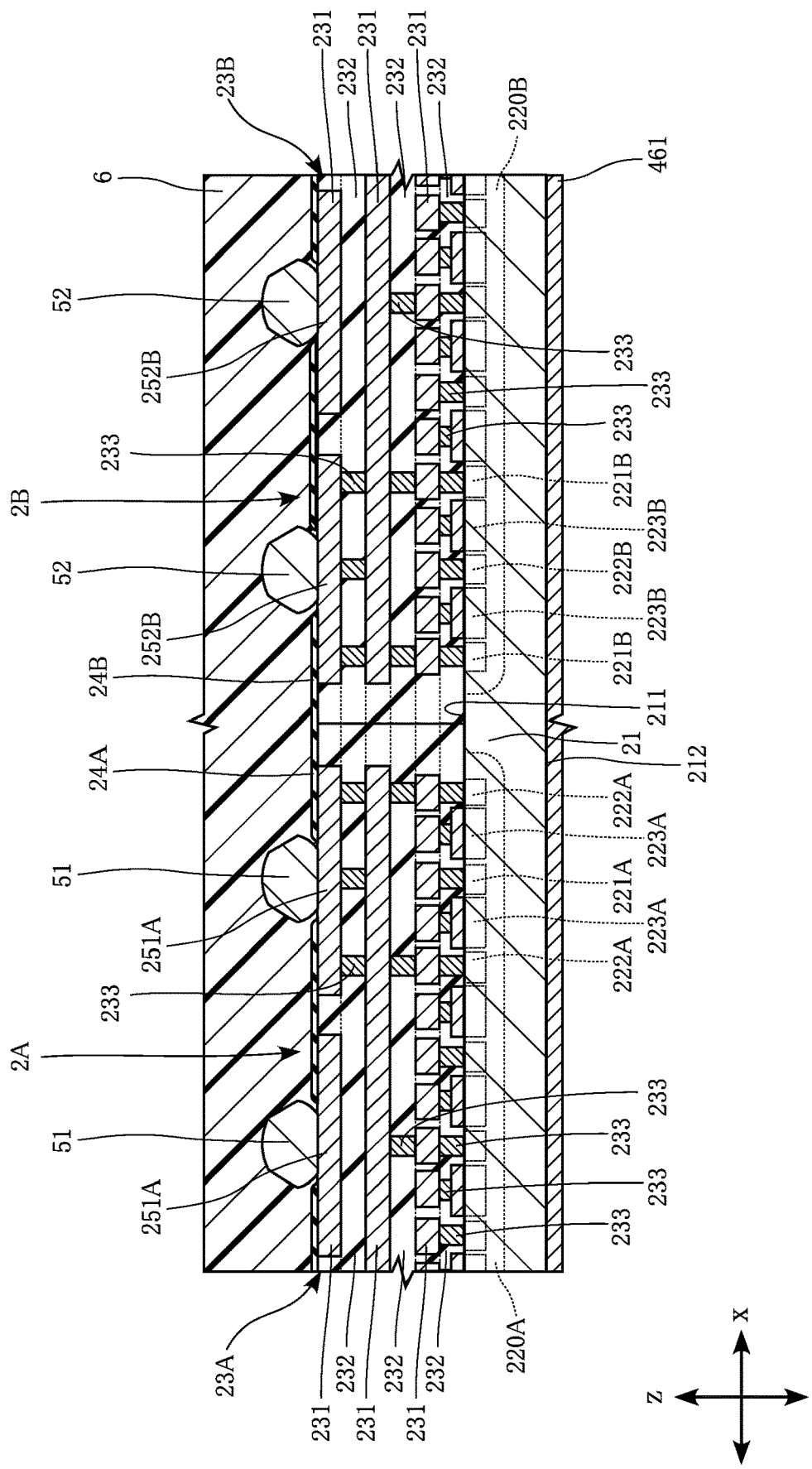
FIG. 16 is a schematic cross-sectional view showing a variation of the electronic component according to the first aspect.
Figure 17:
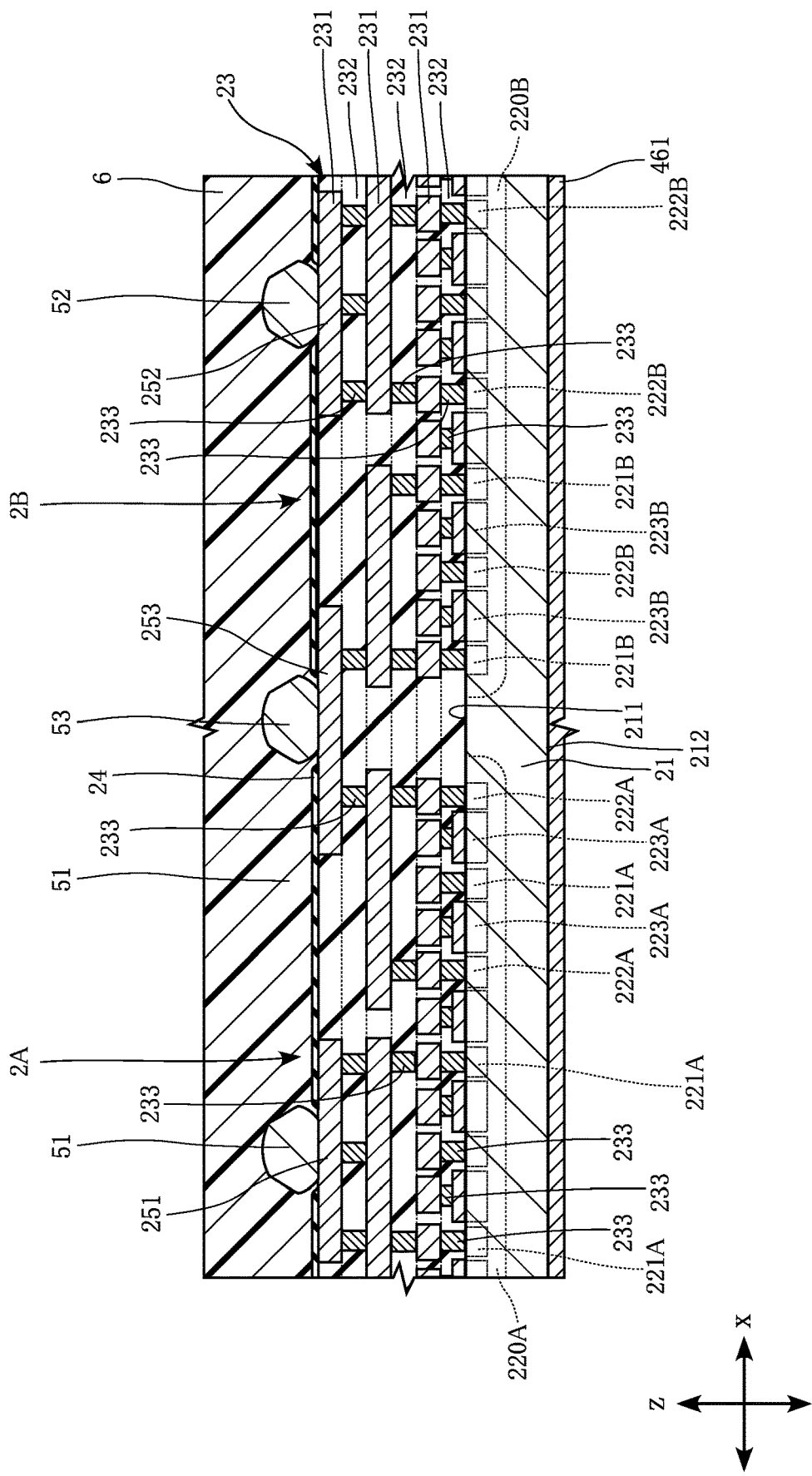
FIG. 17 is a schematic cross-sectional view showing another variation of the electronic component according to the first aspect.

In the first embodiment and the second embodiment of the first aspect, a case was described in which the active region 220A is formed on the semiconductor substrate 21A and the active region 220B is formed on the semiconductor substrate 21B in the electronic component 1, but the active regions 220A and 220B may also be formed on a common semiconductor substrate 21. FIG. 16 shows a variation of the case in which the active regions 220A and 220B are formed on a common semiconductor substrate 21 in the electronic component 1 of the electronic device A1. FIG. 17 shows a variation of the case in which the active regions 220A and 220B are formed on a common semiconductor substrate 21 in the electronic component 1 of the electronic device A2. Both FIGS. 16 and 17 show schematic cross-sectional views of the electronic components 1 according to the embodiments.

As shown in FIGS. 16 and 17, the electronic component 1 includes the semiconductor substrate 21 that is common to the first semiconductor elements 2A and 2B. The semiconductor substrate 21 includes the substrate main surface 211 and the substrate underside surface 212. The substrate main surface 211 and the substrate underside surface 212 are spaced apart from each other in the z direction and face mutually opposite directions. In the form shown in FIG. 16, the wiring layers 23A and 23B are formed above the substrate main surface 211 and in the form shown in FIG. 17, the wiring layer 23 is formed above the substrate main surface 211.

In the first embodiment and the second embodiment of the first aspect, a case was described in which the first semiconductor element 2B is arranged between the first semiconductor element 2A and the second semiconductor element 3, but the present disclosure is not limited thereto. For example, the first semiconductor element 2A may also be arranged between the first semiconductor element 2B and the second semiconductor element 3. In this case, the lead 41 is electrically connected to the semiconductor region 222B (source region) of the first semiconductor element 2B. Accordingly, the lead 41 corresponds to the terminal PGND of the circuit diagram shown in FIG. 8. Also, the lead 43 is electrically connected to the semiconductor region 221A (drain region) of the first semiconductor element 2A. Accordingly, the lead 43 corresponds to the terminal PVIN of the circuit diagram shown in FIG. 8.

Figure 18:
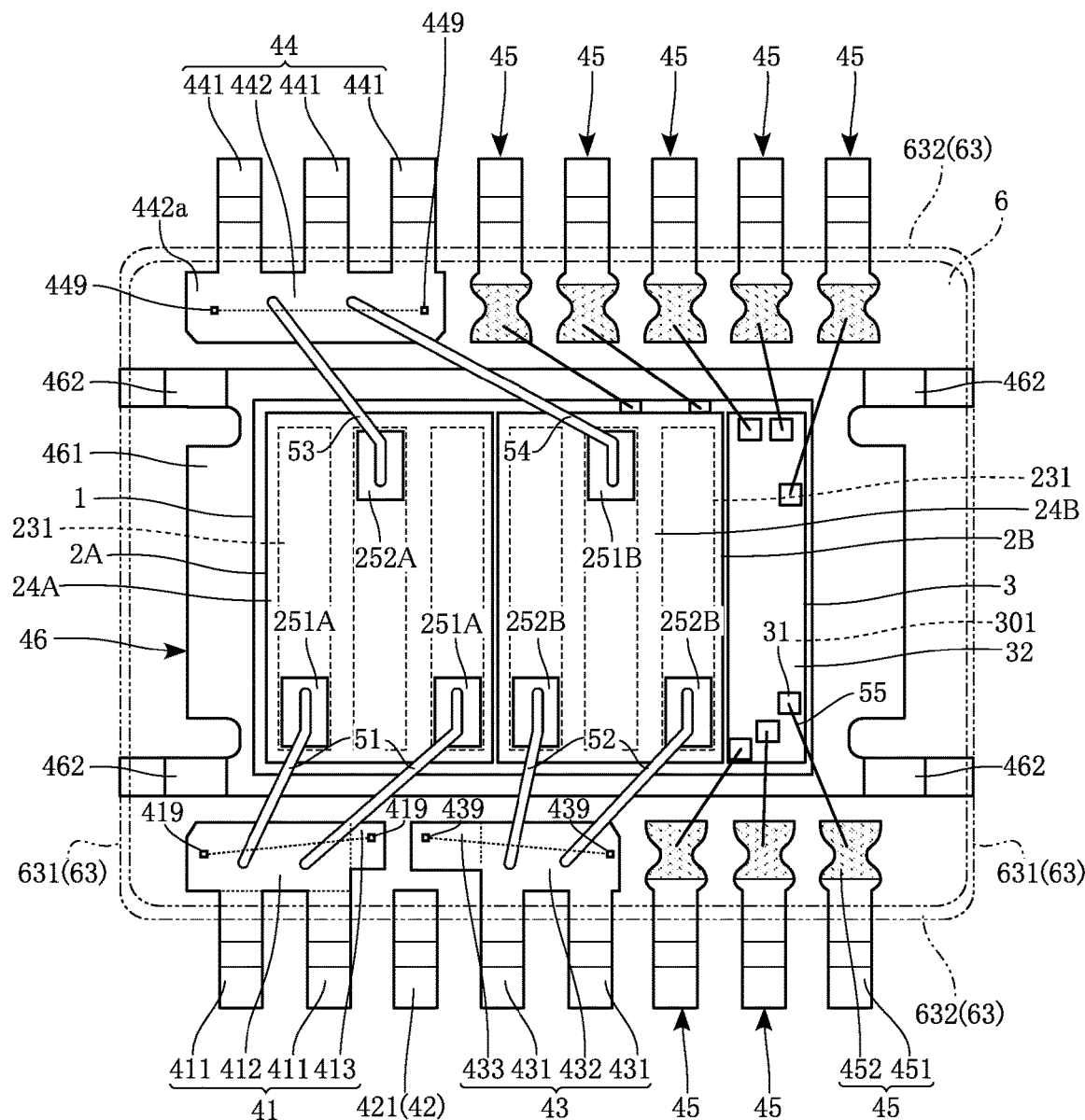
FIG. 18 is a plan view showing still another variation of the electronic device according to the first aspect.
Figure 19:
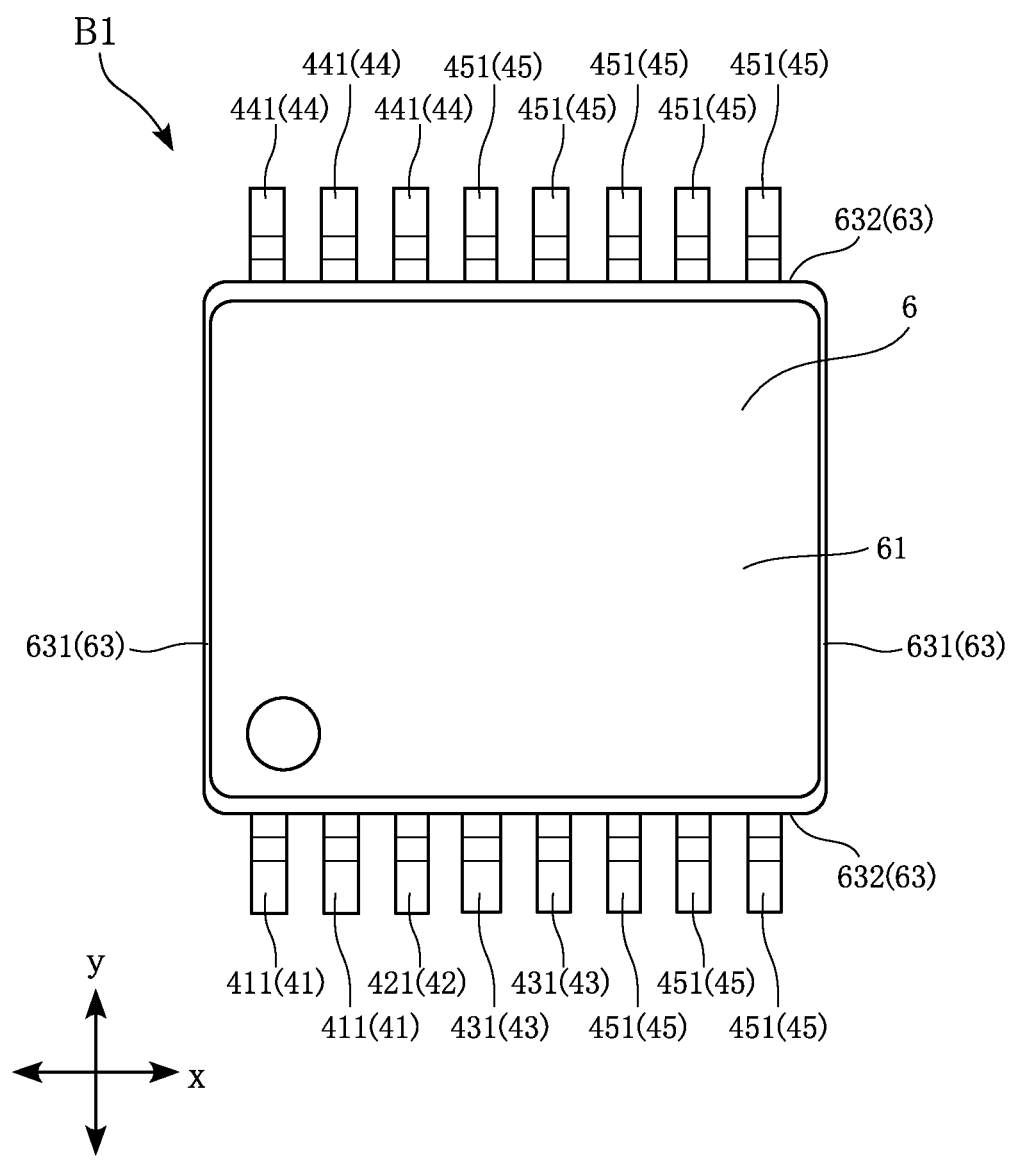
FIG. 19 is a plan view showing an electronic device according to a first embodiment of a second aspect.

In the first embodiment and the second embodiment of the first aspect, a case was described in which the lead 42 includes the pad portion 422, but the lead 42 may also not include the pad portion 422. That is, the lead 42 may also be constituted by only the terminal portion 421. FIG. 18 shows a variation of the case in which the lead 42 does not include the pad portion 422 in the electronic device A1. FIG. 18 is a plan view showing an electronic device according to the variation. Note that in FIG. 18, the resin member 6 is indicated by an imaginary line. As shown in FIG. 18, the lead 42 does not include the pad portion 422 and is constituted by only the terminal portion 421. For this reason, the extended portion 413 of the lead 41 and the extended portion 433 of the lead 43 are formed to be greater in size than the extended portions 413 and 433 of the first embodiment in a plan view. Accordingly, since the extended portion 413 and the extended portion 433 are large in the present variation, the regions pressed by the clamp members 90 can be made greater in size. Accordingly, for example, since the tip portions of the clamp members 90 can be made greater in size, the leads 41 and 43 can be fixed more reliably.

In the first embodiment and the second embodiment of the first aspect, a case was described in which the lead 41 includes the extended portion 413 and the lead 43 includes the extended portion 433, but it is also possible to provide only one of the extended portions 413 and 433. For example, if the lead 41 includes the extended portion 413 and the lead 43 does not include the extended portion 433, the plan view surface area of the extended portion 413 can be made even greater in size. Also, if the lead 41 does not include the extended portion 413 and the lead 43 includes the extended portion 433, the plan view surface area of the extended portion 433 can be made larger.

In the first embodiment and the second embodiment of the first aspect, a case was described in which the lead 42 is not electrically connected to the electronic component 1, but the lead 42 may also be electrically connected to the electronic component 1. However, since the pad portion 422 of the lead 42 is relatively (e.g., compared to the pad portion 452) small and the region for bonding the bonding wire is small, it is preferable to use a thin wire similar to a wire 55, for example, for electrically connecting the pad portion 422 and the electronic component 1.

In the first embodiment and the second embodiment of the first aspect, a case was described in which the electronic component 1 includes the first semiconductor elements 2A and 2B (e.g., MOSFETs) and the second semiconductor element 3 (e.g., the control IC), but there is no limitation to this. For example, the electronic component 1 may also be configured to not include any one of the first semiconductor elements 2A and 2B, and to include one of the first semiconductor elements 2A and 2B and the second semiconductor element 3 for controlling the one of the first semiconductor elements 2A and 2B. Alternatively, the electronic component 1 may also be configured to not include the second semiconductor element 3 and to include the two first semiconductor elements 2A and 2B. Alternatively, the electronic component 1 may also be configured to not include any one of the first semiconductor elements 2A and 2B and the second semiconductor element 3, and to include only one of the first semiconductor elements 2A and 2B.

In the first embodiment and the second embodiment of the first aspect, a case was described in which the electronic devices A1 and A2 have SOP package structures, but the present disclosure is not limited to this. For example, the package structure may be that of a TO (Transistor Outline) package, a QFP (Quad Flat Package), an SON (Small Outline Non-leaded Package), a DFN (Dual Flatpack Non-leaded Package), a QFN (Quad Flat Non-leaded Package), or the like.

The electronic device and the method for manufacturing the electronic device based on the first aspect are not limited to the above-described embodiments. Specific configurations of portions of the electronic device of the present disclosure and specific processes for each step of the method for manufacturing the electronic device of the present disclosure.

The electronic device and the method for manufacturing the electronic device according to the first aspect of the present disclosure may be defined as in the following clauses.

Clause 1A. An electronic device comprising:
an electronic component provided with a first electrode pad;
a die pad including an obverse surface facing in a first direction, the electronic component being mounted on the obverse surface;
a first lead spaced apart from the die pad;
a second lead spaced apart from the die pad and the first lead; and
a first connection member electrically connecting the first electrode pad and the first lead to each other,
wherein the first lead and the second lead are disposed, as viewed in the first direction, on a same side of the die pad in a second direction perpendicular to the first direction,
the first lead includes a first pad portion and a first extended portion,
the first connection member is bonded to the first pad portion, and
the first extended portion extends from the first pad portion up to a position located between the die pad and the second lead as viewed in the first direction.

Clause 2A. The electronic device according to clause 1A, wherein the second lead is electrically insulated from the electronic component.

Clause 3A. The electronic device according to clause 1A or 2A, wherein the first pad portion includes a first pad obverse surface to which the first connection member is bonded,
the first extended portion includes a first extend surface facing in a same direction as the first pad obverse surface, and the first extended surface is formed with a pressing mark recessed in the first direction.

Clause 4A. The electronic device according to any one of clauses 1A to 3A, further comprising a second connection member and a third lead spaced apart from the die pad, the first lead and the second lead, wherein the electronic component is provided with a second electrode pad, and the second connection member electrically connects the second electrode pad and the third lead to each other.

Clause 5A. The electronic device according to clause 4A, wherein the third lead is disposed on a same side of the die pad as the first lead and the second lead as viewed in the first direction.

Clause 6A. The electronic device according to clause 5A, wherein the third lead includes a second pad portion and a second extended portion,
the second connection member is bonded to the second pad portion, and
the second extended portion extends from the second pad portion up to a position between the die pad and the second lead as viewed in the first direction.

Clause 7A. The electronic device according to clause 6A, wherein the second pad portion includes a second pad obverse surface to which the second connection member is bonded,
the second extended portion includes a second extended surface facing in a same direction as the second pad obverse surface, and
the second extended surface is formed with a pressing mark recessed in the first direction.

Clause 8A. The electronic device according to clause 6A or 7A, further comprising a resin member covering the electronic component, wherein the first lead includes a first terminal portion that is connected to the first pad portion and exposed from the resin member, and
the third lead includes a second terminal portion that is connected to the second pad portion and exposed from the resin member.

Clause 9A. The electronic device according to clause 8A, wherein the second lead includes a third terminal portion exposed from the resin member, and
the third terminal portion is disposed between the first terminal portion and the second terminal portion in a third direction perpendicular to the first direction and the second direction.

Clause 10A. The electronic device according to clause 9A, wherein the first extended portion and the second extended portion overlap with each other as viewed in the third direction.

Clause 11A. The electronic device according to clause 9A or 10A, wherein the second lead includes a central portion in the third direction, and the central portion overlaps with one of the first extended portion and the second extended portion as viewed in the second direction.

Clause 12A. The electronic device according to any one of clauses 9A to 11A, wherein the first lead and the third lead are substantially equal in size measured in the third direction.

Clause 13A. The electronic device according to any one of clauses 9A to 12A, wherein the second lead includes a third pad portion that is connected to the third terminal portion and covered by the resin member.

Clause 14A. The electronic device according to any one of clauses 4A to 13A, wherein the electronic component includes a first semiconductor region and a second semiconductor region,
the first electrode pad is electrically connected to the first semiconductor region, and
the second electrode pad is electrically connected to the second semiconductor region.

Clause 15A. The electronic device according to clause 14A, further comprising a fourth lead and at least one third connection member, wherein the fourth lead is spaced apart from the die pad, the first lead, the second lead and the third lead,
the electronic component is provided with at least one third electrode pad, and
the third connection member electrically connects the third electrode pad and the fourth lead to each other.

Clause 16A. The electronic device according to clause 15A, wherein the electronic component includes a third semiconductor region and a fourth semiconductor region, and
the third electrode pad is electrically connected to at least one of the third semiconductor region and the fourth semiconductor region.

Clause 17A. The electronic device according to clause 16A, wherein the electronic component includes a first active region and a second active region,
the first semiconductor region and the third semiconductor region are formed in the first active region, and
the second semiconductor region and the fourth semiconductor region are formed in the second active region.

Clause 18A. The electronic device according to clause 17A, wherein the at least one third electrode pad comprises a plurality of third electrode pads, one of the plurality of third electrode pads being electrically connected to the third semiconductor region, another of the plurality of third electrode pads being electrically connected to the fourth semiconductor region, and
the at least one third connection member comprises a plurality of third connection members, one of the plurality of third connection members electrically connecting said one of the plurality of third electrode pads and the fourth lead to each other, another of the plurality of third connection members electrically connecting said another of the plurality of third electrode pads and the fourth lead to each other.

Clause 19A. The electronic device according to clause 17A or 18A, wherein the first active region is formed with a first control region, the second active region is formed with a second control region, and the electronic component comprises a control IC configured to output control signals to the first control region and the second control region.

Clause 20A. The electronic device according to clause 19A, further comprising a fifth lead and a fourth connection member, wherein the fifth lead is spaced apart from the die pad, the first lead, the second lead, the third lead and the fourth lead,
the electronic component is provided with a fourth electrode pad, and
the fourth connection member electrically connects the fourth electrode pad and the fifth lead to each other.

Clause 21A. The electronic device according to clause 20A, wherein the fourth connection member is smaller in thickness than the first connection member.

Clause 22A. The electronic device according to clause 20A or 21A, wherein the fourth connection member is smaller in thickness than the second connection member.

Clause 23A. The electronic device according to any one of clauses 17A to 22A, wherein the electronic component comprises a first semiconductor substrate and a second semiconductor substrate,
the first active region is formed in the first semiconductor substrate, and the second active region is formed in the second semiconductor substrate.

Clause 24A. A method for manufacturing an electronic device, the method comprising:
preparing a lead frame including a die pad, a first lead and a second lead, the die pad having an obverse surface facing in a first direction;
mounting an electronic component on the obverse surface of the die pad, the electronic component being provided with a first electrode pad; and
bonding a first connection member to the first electrode pad and the first lead,
wherein the first lead and the second lead are disposed, as viewed in the first direction, on a same side of the die pad in a second direction perpendicular to the first direction,
the first lead includes a first pad portion and a first extended portion, the first extended portion extending from the first pad portion up to a position between the die pad and the second lead as viewed in the first direction, and
said bonding a first connection member comprises pressing down the first extended portion with a clamp member in bonding the first connection member to the first pad portion.

In the following description, various embodiments according to a second aspect of the present disclosure will be described.

FIGS. 19 to 26 show an electronic device based on a first embodiment of a second aspect. An electronic device B1 shown in the drawings is, for example, a package called an SOP (Small Outline Package), and is, for example, a power supply IC. The electronic device B1 includes an electronic component 1, a lead frame 4, connection members 5, and a resin member 6. The connection member 5 is, for example, a wire, but the present disclosure is not limited to this.

The electronic component 1 is the functional center of the electronic device B1. The electronic component 1 is bonded to the lead frame 4 (die pad 46) via a bonding material. The electronic component 1 includes two first semiconductor elements 2A and 2B and a second semiconductor element 3.

The first semiconductor elements 2A and 2B are, for example, MOSFETs. Note that the first semiconductor elements 2A and 2B are not limited to MOSFETs, and may also be other transistors (e.g., bipolar transistors, IGBTs, etc.), diodes, or the like.

Figure 20:
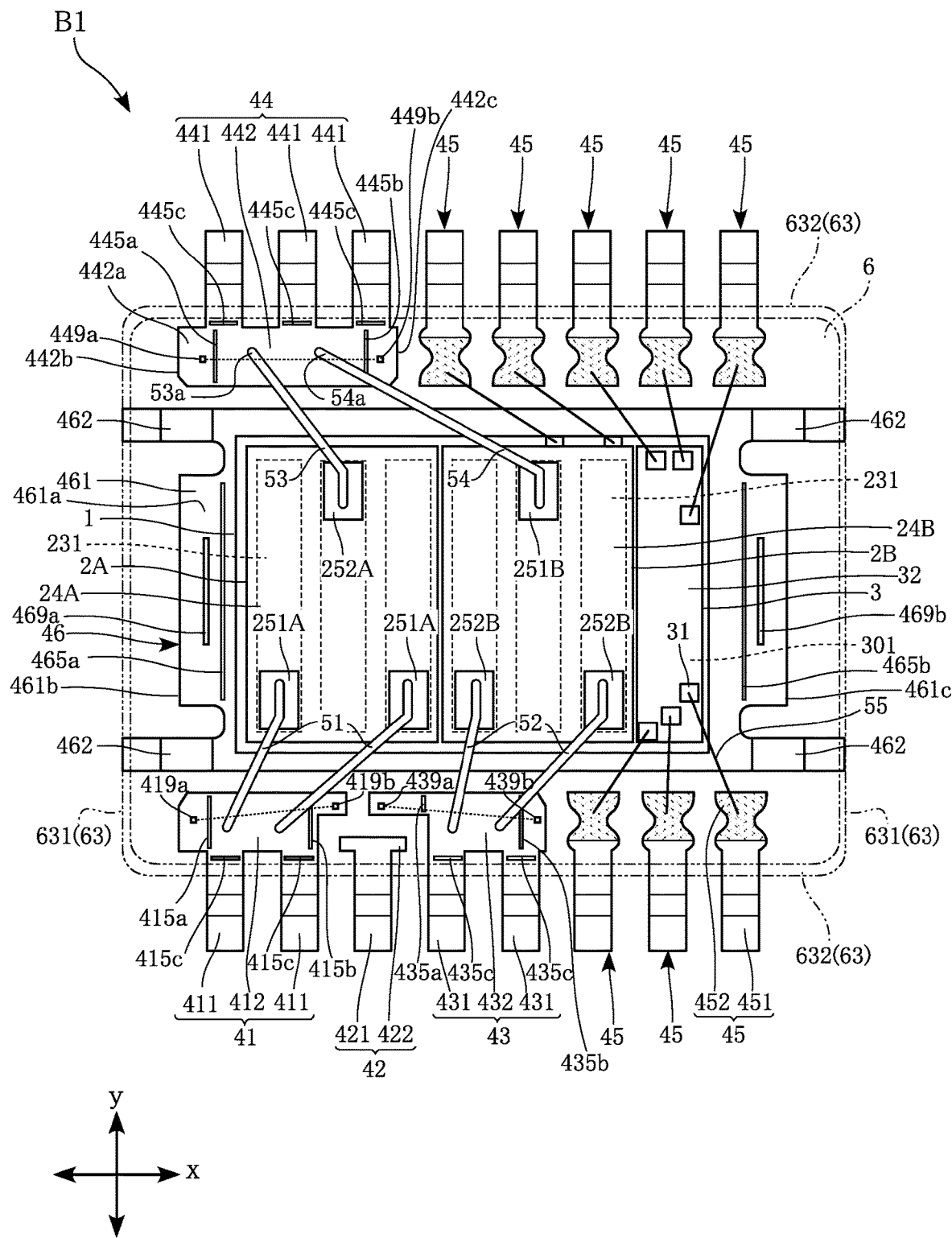
FIG. 20 is a plan view showing the electronic device according to the first embodiment of the second aspect, viewed through a resin member.
Figure 26:
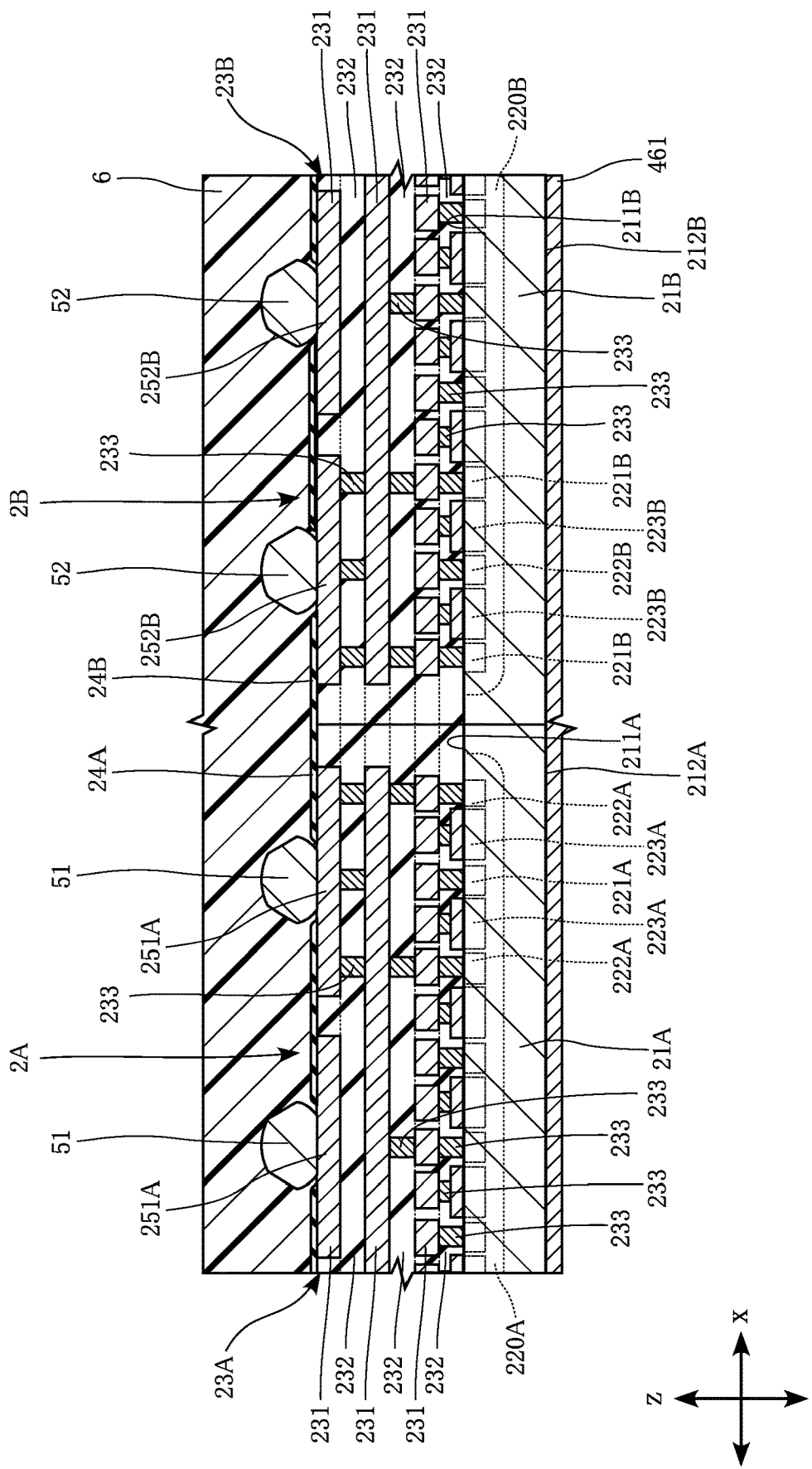
FIG. 26 is a schematic cross-sectional view showing an electronic component of the first embodiment of the second aspect.

As shown in FIG. 20 or FIG. 26, the first semiconductor element 2A includes a semiconductor substrate 21A, a wiring layer 23A, an insulating protective film 24A, and electrode pads 251A and 252A.

The semiconductor substrate 21A is composed of, for example, a semiconductor material such as Si (silicon), SiC (silicon carbide), GaN (gallium nitride), and $Ga_2O_3$ (gallium oxide). As shown in FIG. 26, the semiconductor substrate 21A has a substrate main surface 211A and a substrate underside surface 212A. The substrate main surface 211A and the substrate underside surface 212A are spaced apart from each other in the z direction.

As shown in FIG. 26, an active region 220A is formed on the substrate main surface 211A side of the semiconductor substrate 21A. The active region 220A includes semiconductor regions 221A, 222A, and 223A. The semiconductor regions 221A are, for example, drain regions. The semiconductor regions 222A are, for example, source regions. The semiconductor regions 223A are, for example, gate regions.

As shown in FIG. 26, the wiring layer 23A is formed above the substrate main surface 211A of the semiconductor substrate 21A. For example, in the wiring layer 23A, conductive layers 231 and insulating layers 232 are stacked alternatingly on each other. The conductive layers 231 are electrically connected via vias 233 that are formed so as to penetrate through the insulating layers 232.

As shown in FIG. 26, the protective film 24A is formed above the wiring layer 23A and covers the upper surface of the wiring layer 23A. As shown in FIG. 20, the protective film 24A has a plurality of portions that are open, and electrode pads 251A and 252A (portions of the respective conductive layers 231) are exposed from these opening. The protective film 24A is, for example, an $Si_3Ni_4$ layer or an $SiO_2$ layer that is formed through plasma CVD, or a polyimide resin layer that is formed through coating. Alternatively, the protective film 24A may also be formed through a combination of plasma CVD and coating.

The electrode pads 251A and 252A are terminals of the first semiconductor element 2A. The electrode pads 251A are electrically connected to the semiconductor regions 221A via the wiring layer 23A. The electrode pads 251A are drain terminals of the first semiconductor element 2A. Some of the connection members 5 (wires 51) are bonded to the electrode pads 251A. The electrode pads 252A are electrically connected to the semiconductor regions 222A via the wiring layer 23A. The electrode pads 252A are the source terminals of the first semiconductor element 2A. Some of the connection members 5 (wires 53) are bonded to the electrode pads 252A.

As shown in FIGS. 20 and 26, the first semiconductor element 2B includes a semiconductor substrate 21B, a wiring layer 23B, a protective film 24B, and electrode pads 251B and 252B.

The semiconductor substrate 21B is composed of, for example, a semiconductor material such as Si (silicon), SiC (silicon carbide), GaN (gallium nitride), and $Ga_2O_3$ (gallium oxide). As shown in FIG. 26, the semiconductor substrate 21B has a substrate main surface 211B and a substrate underside surface 212B. The substrate main surface 211B and the substrate underside surface 212B are spaced apart from each other in the z direction.

As shown in FIG. 26, an active region 220B is formed on the substrate main surface 211B side of the semiconductor substrate 21B. The active region 220B includes semiconductor regions 221B, 222B, and 223B. The semiconductor regions 221B are, for example, drain regions. The semiconductor regions 222B are, for example, source regions. The semiconductor regions 223B are, for example, gate regions.

As shown in FIG. 26, the wiring layer 23B is formed above the substrate main surface 211B of the semiconductor substrate 21B. The wiring layer 23B can be formed similarly to the wiring layer 23A. For example, in the wiring layer 23B, conductive layers 231 and insulating layers 232 are stacked alternatingly on each other. The conductive layers 231 are electrically connected via vias 233 that are formed so as to penetrate through the insulating layers 232.

As shown in FIG. 26, the protective film 24B is formed above the wiring layer 23B and covers the upper surface of the wiring layer 23B. As shown in FIG. 20, portions of the protective film 24B are open, and electrode pads 251B and 252B are exposed from the openings. The protective film 24B is, for example, an $Si_3Ni_4$ layer or an $SiO_2$ layer that is formed through plasma CVD, or a polyimide resin layer that is formed through coating. Alternatively, the protective film 24B may also be formed through a combination of plasma CVD and coating. The protective film 24A and the protective film 24B may also be formed in one piece.

The electrode pads 251B and 252B are terminals of the first semiconductor element 2B. The electrode pads 251B are electrically connected to the semiconductor regions 221B via the wiring layer 23B. The electrode pads 251B are drain terminals of the first semiconductor element 2B. One of the connection members 5 (wire 54) is bonded to the electrode pad 251B. The electrode pads 252B are electrically connected to the semiconductor regions 222B via the wiring layer 23B. The electrode pads 252B are the source terminals of the first semiconductor element 2B. Some of the connection members 5 (wires 52) are bonded to the electrode pads 252B.

Figure 20A:
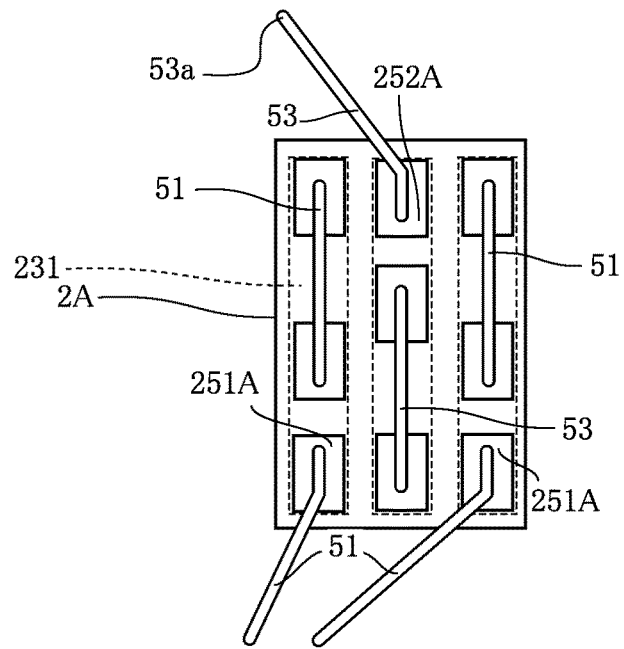
FIG. 20A is a plan view showing a portion of a variation of the electronic device shown in FIG. 20.

Reference is now made to FIG. 20A, which is a plan view illustrating a variation of the first semiconductor element 2A shown in FIG. 20. This variation is different in configuration of the electrode pads 251A, 252A from that shown in FIG. 20. Specifically, according to the variation of FIG. 20A, three electrode pads 251A or 252A are provided for each of the conductive layers 231. In other words, a plurality of openings are formed in the protective film 24A for each conductive layer 231. Further, for the leftmost and rightmost conductive layers 231 respectively, the upper two electrode pads 251A are connected to each other via a connection member (wire 51 in the illustrated example). For the central conductive layer 231, the lower two electrode pads 252A are connected to each other via another connection member (wire in the illustrated example). As described with this variation, an additional electrode pad(s) and an additional connection member(s) may be provided for each or a selected one(s) of the conductive layers 231, thereby forming a bypass of electric current accompanying the corresponding conductive layer.

It should be noted that the variation described above can be applied to the second semiconductor element 2B. Hence, the illustrated variation of FIG. 20A may be made to only one of the first semiconductor element 2A and the second semiconductor element 2B, or may be made to both the semiconductor elements 2A, 2B. Such selection may hold for the following variations described with reference to FIGS. 20B and 20C.

Figure 20B:
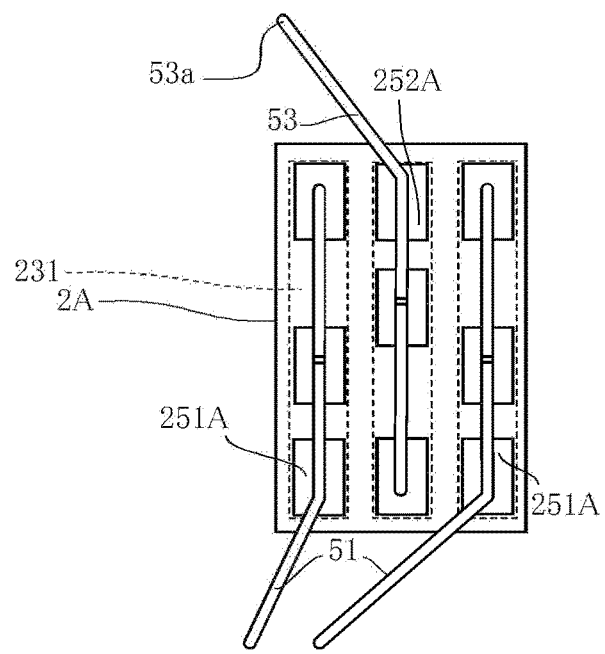
FIG. 20B is a plan view showing a portion of another variation of the electronic device shown in FIG. 20.

FIG. 20B is a plan view illustrating another variation of the first semiconductor element 2A (or 2B) shown in FIG. 20. This second variation is different in configuration of the electrode pads 251A, 252A from that shown in FIG. 20. Specifically, in the second variation of FIG. 20B, three electrode pads 251A, 252A are provided for each conductive layer 231, like the variation of FIG. 20A. However, the three electrode pads 251A or 252A for the respective conductive layers 231 are connected one after another via a single continuous connection member (wire 51 or 53 in the illustrated example), whereby these three electrode pads of each conductive layer 231 are electrically connected by an additional connection member besides the relevant conductive layer itself. Alternatively, the mutual connection of the three electrode pads may be made by more than one connection member such as two separate wires. In this case, one of the two connection members may be used for directly connecting the central electrode pad and the upper electrode pad to each other, and the other of the two connection members may be used for directly connecting the central electrode pad and the lower (i.e. remaining) electrode pad to each other.

Figure 20C:
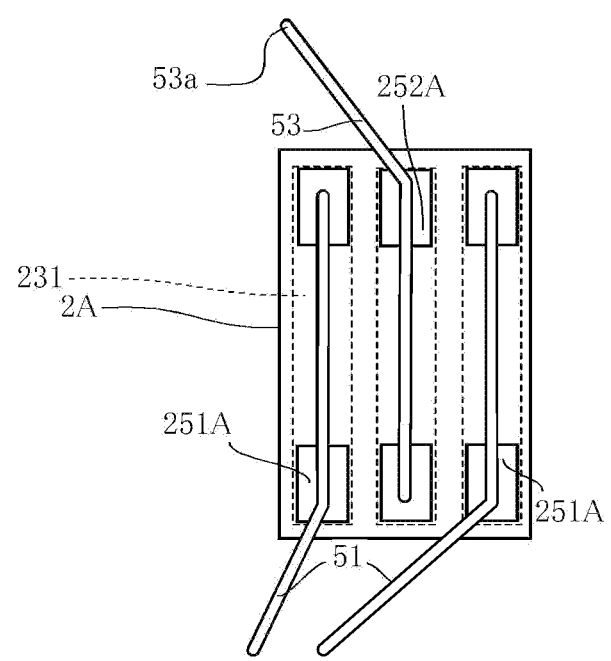
FIG. 20C is a plan view showing a portion of still another variation of the electronic device shown in FIG. 20.

FIG. 20C is a plan view illustrating still another variation of the first semiconductor element 2A (or 2B) shown in FIG. 20. This third variation is different in configuration of the electrode pads 251A, 252A from that shown in FIG. 20. Specifically, in the third variation, two electrode pads 251A or 252A are provided for each conductive layer 231, and these two electrode pads are mutually connected via a single connection member (wire 51 or 53 in the illustrated example).

It should be noted that the variations shown in FIGS. 20A, 20B and 20C can be applied to the electronic device A1 of the first aspect shown in FIG. 2.

Turning back to FIG. 20, a second semiconductor element 3 is, for example, a control IC. The second semiconductor element 3 performs drive control of the first semiconductor elements 2A and 2B. The second semiconductor element 3 is electrically connected to the first semiconductor elements 2A and 2B. For example, the second semiconductor element 3 is electrically connected to the semiconductor regions 223A (gate regions) of the first semiconductor element 2A and controls the first semiconductor element 2A by outputting control signals to the semiconductor regions 223A (gate regions). Similarly, the second semiconductor element 3 is electrically connected to the semiconductor regions 223B (gate regions) of the first semiconductor element 2B and controls the first semiconductor element 2B by outputting control signals to the semiconductor regions 223B (gate regions).

The second semiconductor element 3 has an element main surface 301 that faces upward in the z direction. The element main surface 301 is formed by a protective film 32 that is similar to the protective films 24A and 24B. Openings are formed in portions of the protective film 32, and electrode pads 31 are exposed from the openings. The electrode pads 31 are formed on the second semiconductor element 3. Some of the connection members 5 (wires 55) are respectively connected to the electrode pads 31.

The lead frame 4 forms a conductive path between the electronic component 1 and a circuit board for electronic apparatuses and the like due to the electronic device B1 being mounted on the circuit board. The lead frame 4 supports the electronic component 1. The constituent material of the lead frame 4 is, for example, Cu (copper), or a Cu alloy. The lead frame 4 can be formed of a metal plate. The plate thickness of the metal plate is, for example, about 0.2 mm. For example, Ni plating is applied to the outer surface of the lead frame 4. As shown in FIG. 20, the lead frame 4 includes a lead 41, a lead 42, a lead 43, a lead 44, leads 45, and a die pad 46. The lead 41, the lead 42, the lead 43, the lead 44, the leads 45, and the die pad 46 are spaced apart from each other.

Figure 21:
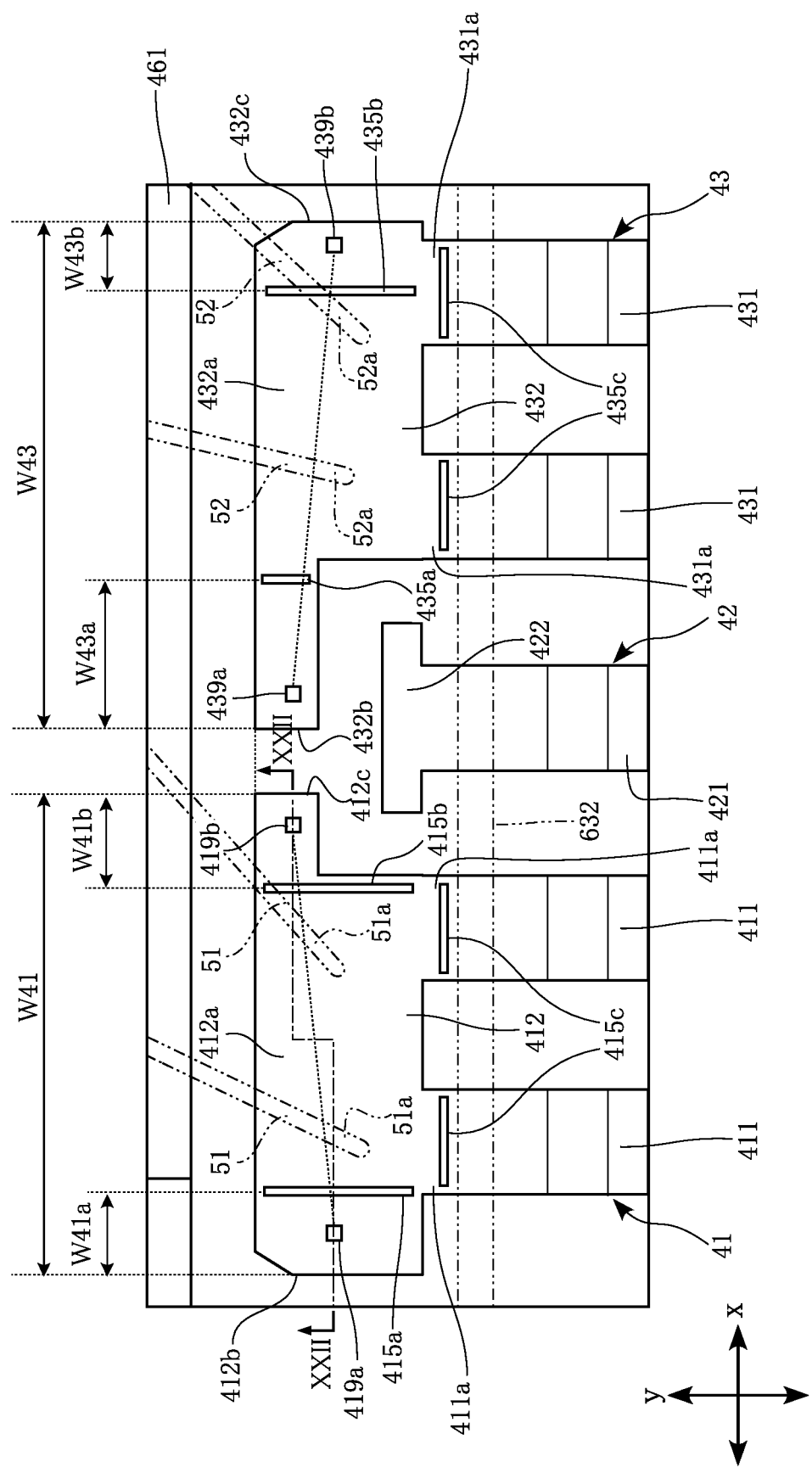
FIG. 21 is an enlarged view showing a portion of FIG. 20.

As shown in FIGS. 20 and 21, the lead 41 includes two terminal portions 411 and a pad portion 412. In a plan view, the pad portion 412 has an elongated rectangular shape that is elongated in the x direction and has a notch in a corner portion (lower right corner portion in FIGS. 20 and 21) in the direction in which the lead 42 is located. The notch is provided so as not to come into contact with the lead 42. The notch need not be provided as long as the pad portion 412 does not come into contact with the lead 42. Bonding portions 51a of the wires 51 are bonded to the pad portion 412.

In the lead 41, as shown in FIG. 21, the pad portion 412 has a pad main surface 412a that faces upward in the z direction. The pad main surface 412a is flat. The pad main surface 412a has a first edge 412b and a second edge 412c. The first edge 412b and the second edge 412c are located on mutually opposite sides in the x direction. The first edge 412b is an edge on the left side in FIG. 21. The second edge 412c is an edge on the right side in FIG. 21.

Figure 22:
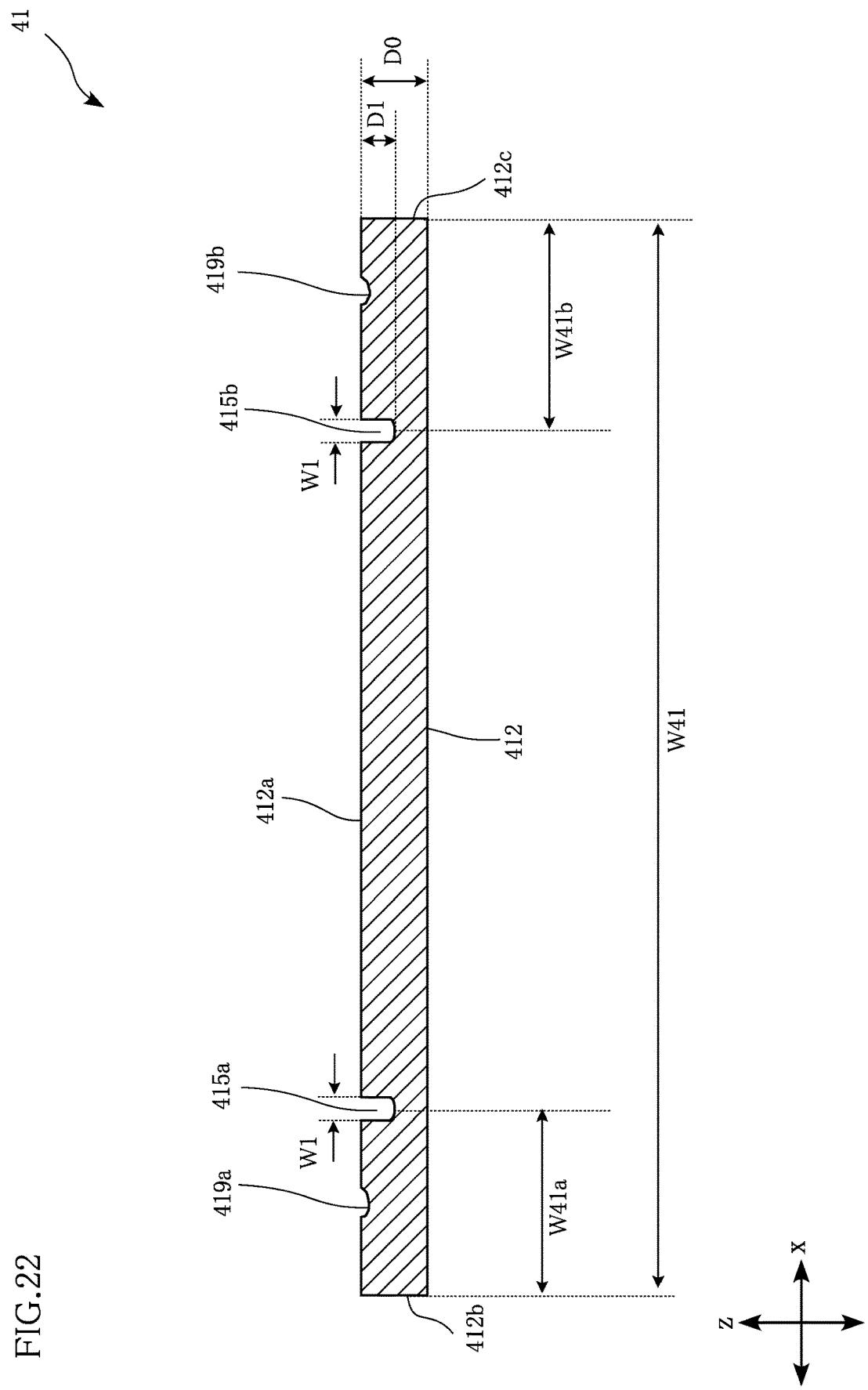
FIG. 22 is a cross-sectional view taken along line XXII-XXII in FIG. 21.
Figure 23:
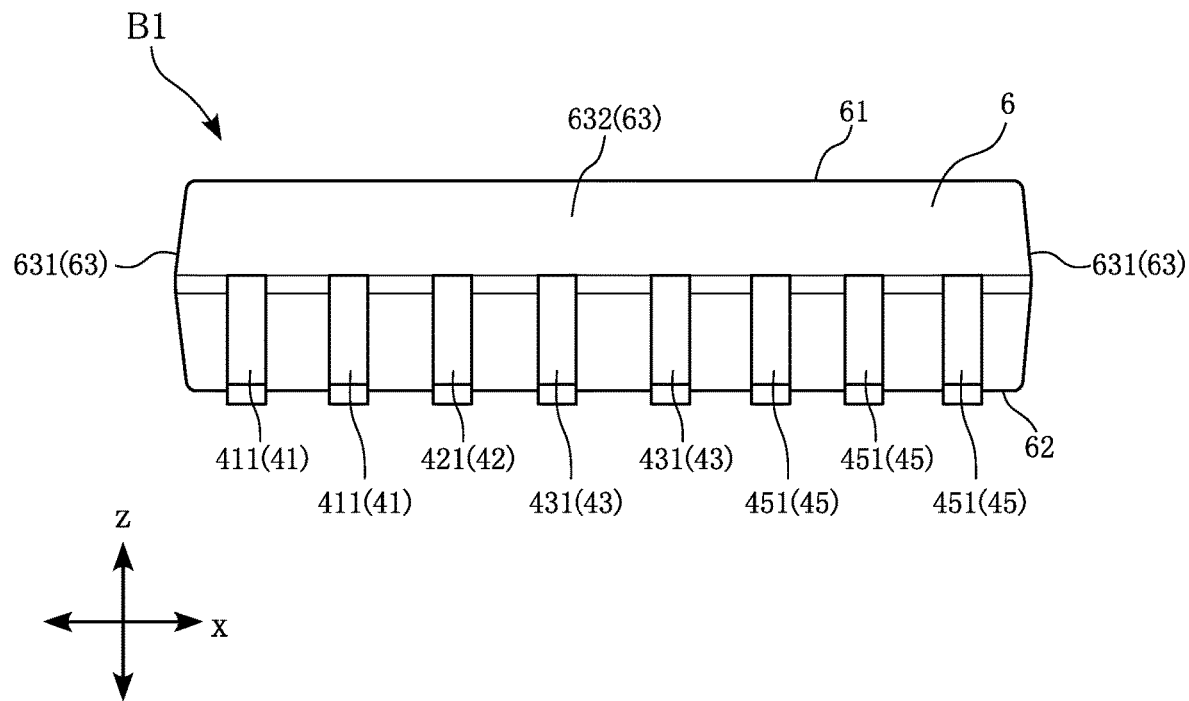
FIG. 23 is a front view showing the electronic device according to the first embodiment of the second aspect.

The pad portion 412 includes a first groove 415a and a second groove 415b. As shown in FIG. 22, the first groove 415a and the second groove 415b are grooves that are recessed in the z direction from the pad main surface 412a, and extend in the y direction. The first groove 415a and the second groove 415b are formed through, for example, half etching or punching. A depth (dimension in the z direction) D1 of each of the first groove 415a and the second groove 415b is about half of a thickness (dimension in the z direction) D0 of the lead 41, and is about 0.1 mm. Note that the depth D1 is set as appropriate according to the thickness D0 of the lead 41, such that the strength of the lead 41 can be retained. A width (dimension in the x direction) W1 of each of the first groove 415a and the second groove 415b is about 0.1 mm, and the present disclosure is not limited thereto. The first groove 415a and the second groove 415b are both solid line-shaped (continuous overall) grooves. The first groove 415a and the second groove 415b are not limited to this, and may also be broken line-shaped (dotted line-shaped) grooves. The first groove 415a and the second groove 415b may also be curved line-shaped.

In a plan view, the first groove 415a and the second groove 415b are parallel to each other and are parallel to the first edge 412b and the second edge 412c. The first groove 415a is arranged toward the first edge 412b, and the second groove 415b is arranged toward the second edge 412c. A dimension W41 (FIG. 21) of an interval between the first edge 412b and the second edge 412c is about 1.2 mm. A dimension W41a of an interval between the first groove 415a and the first edge 412b is about 0.3 mm, and a dimension W41b of an interval between the second groove 415b and the second edge 412c is about 0.3 mm. It is preferable that the dimension W41a and the dimension W41b is 0.2 mm or greater and 1.0 mm or less. Even if there is a large amount of deformation such as warping, waviness, and the like of the lead frame 4, as long as the dimension W41a and the dimension W41b are each 1.0 mm, it is possible to ensure a sufficient range in which the tip portions of the clamp members 90 press down the lead frame 4. The first groove 415a and the second groove 415b are arranged in order to clarify the regions that are to be pressed by the tip portions of the clamp members 90 in the step of bonding the wires 51. These regions are set such that even when pressed down by the tip portions of the clamp members 90 during the bonding of the bonding portions 51a, the clamp members 90 do not inhibit the bonding. The bonding portions 51a are bonded between the first groove 415a and the second groove 415b of the pad main surface 412a. That is, the bonding portions 51a are arranged on the side opposite to the first edge 412b with respect to the first groove 415a, and are arranged on the side opposite to the second edge 412c with respect to the second groove 415b.

As shown in FIGS. 20 and 21, a pair composed of a first pressing mark 419a and a second pressing mark 419b is formed on the pad portion 412. The first pressing mark 419a and the second pressing mark 419b are formed in the step of bonding the wires 51. The first pressing mark 419a and the second pressing mark 419b have forms that are recessed in the z direction from the pad main surface 412a. The plan view shape of each of the first pressing mark 419a and the second pressing mark 419b is not limited to the shape shown in FIGS. 20 and 21, and depends on the shapes of the tip portions of the clamp members 90. The first pressing mark 419a is arranged between the first groove 415a and the first edge 412b. That is, the first pressing mark 419a is arranged on the side opposite to the bonding portion 51a with respect to the first groove 415a. The second pressing mark 419b is arranged between the second groove 415b and the second edge 412c. That is, the second pressing mark 419b is arranged on the side opposite to the bonding portion 51a with respect to the second groove 415b.

Portions of the terminal portions 411 are exposed from the resin member 6. Each terminal portion 411 is connected to the pad portion 412 at a portion covered by the resin member 6. Each terminal portion 411 is bent in the z direction at a portion exposed from the resin member 6. As shown in FIG. 21, the terminal portions 411 have terminal main surfaces 411a that face upward in the z direction. The terminal main surfaces 411a are flat and are mutually level with the pad main surface 412a. The terminal portions 411 each include a fifth groove 415c. The fifth grooves 415c are grooves that are recessed in the z direction from the terminal main surfaces 411a and extend in the x direction. The fifth grooves 415c are covered by the resin member 6 and are parallel to a resin side surface 632 (see FIGS. 19 and 20). The fifth grooves 415c are arranged in order to clarify the outer boundary in the y direction of the region in which the bonding portions 51a in the lead 41 can be bonded.

As shown in FIGS. 20 and 21, the lead 42 includes a terminal portion 421 and a pad portion 422. The pad portion 422 has an elongated rectangular shape that is elongated in the x direction in a plan view. The dimension in the x direction of the pad portion 422 is greater than that of the terminal portion 421 in a plan view. The pad portion 422 is covered by the resin member 6. The pad portion 422 is not connected to any of the connection members 5. The pad portion 422 is electrically insulated from the electronic component 1. A portion of the terminal portion 421 is exposed from the resin member 6. The terminal portion 421 is connected to the pad portion 422 at a portion covered by the resin member 6. The terminal portion 421 is bent in the z direction at the portion exposed from the resin member 6.

As shown in FIGS. 20 and 21, the lead 43 includes two terminal portions 431 and a pad portion 432. In a plan view, the pad portion 432 has an elongated rectangular shape that is elongated in the x direction and has a notch in a corner portion (lower left corner portion in FIGS. 20 and 21) in the direction in which the lead 42 is located. The notch is provided so as not to come into contact with the lead 42. The notch may also not be provided, as long as the pad portion 432 does not come into contact with the lead 42. Bonding portions 52a of the wires 52 are bonded to the pad portion 432.

In the lead 43, as shown in FIG. 21, the pad portion 432 has a pad main surface 432a that faces upward in the z direction. The pad main surface 432a is flat. The pad main surface 432a has a first edge 432b and a second edge 432c. The first edge 432b and the second edge 432c are located on mutually opposite sides in the x direction. The first edge 432b is an edge on the left side in FIG. 21. The second edge 432c is an edge on the right side in FIG. 21.

The pad portion 432 includes a first groove 435a and a second groove 435b. The first groove 435a and the second groove 435b are grooves that are recessed in the z direction from the pad main surface 432a and extend in the y direction. The first groove 435a and the second groove 435b are formed through, for example, half etching or punching. The depth of each of the first groove 435a and the second groove 435b is, for example, about half of the thickness of the lead 43, and is about 0.1 mm. The width of each of the first groove 435a and the second groove 435b is, for example, about 0.1 mm.

In a plan view, the first groove 435a and the second groove 435b are parallel to each other and are parallel to the first edge 432b and the second edge 432c. The first groove 435a is arranged toward the first edge 432b, and the second groove 435b is arranged toward the second edge 432c. A dimension W43 (FIG. 21) of an interval between the first edge 432b and the second edge 432c is about 1.2 mm. A dimension W43a of an interval between the first groove 435a and the first edge 432b is about 0.4 mm, and a dimension W43b of an interval between the second groove 435b and the second edge 432c is about 0.3 mm. Note that it is desirable that the dimension W43a and the dimension W43b are each 0.2 mm or greater and 1.0 mm or less. The first groove 435a and the second groove 435b are arranged in order to clarify the regions that are to be pressed by the tip portions of the clamp members 90 in the step of bonding the wires 52. These regions are set such that even when pressed down by the tip portions of the clamp members 90 during the bonding of the bonding portions 52a, the clamp members 90 do not inhibit the bonding. The bonding portions 52a are bonded between the first groove 435a and the second groove 435b of the pad main surface 432a. That is, the bonding portions 52a are arranged on the side opposite to the first edge 432b with respect to the first groove 435a, and are arranged on the side opposite to the second edge 432c with respect to the second groove 435b.

As shown in FIGS. 20 and 21, a pair composed of a first pressing mark 439a and a second pressing mark 439b is formed on the pad portion 432. The first pressing mark 439a and the second pressing mark 439b are formed in the step of bonding the wires 52. The first pressing mark 439a and the second pressing mark 439b have a form that is recessed in the z direction from the pad main surface 432a. The plan view shapes of the first pressing mark 439a and the second pressing mark 439b are not limited to the shapes shown in FIGS. 20 and 21, and depend on the shapes of the tip portions of the clamp members 90. The first pressing mark 439a is arranged between the first groove 435a and the first edge 432b. That is, the first pressing mark 439a is arranged on the side opposite to the bonding portion 52a with respect to the first groove 435a. The second pressing mark 439b is arranged between the second groove 435b and the second edge 432c. That is, the second pressing mark 439b is arranged on the side opposite to the bonding portion 52a with respect to the second groove 435b.

Portions of the terminal portions 431 are exposed from the resin member 6. Each terminal portion 431 is connected to the pad portion 432 at a portion covered by the resin member 6. Each terminal portion 431 is bent in the z direction at a portion exposed from the resin member 6. As shown in FIG. 21, the terminal portions 431 have terminal main surfaces 431a that face upward in the z direction. The terminal main surfaces 431a are flat and are mutually level with the pad main surface 432a. The terminal portions 431 each include a fifth groove 435c. The fifth grooves 435c are grooves that are recessed in the z direction from the terminal main surfaces 431a and extend in the x direction. The fifth grooves 435c are covered by the resin member 6 and are parallel to a resin side surface 632. The fifth grooves 435c are arranged in order to clarify the outer boundary in the y direction of the region that can be bonded to by the bonding portions 52a in the lead 43.

As shown in FIG. 20, the lead 44 includes three terminal portions 441 and a pad portion 442. The pad portion 442 has an elongated rectangular shape that is elongated in the x direction in a plan view. A bonding portion 53a of the wire 53 and a bonding portion 54a of the wire 54, which will be described later, are bonded to the pad portion 442.

In the lead 44, as shown in FIG. 20, the pad portion 442 has a pad main surface 442a that faces upward in the z direction. The pad main surface 442a is flat. The pad main surface 442a has a first edge 442b and a second edge 442c. The first edge 442b and the second edge 442c are located on end portions on mutually opposite sides in the x direction. The first edge 442b is an edge on the left side in FIG. 20. The second edge 442c is an edge on the right side in FIG. 20.

The pad portion 442 includes a first groove 445a and a second groove 445b. The first groove 445a and the second groove 445b are grooves that are recessed in the z direction from the pad main surface 442a and extend in the y direction. The first groove 445a and the second groove 445b are formed through, for example, half etching or punching. The depth of each of the first groove 445a and the second groove 445b is about half of the thickness of the lead 44, and is about 0.1 mm. The width of each of the first groove 445a and the second groove 445b is, for example, about 0.1 mm.

In a plan view, the first groove 445a and the second groove 445b are parallel to each other and are parallel to the first edge 442b and the second edge 442c. The first groove 445a is arranged toward the first edge 442b, and the second groove 445b is arranged toward the second edge 442c. A dimension W44 (FIG. 28) of an interval between the first edge 442b and the second edge 442c is about 1.8 mm. A dimension W44a of an interval between the first groove 445a and the first edge 442b is about 0.3 mm, and a dimension W44b of an interval between the second groove 445b and the second edge 442c is about 0.3 mm. It is desirable that the dimension W44a and the dimension W44b are each 0.2 mm or greater and 1.0 mm or less. The first groove 445a and the second groove 445b are arranged in order to clarify the region that is to be pressed by the tip portions of the clamp members 90 in the step of bonding the wires 53 and 54. This region is set such that even when pressed down by the tip portions of the clamp members 90 when bonding the bonding portion 53a and the bonding portion 54a, the clamp members 90 do not inhibit the bonding. The bonding portion 53a and the bonding portion 54a are bonded between the first groove 445a and the second groove 445b of the pad main surface 442a. That is, the bonding portion 53a and the bonding portion 54a are arranged on the side opposite to the first edge 442b with respect to the first groove 445a, and are arranged on the side opposite to the second edge 442c with respect to the second groove 445b.

As shown in FIG. 20, a pair composed of a first pressing mark 449a and a second pressing mark 449b is formed on the pad portion 442. The first pressing mark 449a and the second pressing mark 449b are formed in the step of bonding the wires 53 and 54. The first pressing mark 449a and the second pressing mark 449b have a form that is recessed in the z direction from the pad main surface 442a. The plan view shapes of the first pressing mark 449a and the second pressing mark 449b are not limited to the shapes shown in FIG. 20, and depend on the shapes of the tip portions of the clamp members 90. The first pressing mark 449a is arranged between the first groove 445a and the first edge 442b. That is, the first pressing mark 449a is arranged on the side opposite to the bonding portion 53a and the bonding portion 54a with respect to the first groove 445a. The second pressing mark 449b is arranged between the second groove 445b and the second edge 442c. That is, the second pressing mark 449b is arranged on the side opposite to the bonding portion 53a and the bonding portion 54a with respect to the second groove 445b.

Portions of the terminal portions 441 are exposed from the resin member 6. Each terminal portion 441 is connected to the pad portion 442 at a portion covered by the resin member 6. Each terminal portion 441 is bent in the z direction at a portion exposed from the resin member 6. As shown in FIG. 20, the terminal portions 441 have terminal main surfaces 441a that face upward in the z direction. The terminal main surfaces 441a are flat and are mutually level with the pad main surface 442a. The terminal portions 441 each include a fifth groove 445c. The fifth grooves 445c are grooves that are recessed in the z direction from the terminal main surface 441a and extend in the x direction. The fifth grooves 445c are covered by the resin member 6 and are parallel to a resin side surface 632. The fifth grooves 445c are arranged in order to clarify the outer boundary in the y direction of the region to which the bonding portion 53a and the bonding portion 54a can be bonded on the lead 44.

The first groove 415a and the second groove 415b of the lead 41 do not need to be parallel to each other. Similarly, the first groove 435a and the second groove 435b of the lead 43 do not need to be parallel to each other, and the first groove 445a and the second groove 445b of the lead 44 do not need to be parallel to each other. The groove 415c of the lead 41, the groove 435c, of the lead 43, and the groove 445c of the lead 44 are parallel to the resin side surface 632, and are parallel to each other.

As shown in FIG. 20, the leads 45 include terminal portions 451 and pad portions 452. The pad portions 452 have shapes whose central portions in the y direction are narrowed in a plan view. Wires 55 are bonded to the pad portions 452. In the pad portion 452, for example, Ag plating is performed on Ni plating. For ease of comprehension, the regions to which Ag plating is applied are indicted by a dot pattern in FIG. 20.

Portions of the terminal portions 451 are exposed from the resin member 6. The terminal portions 451 are connected to the pad portions 452 at portions covered by the resin member 6. Each terminal portion 451 is bent in the z direction at a portion exposed from the resin member 6.

Figure 24:
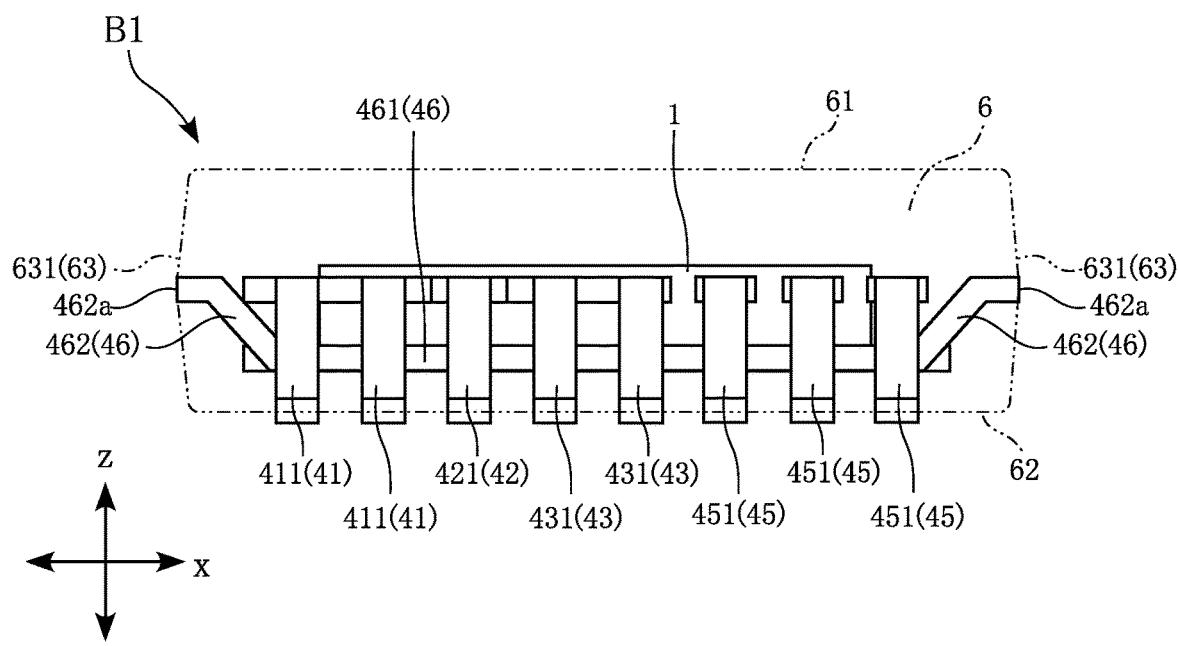
FIG. 24 is a front view showing the electronic device according to the first embodiment of the second aspect, viewed through a resin member.
Figure 25:
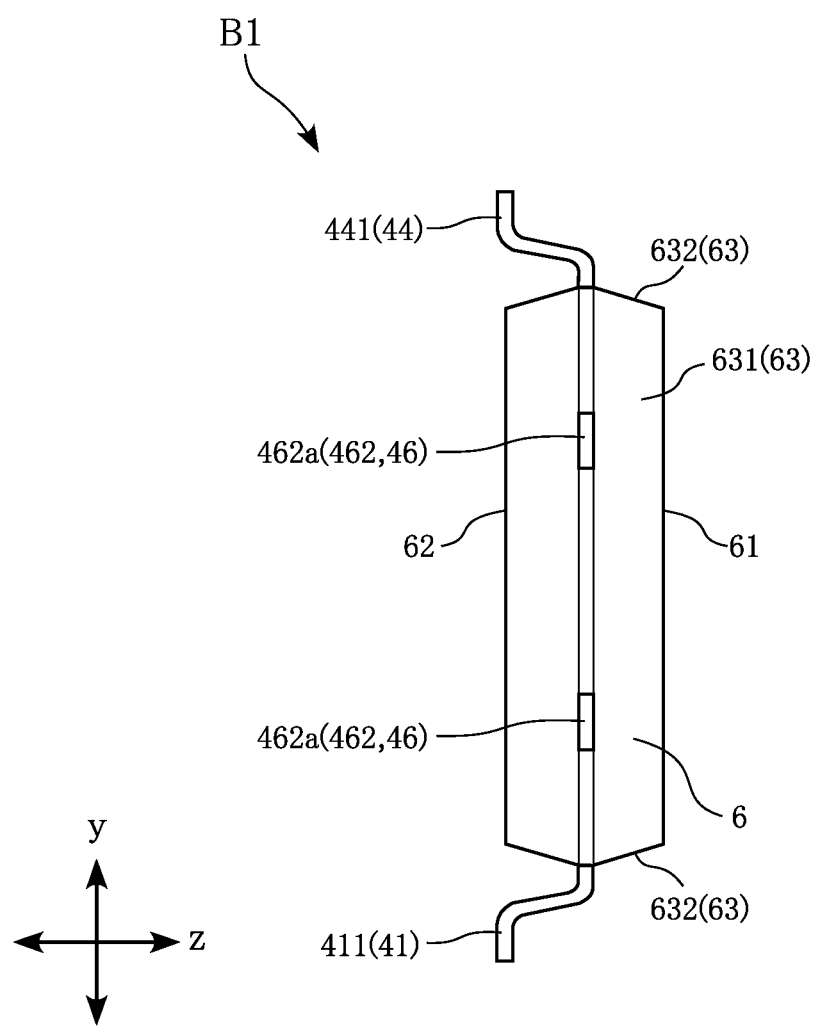
FIG. 25 is a side view showing the electronic device according to the first embodiment of the second aspect.

The electronic component 1 is mounted on the die pad 46. In the example shown in the drawings, the die pad 46 is not electrically connected to the electronic component 1, but the die pad 46 may also be electrically connected to the electronic component 1. As shown in FIGS. 20 and 24, the die pad 46 includes a pad portion 461 and extended portions 462.

As shown in FIG. 20, the pad portion 461 includes a die pad main surface 461a that faces upward in the z direction. The die pad main surface 461a is flat. The die pad main surface 461a has a first edge 461b and a second edge 461c. The first edge 461b and the second edge 461c are located on edge portions on mutually opposite sides in the x direction. The first edge 461b is an edge on the left side in FIG. 20. The second edge 461c is an edge on the right side in FIG. 20.

The pad portion 461 includes a third groove 465a and a fourth groove 465b. The third groove 465a and the fourth groove 465b are grooves that are recessed in the z direction from the die pad main surface 461a, and extend in the y direction. The third groove 465a and the fourth groove 465b are formed through, for example, half etching or punching. The depth of each of the third groove 465a and the fourth groove 465b is, for example, about half of the thickness of the die pad 46, and is about 0.1 mm. The width of each of the third groove 465a and the fourth groove 465b is, for example, about 0.1 mm.

In a plan view, the third groove 465a and the fourth groove 465b are parallel to each other and are parallel to the first edge 461b and the second edge 461c. The third groove 465a is arranged toward the first edge 461b, and the fourth groove 465b is arranged toward the second edge 461c. A dimension W46 (FIG. 28) of an interval between the first edge 461b and the second edge 461c is about 4.2 mm. A dimension W46a of the interval between the third groove 465a and the first edge 461b is about 0.3 mm, and a dimension W46b of the interval between the fourth groove 465b and the second edge 461c is about 0.5 mm. It is desirable that the dimension W46a and the dimension W46b are each 0.2 mm or greater and 1.0 mm or less. The third groove 465a and the fourth groove 465b are arranged in order to clarify the region that is to be pressed down by the tip portions of the clamp members 95 in the step of bonding the wires 51 to 55. The electronic component 1 is mounted between the third groove 465a and the fourth groove 465b of the die pad main surface 461a. That is, the electronic component 1 is mounted on the side opposite to the first edge 461b with respect to the third groove 465a, and is arranged on the side opposite to the second edge 461c with respect to the fourth groove 465b.

As shown in FIG. 20, a pair composed of a third pressing mark 469a and a fourth pressing mark 469b are formed on the pad portion 461. The third pressing mark 469a and the fourth pressing mark 469b are formed in the step of bonding the wires 51 to 55. The third pressing mark 469a and the fourth pressing mark 469b have a form that is recessed in the z direction from the die pad main surface 461a. The plan view shapes of the third pressing mark 469a and the fourth pressing mark 469b are not limited to the shapes shown in FIG. 20, and depend on the shapes of the tip portions of clamp members 95. The third pressing mark 469a is arranged between the third groove 465a and the first edge 461b. That is, the third pressing mark 469a is arranged on the side opposite to the electronic component 1 with respect to the third groove 465a. The fourth pressing mark 469b is arranged between the fourth groove 465b and the second edge 461c. That is, the fourth pressing mark 469b is arranged on the side opposite to the electronic component 1 with respect to the fourth groove 465b.

Extended portions 462 extend from the pad portion 461. End surfaces 462a are exposed from the resin member 6 at the extended portions 462. In the example shown in the drawings, the underside surface of the pad portion 461, which faces downward in the z direction, is covered by the resin member 6, but the underside surface may also be exposed from the resin member 6.

As shown in FIG. 20, the lead 41, the lead 42, the lead 43, and some of the leads 45 are provided on one side in the y direction of the die pad 46 in the lead frame 4, in a plan view. The terminal portions 411, 421, 431, and 451 overlap with each other in a view in the x direction. The lead 44 and the other leads 45 are arranged on the other side of the die pad 46 in the y direction in a plan view. The terminal portions 441 and 451 overlap with each other in a view in the x direction. As shown in FIGS. 20 and 21, the terminal portions 411 of the lead 41, the terminal portion 421 of the lead 42, and the terminal portions 431 of the lead 43 are arranged side by side in the x direction in a plan view. As shown in FIGS. 20 and 21, in a plan view, the terminal portion 421 of the lead 42 is interposed between the terminal portions 411 of the lead 41 and the terminal portions 431 of the lead 43.

The separation distances in the y direction between the leads 41, 43, 44, and 45 and the die pad 46 are substantially the same, and are each, for example, about 0.15 mm. The separation distance in the y direction between the lead 42 and the die pad 46 is greater than each of the separation distances in the y direction between the leads 41, 43, 44, and 45 and the die pad 46. The dimensions in the x direction of the terminal portions 411, 421, 431, 441, and 451 of the leads 41 to 45 are each, for example, about 0.25 mm. The separation distance between each of two of the terminals 411, 421, 431, 441, and 451 that are adjacent to each other in the x direction is about 0.25 mm.

The connection members 5 each electrically connect two members that are spaced apart from each other. Each connection member 5 electrically connects the electronic component 1 (one of the first semiconductor elements 2A and 2B and the second semiconductor element 3) and the lead frame 4. In the example shown in the drawings, the connection members 5 are wires with circular cross-sections. As shown in FIG. 20, the connection members 5 include the two wires 51, the two wires 52, the wire 53, the wire 54, and the wires 55.

The two wires 51 electrically connect the electrode pads 251A of the first semiconductor element 2A and the pad portion 412 of the lead 41. As shown in FIG. 20, the wires 51 each have a first end bonded to an electrode pad 251A and a second end bonded to the pad portion 412. The second ends (bonding portions 51a shown in FIG. 21) of the wires 51 are bonded between the first groove 415a and the second groove 415b of the pad main surface 412a, and intersect a line segment connecting the first pressing mark 419a and the second pressing mark 419b.

The two wires 52 electrically connect the electrode pads 252B of the first semiconductor element 2B and the pad portion 432 of the lead 43. As shown in FIG. 20, the wires 52 each have a first end bonded to an electrode pad 252B and a second end bonded to the pad portion 432. The second ends (bonding portions 52a shown in FIG. 21) of the wires 52 are bonded between the first groove 435a and the second groove 435b of the pad main surface 432a, and intersect a line segment connecting the first pressing mark 439a and the second pressing mark 439b.

The wire 53 electrically connects the electrode pad 252A of the first semiconductor element 2A and the pad portion 442 of the lead 44. As shown in FIG. 20, the wire 53 has a first end bonded to the electrode pad 252A and a second end bonded to the pad portion 442. The second end (bonding portion 53a) of the wire 53 is bonded between the first groove 445a and the second groove 445b of the pad main surface 442a and intersects a line segment connecting the first pressing mark 449a and the second pressing mark 449b.

The wire 54 electrically connects the electrode pad 251B of the first semiconductor element 2B and the pad portion 442 of the lead 44. As shown in FIG. 20, the wire 54 has a first end bonded to the electrode pad 251B and a second end bonded to the pad portion 442. The second end (bonding portion 54a) of the wire 54 is bonded between the first groove 445a and the second groove 445b of the pad main surface 442a and intersects a line segment connecting the first pressing mark 449a and the second pressing mark 449b.

The wires 55 electrically connect the electrode pads 31 of the second semiconductor element 3 and the pad portions 452 of the leads 45. As shown in FIG. 20, the wires 55 each have one end bonded to an electrode pad 31 and another end bonded to a pad portion 452 of a lead 45.

The constituent material of the wires 51 to 54 is, for example, Al (aluminum). The thicknesses (diameters) of the wires 51 to 54 are the same, and are each, for example, about 125 to 200 μm. The constituent material of the wires 55 is, for example, Au (gold). Note that the constituent material of the wires 55 may also be Cu or Al. The thickness (diameter) of each of the wires 55 is smaller than the thickness (diameter) of each of the wires 51 to 54. The thickness (diameter) of each wire 55 is, for example, 10 to 50 μm. If both of the first semiconductor elements 2A and 2B are, for example, MOSFETs, each of the wires 51 to 54 is bonded to one of the drain terminals (electrode pads 251A and 251B) and the source terminals (electrode pads 252A and 252B) of the semiconductor elements 2A and 2B. A relatively large current flows in these drain terminals and source terminals. Accordingly, compared to the wires 55, thick wires composed of Al are used as the wires 51 to 54.

Bonding ribbons may also be used as the connection members instead of the above-described wires 51 to 54.

As shown in FIGS. 19, 20, and 23 to 25, the resin member 6 covers portions of the electronic component 1 and the lead frame 4, and the connection members 5. The resin member 6 is composed of an insulating resin material. The constituent material of the resin member 6 is, for example, black epoxy resin. The resin member 6 has, for example, a rectangular shape in a plan view. The resin member 6 has a resin main surface 61, a resin underside surface 62, and resin side surfaces 63.

The resin main surface 61 and the resin underside surface 62 are spaced apart from each other in the z direction. The resin side surfaces 63 are connected to both the resin main surface 61 and the resin underside surface 62 and are located between the resin main surface 61 and the resin underside surface 62 in the z direction. The resin side surfaces 63 include a pair of resin side surfaces 631 that are spaced apart from each other in the x direction, and a pair of resin side surfaces 632 that are spaced apart from each other in the y direction. The leads 41 to 45 protrude from one of the pair of resin side surfaces 632.

Figure 27:
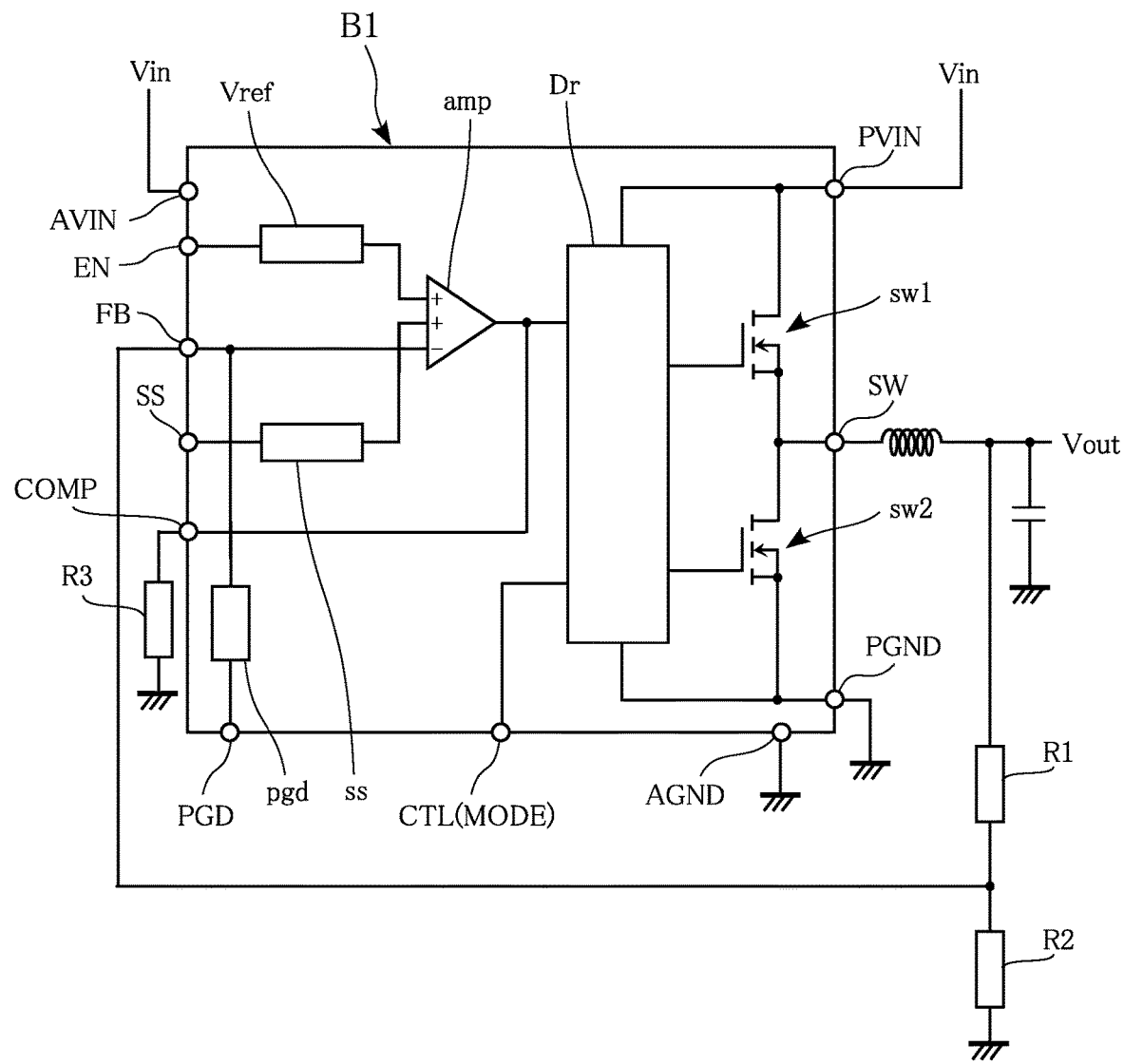
FIG. 27 is a circuit diagram for illustrating the electronic device according to the first embodiment of the second aspect.

FIG. 27 is a circuit diagram for when an electronic device B1 is constituted as a DC/DC converter.

In FIG. 27, reference signs sw1 and sw2 indicate switching elements. Reference sign Dr indicates a control circuit that controls the switching operations of the switching elements sw1 and sw2, various types of protective function operations, and the like. Reference signs R1 to R3 indicate resistors, reference sign Vref indicates an internal reference voltage circuit, reference sign ss indicates a soft start circuit, reference sign pgd indicates a power good circuit, and reference sign amp indicates an error amplifier that receives the Vref output voltage and the FB terminal voltage as inputs. For example, one of the switching elements sw1 and sw2 corresponds to the first semiconductor element 2A, and the other corresponds to the first semiconductor element 2B. The component including the internal reference voltage circuit Vref, the soft start circuit ss, the power good circuit pgd, the error amplifier amp, and the control circuit Dr corresponds to the second semiconductor element 3.

A terminal PVIN is a power source input terminal for a DC/DC converter. The terminal PVIN is connected to, for example, a terminal on a high potential side of a DC power source (not shown). The terminal PVIN corresponds to the lead 41 of the electronic device B1. A terminal PGND is a ground terminal of the DC/DC converter. The terminal PGND is connected to, for example, a terminal on a low potential side of the above-described DC power source. The terminal PGND corresponds to the lead 43 of the electronic device B1. A terminal SW is an output terminal of the DC/DC converter. The terminal SW corresponds to the lead 44 of the electronic device B1.

A terminal AVIN is an analog portion power source input terminal. The terminal AGND is an analog portion ground terminal. A terminal EN is a device control terminal. A terminal FB is an output voltage feedback terminal. A terminal SS is a terminal for setting a soft start time. A terminal COMP is an ERRAMP output terminal. A terminal PGD is a power good terminal. A terminal CTL is a terminal for controlling various functions. A terminal MODE may also be used instead of the terminal CTL. The terminal MODE is a terminal for switching between various modes. The terminal AVIN, the terminal AGND, the terminal EN, the terminal FB, the terminal SS, the terminal COMP, the terminal PGD, and the terminal CTL (or the terminal MODE) each correspond to one of the leads 45.

Next, a method for manufacturing the electronic device B1 will be described with reference to FIGS. 28 to 33.

Figure 28:
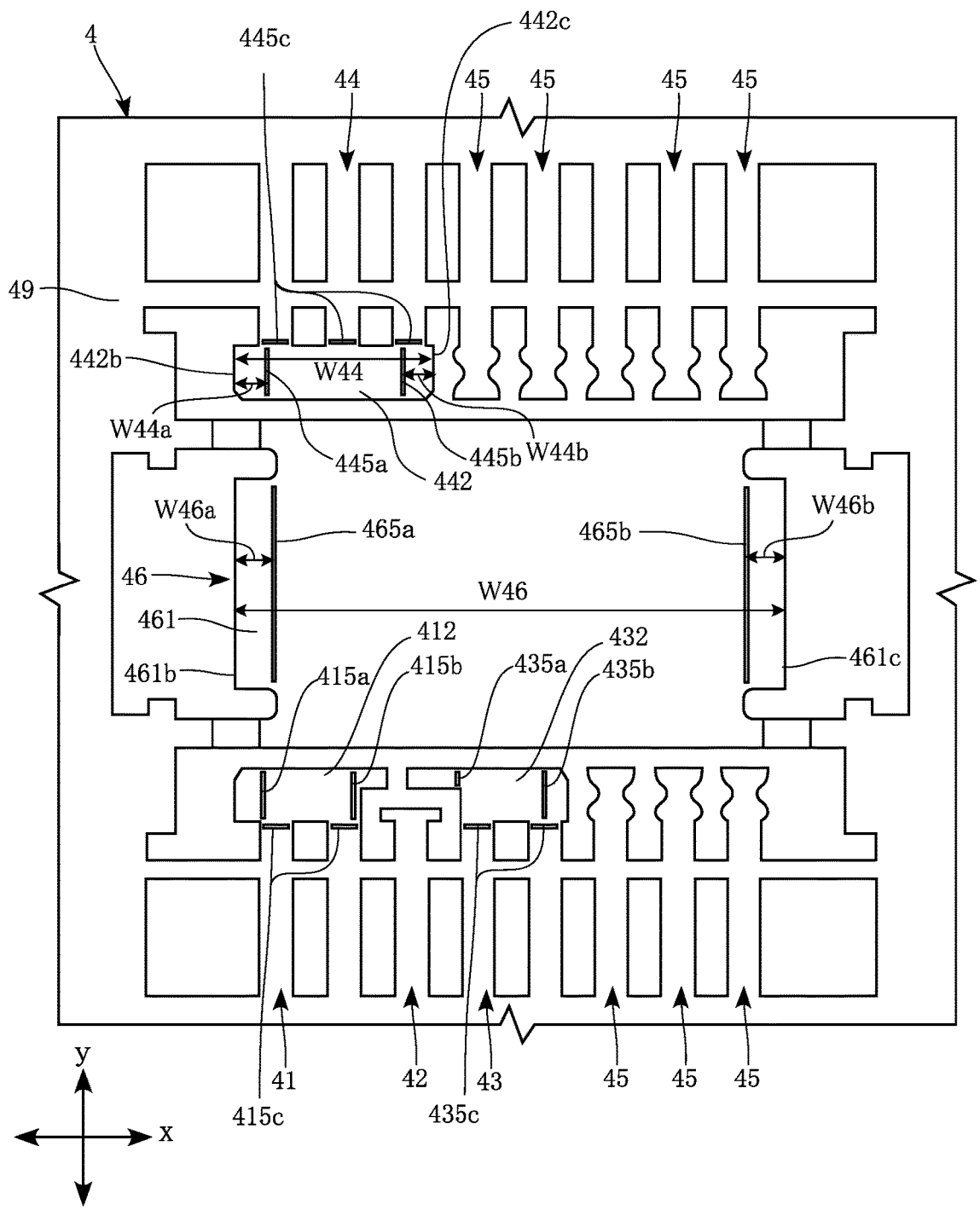
FIG. 28 is a plan view showing one step of the method for manufacturing the electronic device according to the first embodiment of the second aspect.

First, as shown in FIG. 28, the lead frame 4 is prepared (preparation step). For example, the lead frame 4 can be formed by carrying out punching, etching, bending, and the like on a copper plate. As shown in FIG. 28, the lead frame 4 at this time includes the leads 41 to 45, the die pad 46, and a tie bar 49, and the leads 41 to 45 and the die pad 46 are connected by the tie bar 49. A first groove 415a, a second groove 415b, and fifth grooves 415c are formed on the pad portion 412 of the lead 41, a first groove 435a, a second groove 435b, and fifth grooves 435c are formed on the pad portion 432 of the lead 43, a first groove 445a, a second groove 445b, and fifth grooves 445c are formed on the pad portion 442 of the lead 44, and a third groove 465a and a fourth groove 465b are formed on the pad portion 461 of the die pad 46. The first grooves 415a, 435a, and 445a, the second grooves 415b, 435b, and 445b, the third groove 465a, the fourth groove 465b, and the fifth grooves 415c, 435c, and 445c are formed through, for example, half etching or punching.

Figure 29:
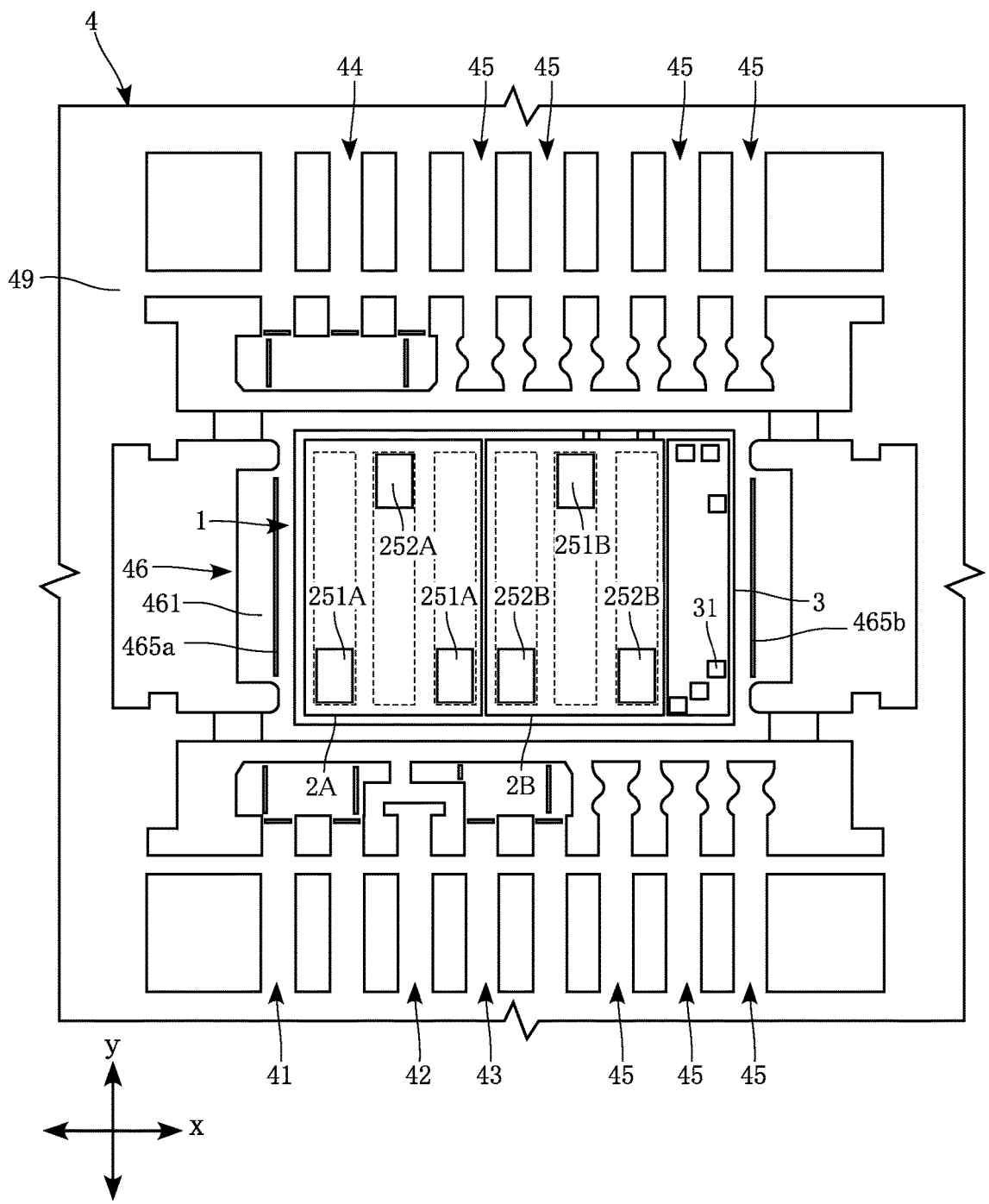
FIG. 29 is a plan view showing one step of the method for manufacturing the electronic device according to the first embodiment of the second aspect.

Next, as shown in FIG. 29, the electronic component 1 is mounted on the lead frame 4 (mounting step or die mounting step). Specifically, the electronic component 1 is adhered to the pad portion 461 of the die pad 46 via a bonding material. At this time, the electronic component 1 is arranged between the third groove 465a and the fourth groove 465b of the die pad main surface 461a. For example, if the bonding material is solder, solder paste is applied to the lead frame 4, and the electronic component 1 is mounted on the applied solder paste. At this time, the electronic component 1 is placed in an orientation in which the electrode pads 251A, 252A, 251B, 252B, and 31 face upward in the z direction. Next, reflow processing is performed, and the solder paste is melted and then allowed to solidify. Accordingly, the electronic component 1 is bonded to the pad portion 461 of the die pad 46. Ag paste, sintered metal, or the like may also be used instead of solder as the bonding material. The bonding material is not limited to being conductive, and may also be insulating.

Next, the connection members 5 (wires 51 to 55) are bonded (bonding step). The wires 51 to 54 are, for example, Al bonding wires. The wires 51 to 54 are bonded through wedge bonding. The wires 55 are, for example, Au bonding wires. The wires 55 are bonded through ball bonding. It is sufficient to use a known bonding apparatus in the bonding of the wires 51 to 55. The bonding apparatus includes a capillary or wedge tool (tool for wedge bonding) and a cutter.

Figure 30:
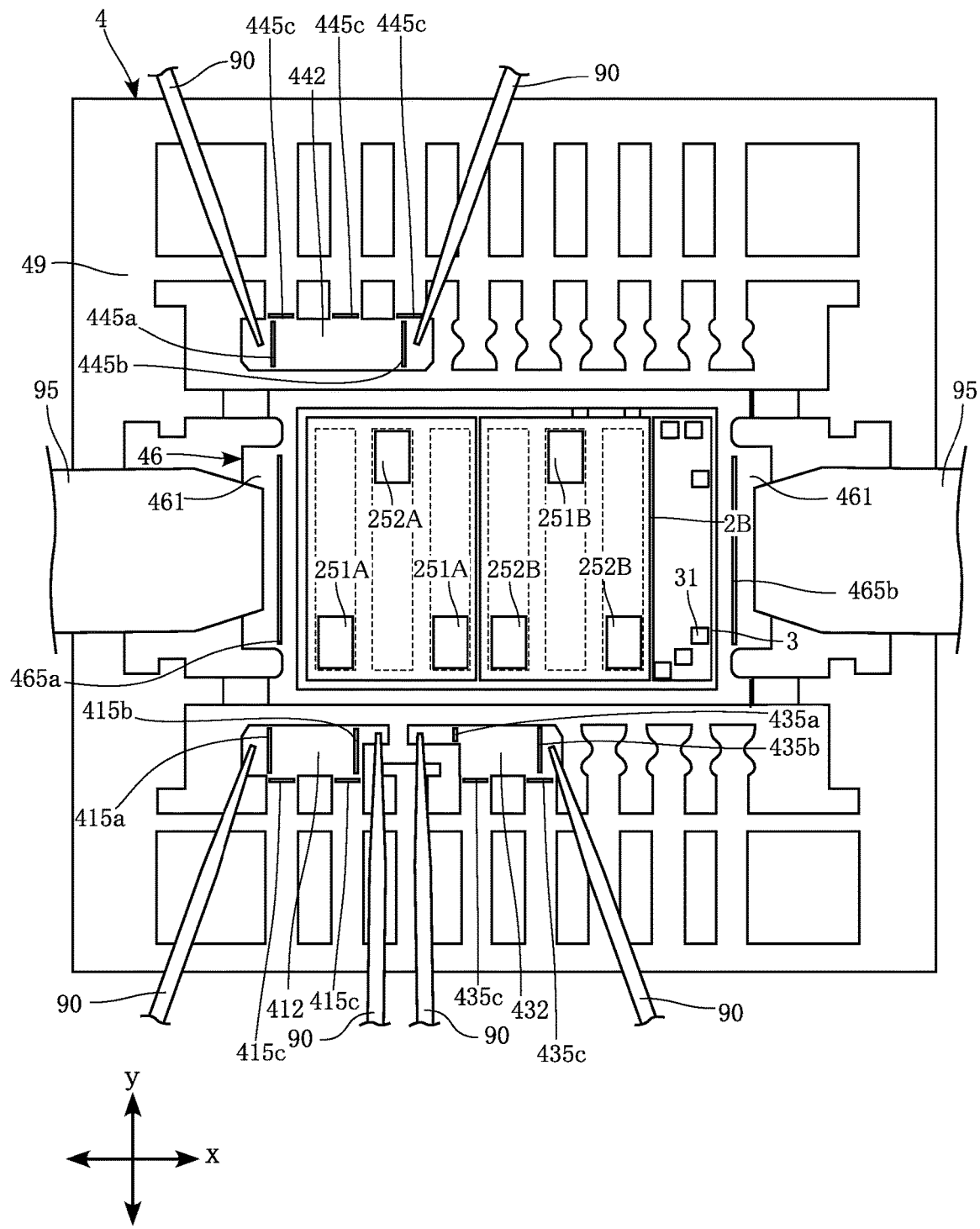
FIG. 30 is a plan view showing one step of the method for manufacturing the electronic device according to the first embodiment of the second aspect.
Figure 31:
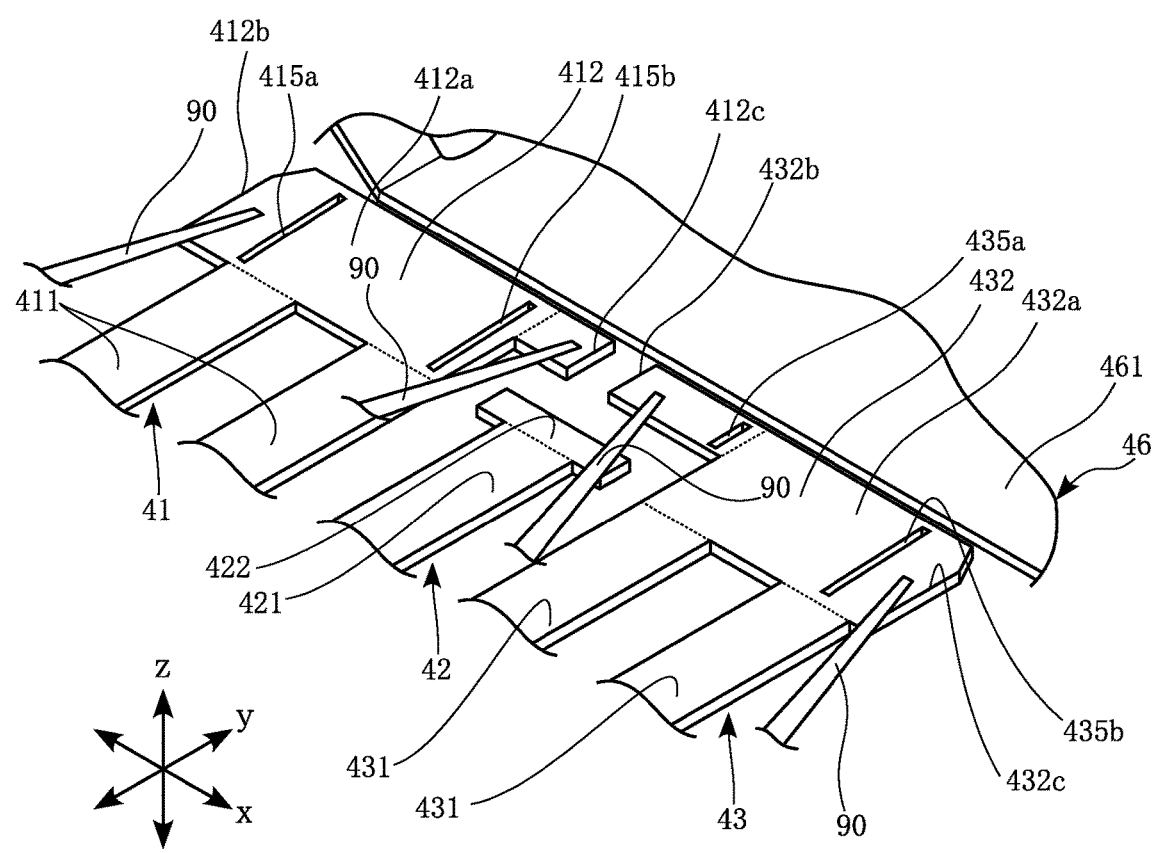
FIG. 31 is a perspective view showing one step of the method for manufacturing the electronic device according to the first embodiment of the second aspect.

In the bonding step, prior to the bonding of the wires 51 to 55, the lead frame 4 is set on a jig (not shown). As one example, the jig is formed so as to match the shape of the lead frame 4, and supports the lead frame 4 from a side opposite to the side on which the electronic component 1 is mounted. Clamp members 90 and clamp members 95 are attached to the jig (see FIG. 30). The clamp members 90 are, for example, narrow rod-shaped overall, and have tapered tips. As shown in FIGS. 30 and 31, the tips come into contact with the pad portion 412 of the lead 41, the pad portion 432 of the lead 43, and the pad portion 442 of the lead 44, and press down the pad portions. Accordingly, the pad portions 412, 432, and 442 are fixed. On the other hand, the clamp members 95 are plate shapes that are wider overall than the clamp members 90, and have tips (tip edges) that are formed with relatively smaller widths in a plan view (see FIG. 30). These tips come into contact with the pad portion 461 of the die pad 46 and press down the pad portion. Accordingly, the pad portion 461 is fixed. Furthermore, other portions (e.g., the tie bar 49 and the like) of the lead frame 4 may also be pressed down using other clamp members. In the example shown in the drawings, the tips of the clamp members 90 and 95 extend straight with respect to the portions on the base side (portions connected to the tip), but the present disclosure is not limited to this. For example, the tips of the clamp members 90 and 95 may also be attached to the portions on the base side so as to form a predetermined angle α (e.g., 180 degrees>α≥90 degrees). That is, the tips and the portions on the base side of the clamp members 90 and 95 may also be bent overall.

Figure 32:
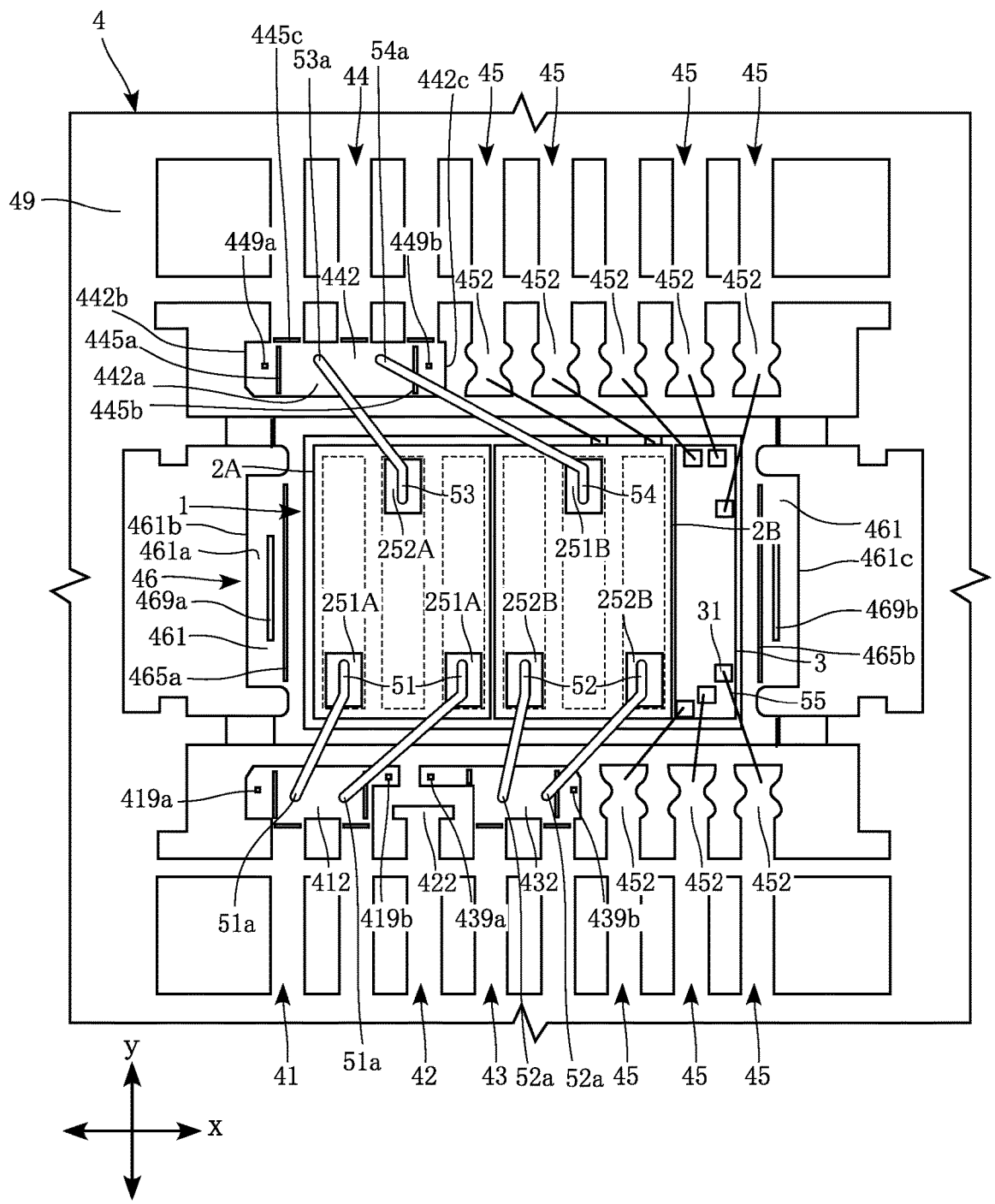
FIG. 32 is a plan view showing one step of the method for manufacturing the electronic device according to the first embodiment of the second aspect.

In the example shown in FIGS. 30 and 31, the area between the first groove 415a and the first edge 412b of the pad main surface 412a and the area between the second groove 415b and the second edge 412c of the pad main surface 412a are pressed down by the clamp members 90 in order to fix the pad portion 412 of the lead 41. At this time, as shown in FIG. 32, the first pressing mark 419a and the second pressing mark 419b are formed due to the pressing force of the clamp members 90 on the portions pressed by the clamp members 90. Similarly, the area between the first groove 435a and the first edge 432b of the pad main surface 432a and the area between the second groove 435b and the second edge 432c of the pad main surface 432a are pressed down by the clamp members 90 in order to fix the pad portion 432 of the lead 43. At this time, as shown in FIG. 32, the first pressing mark 439a and the second pressing mark 439b are formed due to the pressing force of the clamp members 90 on the portions pressed by the clamp members 90. Furthermore, the area between the first groove 445a and the first edge 442b of the pad main surface 442a and the area between the second groove 445b and the second edge 442c of the pad main surface 442a are pressed down by the clamp members 90 in order to fix the pad portion 442 of the lead 44. At this time, as shown in FIG. 32, the first pressing mark 449a and the second pressing mark 449b are formed due to the pressing force of the clamp members 90 on the portions pressed by the clamp members 90. Furthermore, the area between the third groove 465a and the first edge 461b and the area between the fourth groove 465b and the second edge 461c on the die pad main surface 461a are pressed down by the clamp members 95 in order to fix the pad portion 461 of the die pad 46. At this time, as shown in FIG. 32, the third pressing mark 469a and the fourth pressing mark 469b are formed due to the pressing force of the clamp members 95 on the portions pressed by the clamp members 95.

Before executing the bonding step, the arrangement and directions of the tip portions of the clamp members 90 and 95 are adjusted in advance and the clamp members 90 and 95 are fixed to the jig. During this adjustment, the positions of the tips of the clamp members 90 and 95 are adjusted using the first grooves 415a, 435a, and 445a, the second grooves 415b, 435b, and 445b, the third groove 465a, the fourth groove 465b, and the fifth grooves 415c, 435c, and 445c of the lead frame 4 set on the jig as markers. The positions of the tips of the clamp members 90 and 95 may also be adjusted by a worker through a manual operation using the grooves as markers, and the positions of the tips may also be adjusted through an operation of actuators that move the clamp members 90 and 95. Alternatively, the positions may also be adjusted automatically by the above-described actuators based on an image of the lead frame 4 shot from above, and based on the positional relationship between the grooves and the clamp members 90 and 95. The grooves that are to be used as markers for the adjustment may also be parallel or non-parallel to the outer edge of the lead frame.

The bonding of the wires 51 to 55 is performed using the procedure indicated below in a state in which the portions of the lead frame 4 are fixed by the clamp members 90 and 95.

In the bonding of the wires 51, first, the tip of a wedge tool to which a wire composed of Al is appended is brought into contact with the electrode pad 251A of the electronic component 1. Then, the wire is bonded to the electrode pad 251A by applying pressure and ultrasonic vibration from the wedge tool to the wire. Next, the tip of the wedge tool is moved from the electrode pad 251A to the pad portion 412 of the lead 41 while pulling out the wire. Then, the wire is bonded to the pad portion 412 by applying pressure and ultrasonic vibration from the wedge tool to the wires. At this time, the wire is bonded to the near side with respect to the fifth grooves 415c (the side close to the electrode pad 251A in the y direction; the same applies hereinafter in the positional relationship with the electrode pads) between the first groove 415a and the second groove 415b of the pad main surface 412a. Portions of the wires 51 pressed by the tip of the wedge tool deform, whereby the bonding portions 51a bonded to the pad portion 412 are formed. The bonding portions 51a intersect a line segment connecting two locations (the first pressing mark 419a and the second pressing mark 419b shown in FIG. 32) of the pad portion 412 that were pressed by the clamp members 90. After this bonding, the wires are cut using a cutter. Accordingly, as shown in FIG. 32, the wires 51 that connect the electrode pad 251A and the pad portion 412 are formed.

The bonding of the wires 52 to 54, which are composed of Al similarly to the wires 51, is performed similarly to the bonding of the wires 51. As shown in FIG. 32, the wires 52 each have one end bonded to an electrode pad 252B and another end (bonding portion 52a) bonded to the pad portion 432 of the lead 43. The bonding portions 52a are bonded on the near side with respect to the fifth grooves 435c, between the first groove 435a and the second groove 435b on the pad main surface 432a. The bonding portions 52a intersect a line segment connecting two locations (the first pressing mark 439a and the second pressing mark 439b shown in FIG. 32) of the pad portion 432 that were pressed by the clamp members 90. As shown in FIG. 32, the wire 53 has one end bonded to the electrode pad 252A and another end (bonding portion 53a) bonded to the pad portion 442 of the lead 44. The bonding portion 53a is bonded on the near side with respect to the fifth grooves 445c, between the first groove 445a and the second groove 445b on the pad main surface 442a. The bonding portion 53a intersects a line segment connecting two locations (the first pressing mark 449a and the second pressing mark 449b shown in FIG. 32) of the pad portion 442 that were pressed by the clamp members 90. As shown in FIG. 32, the wire 54 is formed with one end bonded to the electrode pad 251B and another end (bonding portion 54a) bonded to the pad portion 442 of the lead 44. The bonding portion 54a is bonded on the near side with respect to the fifth grooves 445c, between the first groove 445a and the second groove 445b on the pad main surface 442a. The bonding portion 54a intersects a line segment connecting two locations (the first pressing mark 439a and the second pressing mark 439b shown in FIG. 32) of the pad portion 442 that were pressed by the clamp members 90.

Thereafter, the wires 55 are respectively bonded to the electrode pads 31 and the pad portions 452 of the leads 45 through ball bonding. As shown in FIG. 32, the electronic component 1 and the lead frame 4 are connected by the wires 51 to 55 through the above-described bonding step.

Figure 33:
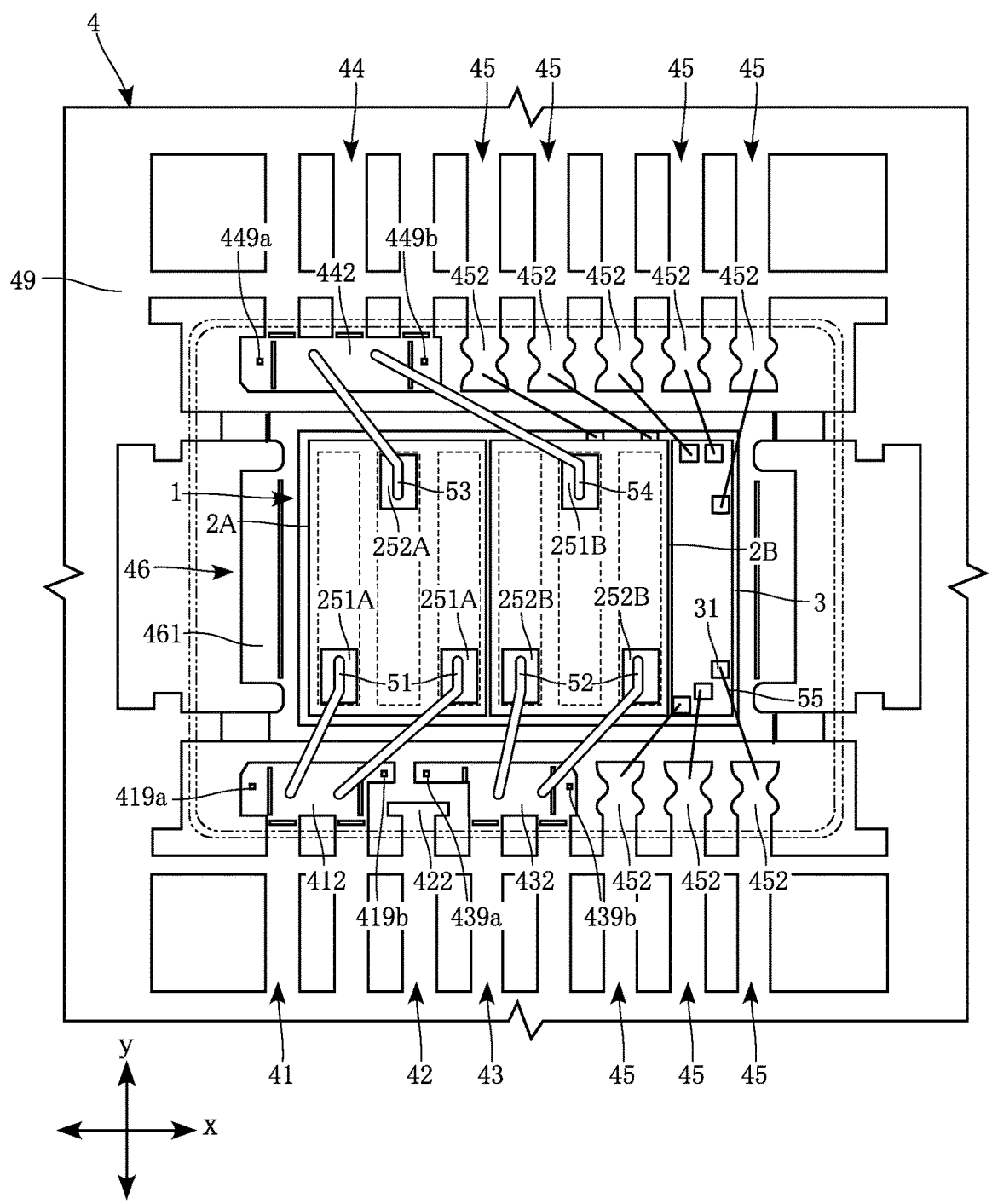
FIG. 33 is a plan view showing one step of the method for manufacturing the electronic device according to the first embodiment of the second aspect.

Next, as shown in FIG. 33 (see the two-dot chain lines), the resin member 6 is formed. The formation of the resin member 6 is performed through, for example, transfer molding. The constituent material of the resin member 6 is, for example, epoxy resin.

Next, the lead frame 4 is cut and divided for each electronic component 1. The cutting of the lead frame 4 is performed through, for example, forming lead processing using a punch mold (cut mold), blade dicing, and the like.

The electronic device B1 shown in FIGS. 19 to 26 is obtained through the above-described steps. Note that the above-described manufacturing method is an example, and the present disclosure is not limited thereto.

The actions and effects of the electronic device B1 and the actions and effects of the method for manufacturing the electronic device B1 are as follows.

According to the configuration of the electronic device B1, when the wires 51 are bonded to the pad portion 412 of the lead 41, the pad portion 412 is pressed down by the clamp members 90. Accordingly, it is possible to suppress a case in which the pad portion 412 shakes or deforms due to the pressure and vibration applied during the bonding. Accordingly, the wires 51 can be suitably bonded to the pad portion 412. Similarly, when the wires 52 are to be bonded to the pad portion 432 of the lead 43, the pad portion 432 is pressed down by the clamp members 90, and therefore it is possible to suppress a case in which the pad portion 432 shakes or deforms due to the pressure and vibration applied during bonding, and the wires 52 can be suitably bonded to the pad portion 432. Also, when the wire 53 and the wire 54 are to be bonded to the pad portion 442 of the lead 44, the pad portion 442 is pressed down by the clamp members 90, and therefore it is possible to suppress a case in which the pad portion 442 shakes or deforms due to the pressure and vibration applied during bonding, and the wire 53 and the wire 54 can be suitably bonded to the pad portion 442.

According to the configuration of the electronic device B1, the pad portion 412 includes the first groove 415a and the second groove 415b for clarifying the regions to be pressed down by the clamp members 90. Similarly, the pad portion 432 includes the first groove 435a and the second groove 435b for clarifying the regions to be pressed down by the clamp members 90. Also, the pad portion 442 includes the first groove 445a and the second groove 445b for clarifying the regions to be pressed down by the clamp members 90. Accordingly, in the adjustment of the positions of the tips of the clamp members 90, which is performed before the bonding step is executed, the tips of the clamp members 90 can be arranged at positions that do not hinder the bonding of the wires 51 to 54, using the first grooves 415a, 435a, and 445a, and the second grooves 415b, 435b, and 445b as markers. Also, even during the manufacture of the electronic device B1, it is possible to check whether or not the positions of the tips of the clamp members 90 are suitable positions. If a tip of a clamp member 90 is at a position past one of the grooves, it is sufficient that the line of the bonding step is stopped temporarily, the tip of the clamp member 90 is adjusted to a suitable position, and thereafter the line is resumed. For example, if the pad portion 412 does not include the first groove 415a and the second groove 415b, the regions in which the tip portions of the clamp portions 90 can be arranged will also not be clear. Accordingly, there is a possibility that the clamp member 90 and the wires 51 or the wedge tool for bonding the wires 51 will come into contact with each other. Since it is possible to prevent contact between the clamp member 90 and the wires 51 or the wedge tool during the bonding of the wires 51, the wires 51 can be suitably bonded to the pad portion 412 in the electronic device B1.

According to the configuration of the electronic device B1, the lead 41 includes fifth grooves 415c for clarifying the outer boundary in the y direction of the region in which the bonding portions 51a can be bonded. Accordingly, in the bonding step, the bonding portions 51a can be bonded in a suitable region surrounded by the fifth grooves 415c, the first groove 415a, and the second groove 415b. Similarly, the lead 43 includes the fifth grooves 435c for clarifying the outer boundary in the y direction of the region in which the bonding portion 52a can be bonded. Accordingly, in the bonding step, the bonding portions 52a can be bonded in a suitable region surrounded by the fifth grooves 435c, the first groove 435a, and the second groove 435b. Also, the lead 44 includes the fifth grooves 445c for clarifying the outer boundary in the y direction of the region in which the bonding portion 53a and the bonding portion 54a can be bonded. Accordingly, in the bonding step, the bonding portion 53a and the bonding portion 54a can be bonded in a suitable region surrounded by the fifth grooves 445c, the first groove 445a, and the second groove 445b.

According to the configuration of the electronic device B1, the first pressing mark 419a and the second pressing mark 419b, which are blemishes resulting from being pressed by the clamp members 90 during the bonding of the wires 51, are formed on the pad portion 412 of the lead 41. It is preferable that the bonding portions 51a of the wires 51 intersect a line segment connecting the first pressing mark 419a and the second pressing mark 419b. According to this configuration, it is possible to suitably prevent the pad portion 412 from shaking and deforming due to the pressure and vibration applied when bonding the wires 51 to the pad portion 412. Similarly, the first pressing mark 439a and the second pressing mark 439b, which are blemishes resulting from being pressed by the clamp members 90 during the bonding of the wires 52, are preferably formed on the pad portion 432 of the lead 43, and the bonding portions 52a preferably intersect a line segment connecting the first pressing mark 439a and the second pressing mark 439b. According to this configuration, it is possible to suitably prevent the pad portion 432 from shaking and deforming due to the pressure and vibration applied when bonding the wires 52 to the pad portion 432. Also, it is preferable that the first pressing mark 449a and the second pressing mark 449b, which are blemishes resulting from being pressed by the clamp members 90 during the bonding of the wire 53 and the wire 54, are formed on the pad portion 442 of the lead 44, and the bonding portion 53a and the bonding portion 54a intersect a line segment connecting the first pressing mark 449a and the second pressing mark 449b. According to this configuration, it is possible to suitably prevent the pad portion 442 from shaking or deforming due to the pressure and vibration applied when the wire 53 and the wire 54 are bonded to the pad portion 442.

According to the configuration of the electronic device B1, when the wires 51 to 55 are to be bonded to the electrode pads of the electronic component 1, the pad portion 461 of the die pad 46 on which the electronic component 1 is mounted is pressed down by the clamp members 95. Accordingly, it is possible to suppress a case in which the pad portion 461 shakes or deforms due to the pressure and vibration applied during the bonding. This makes it possible to suitably bond the wires 51 to 55 to the electrode pads of the electronic component 1. Also, the pad portion 461 includes the third groove 465a and the fourth groove 465b for clarifying the region to be pressed by the clamp members 95. Accordingly, in the mounting step, the electronic component 1 can be mounted at a suitable position on the die pad main surface 461a using the third groove 465a and the fourth groove 465b as markers. Also, in the adjustment of the positions of the tips of the clamp members 95, which is performed before the bonding step is executed, the tips of the clamp members 95 can be arranged using the third groove 465a and the fourth groove 465b as markers.

According to the configuration of the electronic device B1, the first grooves 415a, 435a, and 445a, the second grooves 415b, 435b, and 445b, the third groove 465a, the fourth groove 465b, the fifth grooves 415c, 435c, and 445c, and the first pressing marks 419a, 439a, and 449a, the second pressing marks 419b, 439b, and 449b, the third pressing mark 469a, and the fourth pressing mark 469b are all covered by the resin member 6. Accordingly, these portions do not appear on the exterior.

In the example shown in the drawings, a case was described in which the first groove 415a and the second groove 415b are parallel to each other and are parallel to the first edge 412b and the second edge 412c, but the present disclosure is not limited to this. The first groove 415a may also be inclined with respect to the first edge 412b. Also, the second groove 415b may also be inclined with respect to the second edge 412c. Similarly, the first groove 435a may also be inclined with respect to the first edge 432b, and the second groove 435b may also be inclined with respect to the second edge 432c. Also, the first groove 445a may also be inclined with respect to the first edge 442b, and the second groove 445b may also be inclined with respect to the second edge 442c.

Figure 34:
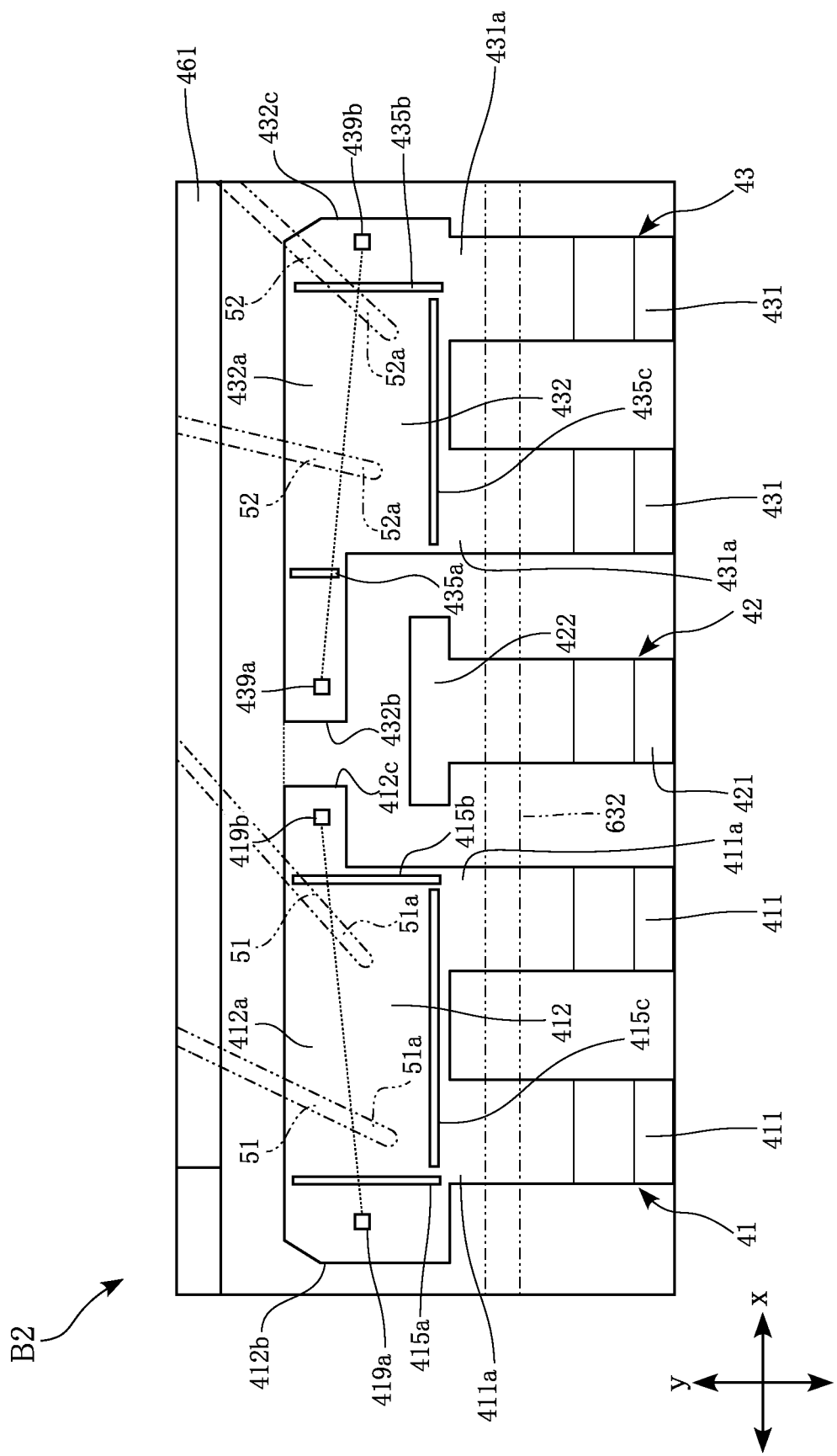
FIG. 34 is a plan view showing a portion of an electronic device according to a second embodiment of the second aspect.

Based on FIG. 34, an electronic device B2 according to a second embodiment of a second aspect will be described. FIG. 34 is a plan view showing a portion of the constituent elements of the electronic device B2, and corresponds to FIG. 21.

The arrangement of the fifth groove 415c and the fifth groove 435c of the electronic device B2 differs from that of the electronic device B1. Also, the arrangement of the fifth groove 445c in the electronic device B2 (see FIG. 32) differs from that of the electronic device B1, although this is not shown in FIG. 34. Specifically, the fifth groove 415c is arranged on the pad portion 412 in the electronic device B2. The fifth groove 415c is a groove that is recessed in the z direction from the pad main surface 412a, and extends in the x direction. The fifth groove 415c is covered by the resin member 6 and is parallel to a resin side surface 632. The fifth groove 415c is arranged in order to clarify the outer boundary in the y direction of the region in which the bonding portions 51a can be bonded in the lead 41. Similarly, the fifth groove 435c is arranged on the pad portion 432. The fifth groove 435c is a groove that is recessed in the z direction from the pad main surface 432a, and extends in the x direction. The fifth groove 435c is covered by the resin member 6 and is parallel to the resin side surface 632. The fifth groove 435c is arranged in order to clarify the outer boundary in the y direction of the region in which the bonding portions 52a can be bonded in the lead 43. Similarly, the fifth groove 445c is arranged on the pad portion 442, and corresponds to one continuous groove obtained by moving the three fifth grooves 445c shown in FIG. 20 in the downward direction in the drawing. The groove has a form that is interposed between the first groove 445a and the second groove 445b and extends lengthwise in the x direction. The fifth groove 445c is covered by the resin member 6 and is parallel to the resin side surface 632. The fifth grooves 445c are arranged in order to clarify the outer boundary in the y direction of the region in which the bonding portion 53a and the bonding portion 54a can be bonded on the lead 44.

As shown in FIG. 34, in the step of bonding the electronic device B2 as well, the pad portions 412 and 432 and the like are pressed down by the clamp members 90 and 95, and a groove for indicating the region to be pressed down is formed on the pad portions 412 and 432 and the like. Fifth grooves 415c and 435c and the like for clarifying the outer boundaries in the y direction of the regions to which the bonding portions 51a and 52a and the like can be bonded are also formed. Accordingly, it is possible to exhibit an effect similar to that of the first embodiment of the second aspect.

Based on FIG. 35, an electronic device B3 according to a third embodiment of a second aspect will be described.

The electronic device B3 differs from the electronic device B1 in that a first auxiliary groove 415d is formed on the pad portion 412 of the lead 41 and a second auxiliary groove 435d is formed on the pad portion 432 of the lead 43.

The first auxiliary groove 415d is a groove that is similar to the first groove 415a, is arranged between the first groove 415a and the first edge 412b, and is parallel to the first groove 415a. The first auxiliary groove 415d is arranged toward the first edge 412b with respect to the first pressing mark 419a in the x direction. That is, the first pressing mark 419a is formed between the first groove 415a and the first auxiliary groove 415d in the x direction. In the step of bonding the wires 51, the first auxiliary groove 415d is arranged in order to clarify the region to be pressed by the tip portions of the clamp members 90. In the step of bonding the wires 51 of the electronic device B3, the clamp members 90 press down the region between the first groove 415a and the first auxiliary groove 415d.

The second auxiliary groove 435d is a groove that is similar to the second groove 435b, is arranged between the second groove 435b and the second edge 432c, and is parallel to the second groove 435b. The second auxiliary groove 435d is arranged toward the second edge 432c with respect to the second pressing mark 439b in the x direction. That is, the second pressing mark 439b is formed between the second groove 435b and the second auxiliary groove 435d in the x direction. In the step of bonding the wires 52, the second auxiliary groove 435d is arranged in order to clarify the region to be pressed by the tip portions of the clamp members 90. In the step of bonding the wires 52 of the electronic device B3, the clamp members 90 press down the region between the second groove 435b and the second auxiliary groove 435d.

In the configuration of the electronic device B3 as well, in the bonding step, the pad portions 412 and 432 and the like are pressed down by the clamp members 90 and 95, and grooves for clarifying the regions to be pressed down are formed on the pad portions 412 and 432 and the like. Fifth grooves 415c and 435c and the like for clarifying the outer boundaries in the y direction of the regions to which the bonding portions 51a and 52a and the like can be bonded are also formed. Accordingly, it is possible to exhibit an effect similar to that of the first embodiment of the second aspect. Furthermore, according to the configuration of the electronic device B3, in the bonding step, it is possible to more precisely indicate the regions to be pressed down by the clamp members 90 on the pad portions 412 and 432.

Figure 35:
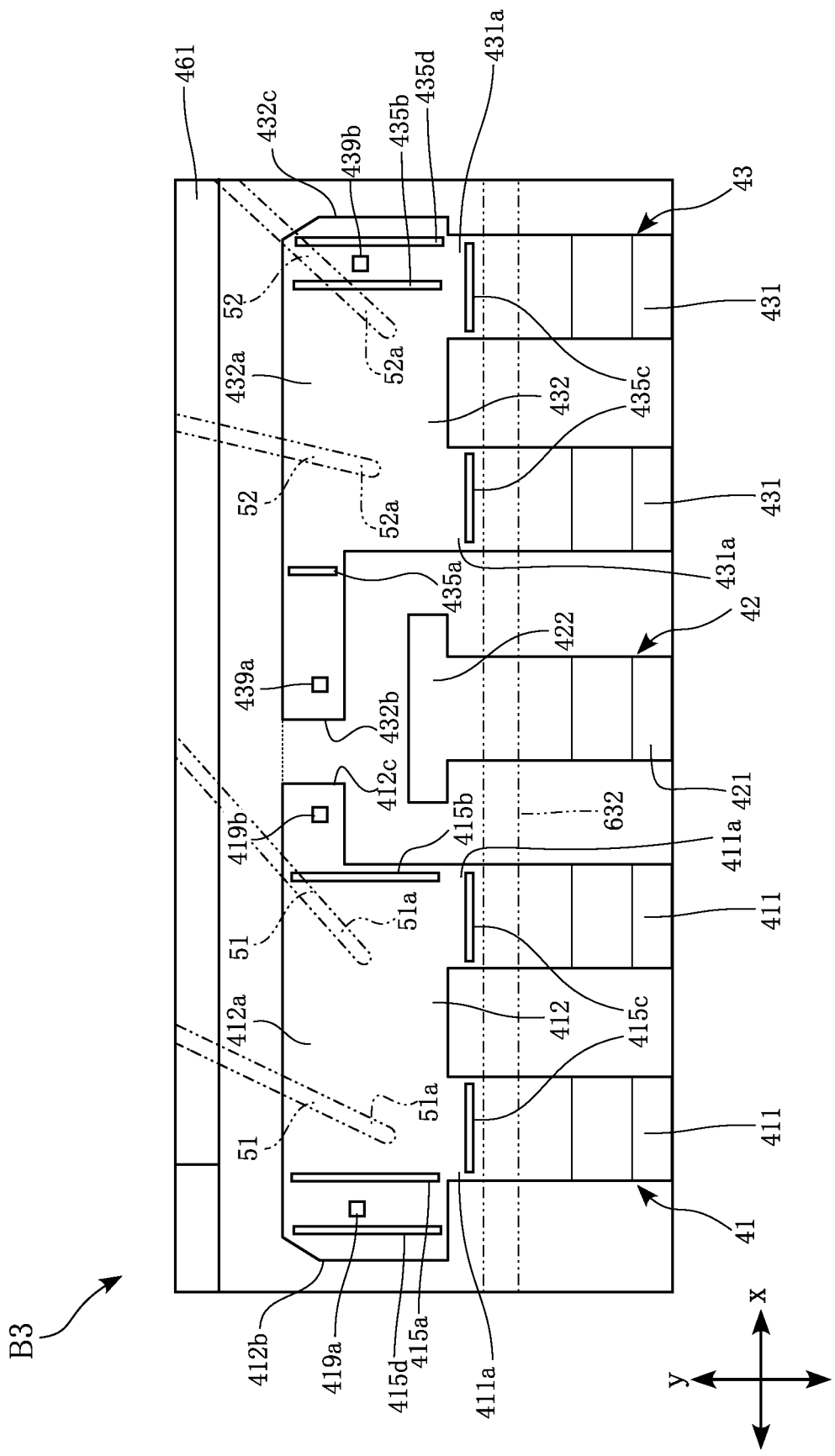
FIG. 35 is a plan view showing a portion of an electronic device according to a third embodiment of the second aspect.

In the example shown in FIG. 35, no auxiliary groove for the second groove 415b is provided on the pad main surface 412a and no auxiliary groove for the first groove 435a is provided on the pad main surface 432a. Alternatively, auxiliary grooves such as those described above may also be formed on the pad main surfaces 412a and 432a. Also, one or more grooves may also be formed on the pad portion 442 of the lead 44.

Based on FIG. 36, an electronic device B4 according to a fourth embodiment of a second aspect will be described. The electronic device B4 shown in FIG. 36 differs from the electronic device B1 in that rectangular frame-shaped grooves are formed in the pad portions 412 and 432.

Specifically, the rectangular frame-shaped groove formed in the pad portion 412 is composed of a linear first groove 415a and another first auxiliary groove 415e. The first groove 415a of the electronic device B4 has a smaller dimension in the y direction compared to the first groove 415a of the electronic device B1. Similarly to the first groove 415a, the first auxiliary groove 415e is a continuous groove that is recessed in the z direction from the pad main surface 412a and is approximately C-shaped in a plan view. In FIG. 36, the upper end of the first auxiliary groove 415e is connected to the upper end of the first groove 415a and the lower end of the first auxiliary groove 415e is connected to the lower end of the first groove 415a. The first pressing mark 419a is formed in a rectangular region surrounded by the first groove 415a and the first auxiliary groove 415e. The first groove 415a and the first auxiliary groove 415e indicate the region to be pressed down by the tip portions of the clamp members 90 in the step of bonding the wires 51.

Figure 36:
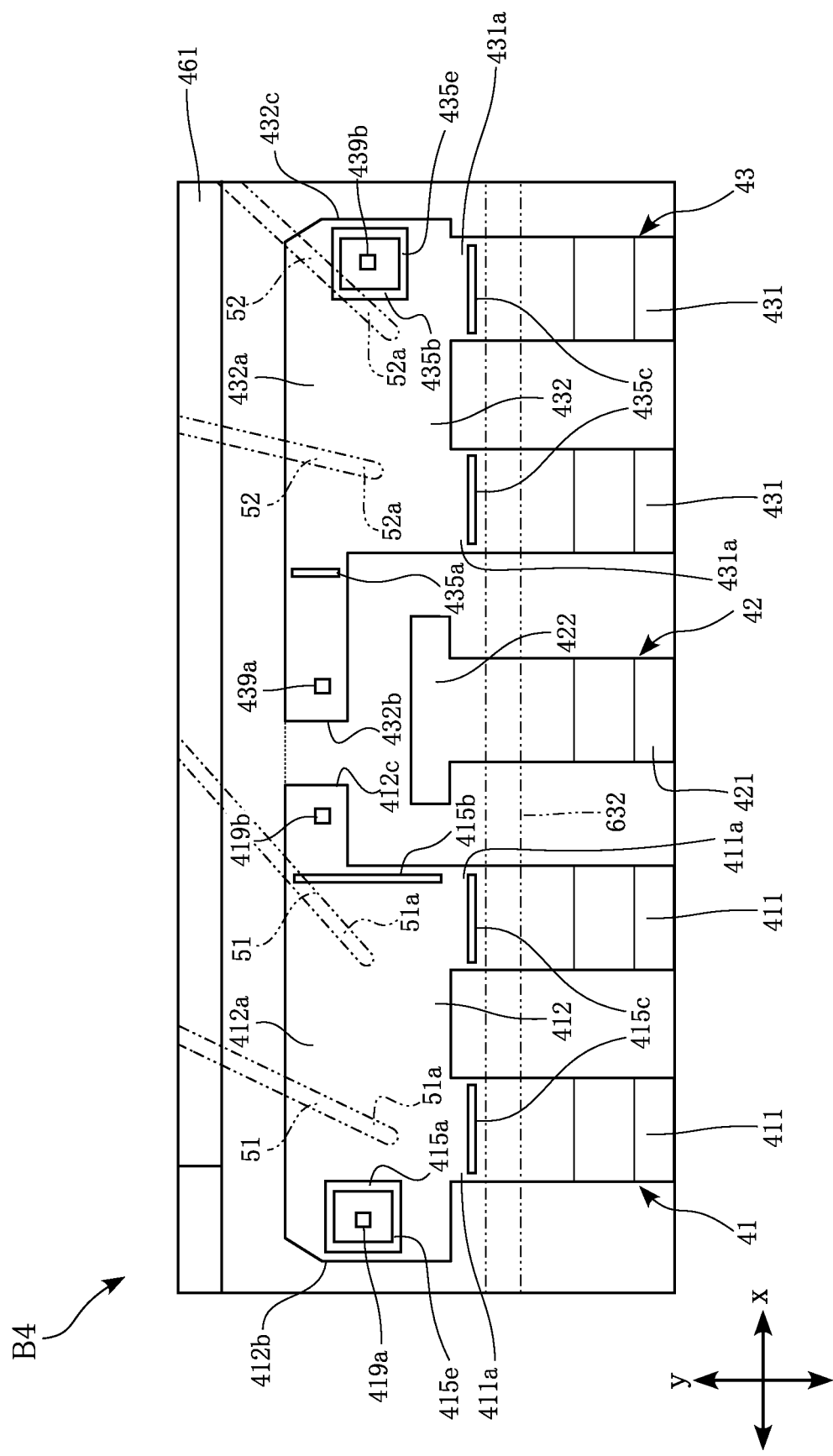
FIG. 36 is a plan view showing a portion of an electronic device according to a fourth embodiment of the second aspect.

As shown in FIG. 36, a rectangular frame-shaped groove is formed in the pad portion 432 as well. This groove is composed of a linear second groove 435b and a second auxiliary groove 435e that is connected to the second groove 435b. Similarly to the second groove 435b, the second auxiliary groove 435e is a continuous groove that is recessed in the z direction from the pad main surface 432a, has an upper end connected to the upper end of the second groove 435b, and has a lower end connected to the lower end of the second groove 435b. The second pressing mark 439b is formed in a rectangular region surrounded by the second groove 435b and the second auxiliary groove 435e. The second groove 435b and the second auxiliary groove 435e clarify the region to be pressed down by the tip portions of the clamp members 90 in the step of bonding the wires 52.

In the configuration of the electronic device B4 as well, in the bonding step, the pad portions 412 and 432 and the like are pressed down by the clamp members 90 and 95, and grooves for clarifying the regions to be pressed down are formed on the pad portions 412 and 432 and the like. Fifth grooves 415c and 435c and the like for clarifying the outer boundaries in the y direction of the regions to which the bonding portions 51a and 52a and the like can be bonded are also formed. Accordingly, an effect similar to that of the first embodiment of the second aspect is exhibited.

In the example shown in FIG. 36, an auxiliary groove for the second groove 415b and an auxiliary groove for the first groove 435a may also be formed. Also, one or more grooves may also be formed in the pad portion 442 of the lead 44 as well.

In the example shown in FIG. 36, the groove surrounding the first pressing mark 419a (or the second pressing mark 439b) is rectangular in a plan view, but the present disclosure is not limited to this, and the groove may also have another polygonal shape or a circular shape.

Figure 37:
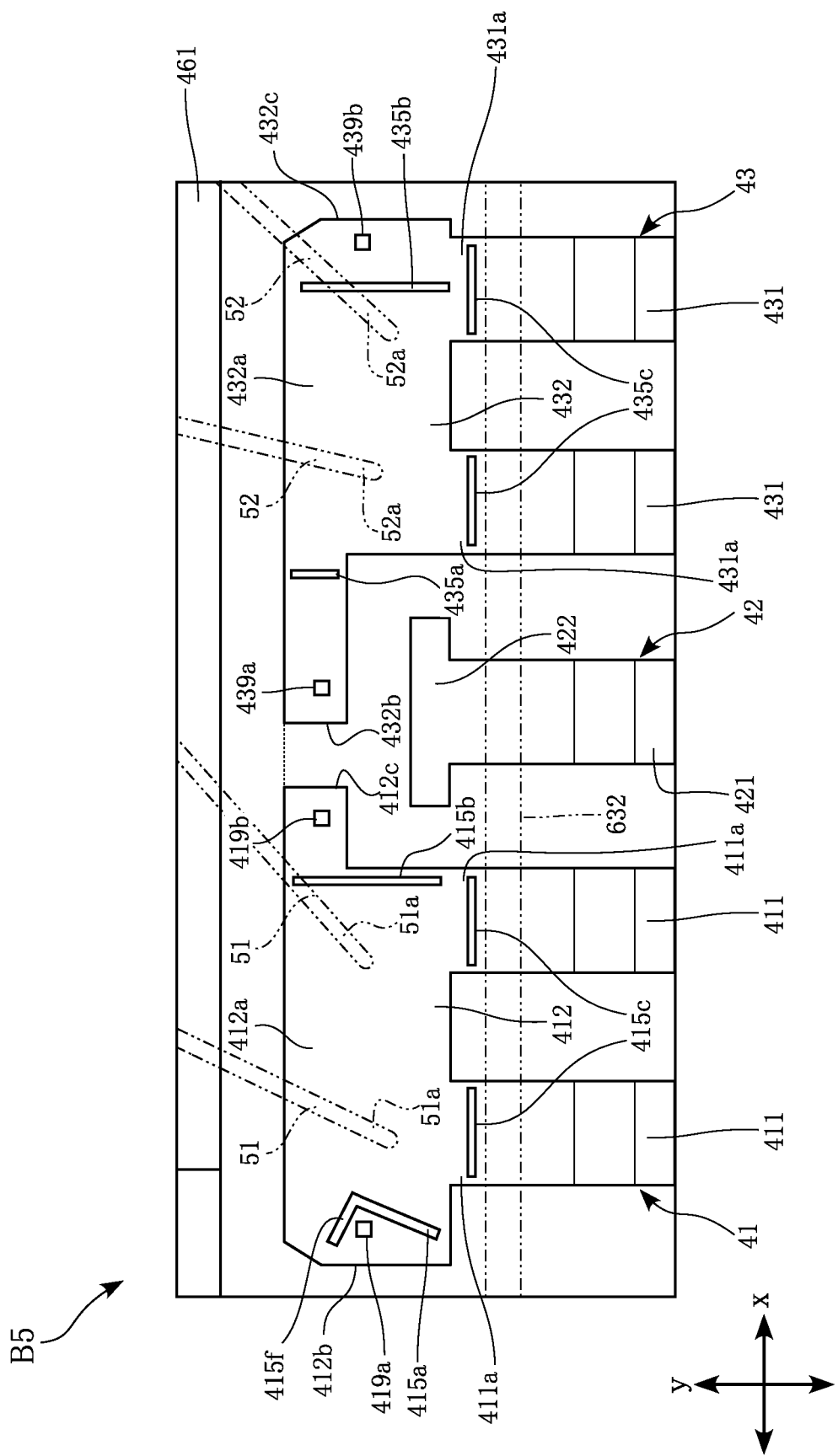
FIG. 37 is a plan view showing a portion of an electronic device according to a fifth embodiment of the second aspect.
Figure 38:
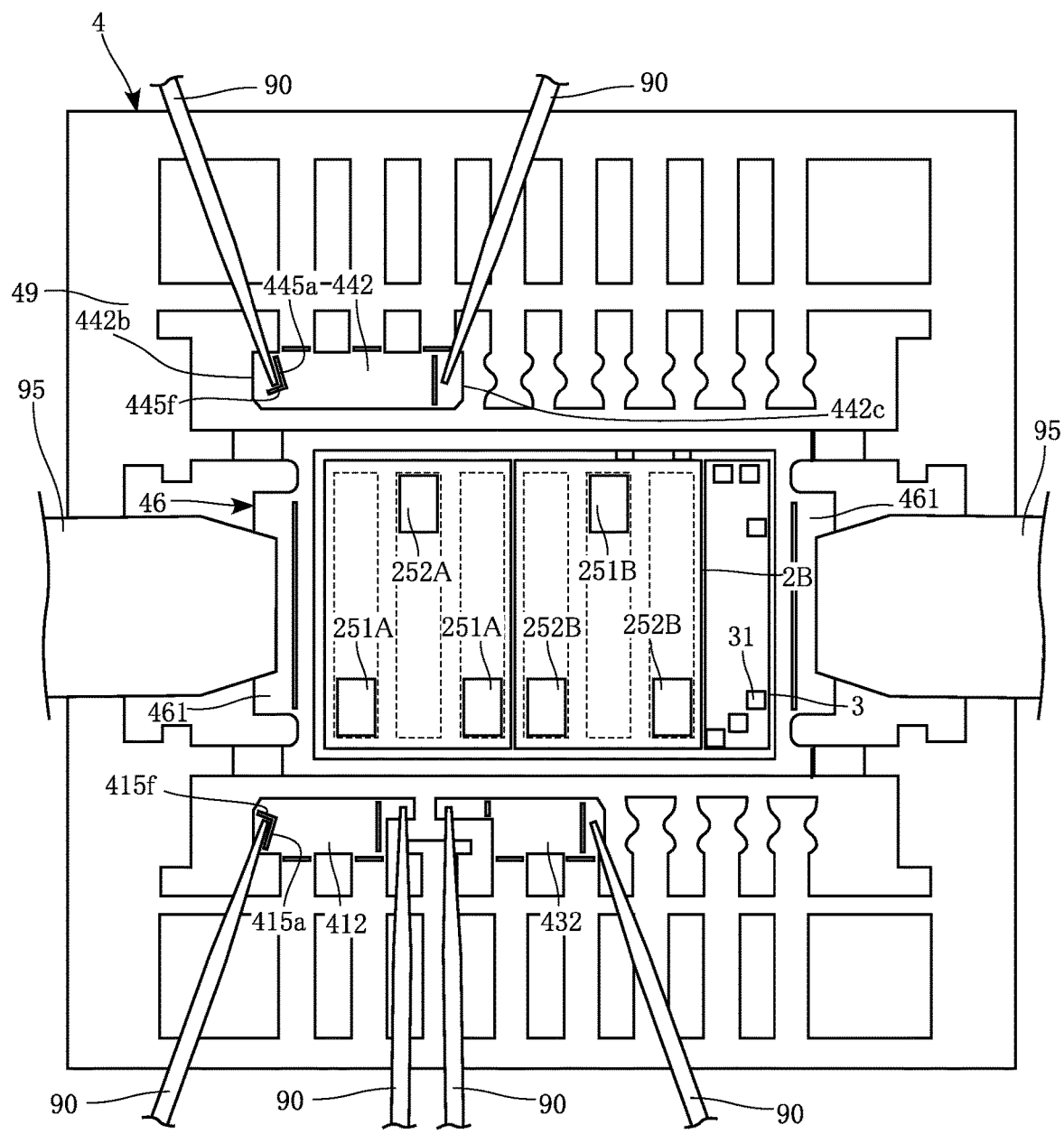
FIG. 38 is a plan view showing one step of the method for manufacturing the electronic device according to the fifth embodiment of the second aspect.

Based on FIGS. 37 and 38, an electronic device B5 according to the fifth embodiment of the second aspect will be described. FIG. 37 is a plan view showing a portion of the constituent elements of the electronic device B4, viewed through the resin member 6. FIG. 38 is a plan view showing one step according to a method for manufacturing the electronic device B5.

In the electronic device B5, the shape of a groove formed in the pad portion 412 differs from that of the electronic device B1 according to the first embodiment of the second aspect.

As shown in FIG. 37, a groove with a bent shape overall is formed in the pad portion 412 of the electronic device B5. This groove is composed of a linear first groove 415a and a linear first auxiliary groove 415f. The first groove 415a is not parallel and is inclined with respect to the first edge 412b. The first groove 415a is parallel to the wire 51 that is adjacent to the groove. The first auxiliary groove 415f has one end connected to one end of the first groove 415a. The first auxiliary groove 415f is a groove that is recessed in the z direction from the pad main surface 412a, similarly to the first groove 415a. The first auxiliary groove 415f extends so as to intersect the first groove 415a. The first pressing mark 419a is formed between the above-described groove with the bent shape (the first groove 415a and the first auxiliary groove 415e) and the first edge 412b. As shown in FIG. 38, a groove with a similar bent shape is formed in the pad portion 442 as well.

The above-described first groove 415a and the above-described first auxiliary groove 415e indicate the orientations and positions of the tip portions of the clamp members 90 that are to be arranged in the bonding step of the wire 51. Specifically, as shown in FIG. 38, in the step of bonding the wires 51, the clamp member 90 is arranged such that the tip portion extends along the first groove 415a and the apex is located in the first auxiliary groove 415f (or nearby).

As shown in FIG. 37, the wires 51 are bonded to the pad main surface 412a in a state of being inclined with respect to the y direction. This indicates that when the wires 51 are bonded to the pad portion 412, the wedge tool will move in downward and to the left. In this case, if the clamp member 90 is arranged parallel to the y direction, there is a risk that the wedge tool and the clamp member 90 will come into contact with each other. In order to prevent this kind of contact, the electronic device B5 is configured such that the directions of the tip portions and the positions of the apexes of the clamp members 90 that are to be arranged during the bonding step are designed using the first groove 415a and the first auxiliary groove 415e.

In the electronic device B5, the first groove 445a of the pad portion 442 is inclined with respect to the first edge

442b, but is parallel to the wire 53 (see FIG. 33). Also, the pad portion 442 includes a first auxiliary groove 445f that is connected to the first groove 445a. The first auxiliary groove 445f is a groove that is recessed in the z direction from the pad main surface 442a, similarly to the first groove 445a. The first auxiliary groove 445f extends in a direction intersecting the first groove 445a. The first pressing mark 449a (see FIG. 33) is formed between the groove with the bent shape that is composed of the first groove 445a and the first auxiliary groove 445f, and the first edge 442b. The first groove 445a and the first auxiliary groove 445f indicate the orientation and position of the tip portion of the clamp member 90 that is to be arranged in the step of bonding the wire 53. In the step of bonding the wire 53, the clamp member 90 is arranged such that the tip portion of the clamp member 90 extends along the first groove 445a and the apex is located in the first auxiliary groove 445f (or nearby).

It is also possible to use a configuration in which the orientation of the tip of the clamp member 90 is indicated also by a groove other than the first groove 415a of the pad portion 412 and the first groove 445a of the pad portion 442.

In the above-described first to fifth embodiments of the second aspect, a case was indicated in which the first semiconductor element 2B is arranged between the first semiconductor element 2A and the second semiconductor element 3, but the present disclosure is not limited thereto. For example, the first semiconductor element 2A may also be arranged between the first semiconductor element 2B and the second semiconductor element 3. In this case, the lead 41 is electrically connected to the semiconductor region 222B (source region) of the first semiconductor element 2B. Accordingly, the lead 41 corresponds to the terminal PGND of the circuit diagram shown in FIG. 27. Also, the lead 43 is electrically connected to the semiconductor region 221A (drain region) of the first semiconductor element 2A. Accordingly, the lead 43 corresponds to the terminal PVIN of the circuit diagram shown in FIG. 27.

In the above-described first to fifth embodiments of the second aspect, the lead 42 includes the pad portion 422, but the present disclosure is not limited to this. For example, the lead 42 may also be constituted by only the terminal portion 421. In this case, it is possible to reduce the size of or eliminate the notches in the pad portion 412 and the pad portion 432. Also, in the above-described first to fifth embodiments, a case was indicated in which the lead 42 is not electrically connected to the electronic component 1, but the lead 42 may also be electrically connected to the electronic component 1. However, the pad portion 422 of the lead 42 is smaller and has a smaller region for bonding the bonding wires compared to, for example, the pad portion 452. For this reason, it is preferable to use, for example, a thin wire similar to the wire to electrically connect the pad portion 422 and the electronic component 1.

In the above-described first to fifth embodiments of the second aspect, a case was indicated in which the electronic component 1 includes the first semiconductor elements 2A and 2B (e.g., MOSFETs) and the second semiconductor element 3 (e.g., a control IC), but the present disclosure is not limited thereto. For example, the electronic component 1 may also not include any one of the first semiconductor elements 2A and 2B, and may include one of the first semiconductor elements 2A and 2B and the second semiconductor element 3 for controlling the one of the first semiconductor elements 2A and 2B. Alternatively, the electronic component 1 may also not include the second semiconductor element 3 and may include the two first semiconductor elements 2A and 2B. Alternatively, the electronic component 1 may also not include any one of the first semiconductor elements 2A and 2B and the second semiconductor element 3, and may include only one of the first semiconductor elements 2A and 2B.

In the above-described first to fifth embodiments of the second aspect, a case was indicated in which the electronic devices B1 to B5 are SOP package structures, but the present disclosure is not limited thereto. For example, the package structure may be that of a TO (Transistor Outline) package, a QFP (Quad Flat Package), an SON (Small Outline Non-leaded Package), a DFN (Dual Flatpack Non-leaded Package), a QFN (Quad Flat Non-leaded Package), or the like.

The electronic device, the lead frame, and the method for manufacturing the electronic device based on the second aspect are not limited to the above-described embodiments. Specific configurations of the portions of the electronic device and the lead frame of the present disclosure and specific processes of the steps of the method for manufacturing the electronic device of the present disclosure can be designed and modified in various ways.

The electronic device, the lead frame, and the method for manufacturing the electronic device according to the second aspect of the present disclosure may be defined as in the following clauses.

Clause 1B. An electronic device comprising:
an electronic component provided with at least one electrode pad;
a die pad having an obverse surface facing in a first direction, the electronic component being mounted on the obverse surface of the die pad;
a lead spaced apart from the die pad; and
a connection member electrically connecting the electrode pad and the lead to each other,
wherein the connection member comprises a bonding portion bonded to the lead, and
the lead comprises: a pad obverse surface to which the bonding portion is bonded; a first groove recessed from the pad obverse surface in the first direction; and a first pressing mark recessed from the pad obverse surface in the first direction and disposed opposite to the bonding portion with respect to the first groove.

Clause 2B. The electronic device according to clause 1B, wherein the pad obverse surface comprises a first edge opposite to the bonding portion with respect to the first groove.

Clause 3B. The electronic device according to clause 2B, wherein the first groove extends in parallel to the first edge.

Clause 4B. The electronic device according to clause 2B or 3B, wherein a distance between the first groove and the first edge is 0.2 mm or greater and 1.0 mm or less.

Clause 5B. The electronic device according to any one of clauses 2B to 4B, wherein the first groove extends in parallel to the connection member.

Clause 6B. The electronic device according to any one of clauses 2B to 5B, wherein the lead is formed with a first auxiliary groove recessed from the pad obverse surface in the first direction and disposed between the first edge and the first groove.

Clause 7B. The electronic device according to clause 6B, wherein the first groove extends in parallel to the first auxiliary groove.

Clause 8B. The electronic device according to clause 6B, wherein the first groove and the first auxiliary groove intersect each other.

Clause 9B. The electronic device according to any one of clauses 1B to 5B, wherein the lead is formed with a first auxiliary groove recessed from the pad obverse surface in the first direction, and the first auxiliary groove and the first groove define a region in which the first pressing mark is formed.

Clause 10B. The electronic device according to any one of clauses 1B to 9B, wherein the lead is formed with a second groove and a second pressing mark,
the second grove is recessed from the pad obverse surface in the first direction and disposed opposite to the first groove with respect to the bonding portion, and
the second pressing mark is recessed from the pad obverse surface in the first direction and disposed opposite to the bonding portion with respect to the second groove.

Clause 11B. The electronic device according to clause 10B, wherein the bonding portion is disposed on a line segment connecting the first pressing mark and the second pressing mark.

Clause 12B. The electronic device according to any one of clauses 1B to 11B, wherein the die pad comprises: a die pad obverse surface on which the electronic component is mounted; a third groove recessed from the die pad obverse surface in the first direction; and a third pressing mark recessed from the die pad obverse surface in the first direction and disposed opposite to the electronic component with respect to the third groove.

Clause 13B. The electronic device according to clause 12B, wherein the die pad comprises: a fourth groove recessed from the die pad obverse surface in the first direction and disposed opposite to the third groove with respect to the electronic component; and a fourth pressing mark recessed from the die pad obverse surface in the first direction and disposed opposite to the electronic component with respect to the fourth groove.

Clause 14B. The electronic device according to any one of clauses 1B to 13B, further comprising a resin member covering the electronic component, wherein the lead comprises: a pad portion having a pad obverse surface; and a terminal portion connected to the pad portion and exposed from the resin member.

Clause 15B. The electronic device according to clause 14B, wherein the terminal portion comprises: a terminal obverse surface facing in a same sense of the first direction as the pad obverse surface; and a fifth groove recessed from the terminal obverse surface in the first direction, the fifth groove being covered by the resin member.

Clause 16B. The electronic device according to clause 14B, wherein the pad portion is formed with a fifth groove recessed from the pad obverse surface in the first direction, the fifth groove being covered by the resin member.

Clause 17B. The electronic device according to any one of clauses 1B to 16B, wherein the electronic component comprises: a conductive layer elongated as viewed in the first direction; and an insulating protective film covering the conductive layer,
the at least one electrode pad is formed by a portion of the conducive layer that is exposed via an opening formed in the protective film.

Clause 18B. The electronic device according to clause 17B, further comprising an additional connection member, wherein the protective film is formed with a plurality of openings via which a corresponding number of portions of the conducive layer are exposed, respectively, and
at least two portions of the corresponding number of portions of the conducive layer are electrically connected to each other by the additional connection member.

Clause 19B. The electronic device according to clause 18B, wherein the protective film comprises three portions that are exposed from the protective film and electrically connected to each other by the additional connection member.

Clause 20B. The electronic device according to clause 19B, wherein the additional connection member is a single wire.

Clause 21B. A lead frame comprising:
a die pad including an obverse surface facing in a first direction, the obverse surface being configured to support an electronic component; and
a lead to be connected to the electronic component via a connection member,
wherein the lead comprises: a pad obverse surface to which the connection member is bonded; a first groove recessed from the pad obverse surface in the first direction; and a pressing mark recessed from the pad obverse surface in the first direction and disposed opposite to a bonding region for the connection member with respect to the first groove.

Clause 22B. A method for manufacturing an electronic device, the method comprising:
preparing a lead frame that includes a die pad and a lead, the die pad having an obverse surface facing in a first direction;
mounting an electronic component on the obverse surface of the die pad, the electronic component being provided with an electrode pad; and
bonding a connection member to the electrode pad and the lead,
wherein said bonding a connection member comprises pressing down, with a clamp member, a region of the lead that is opposite to a bonding region of the connection member with respect to the first groove in bonding the connection member to the lead.

Clause 23B. The method according to clause 22B, wherein the lead is formed with a second groove that is recessed from the pad obverse surface in the first direction and disposed opposite to the first groove with respect to the bonding region, and
said bonding a connection member comprises pressing down, with a clamp member, a region of the lead that is opposite to the bonding region with respect to the second groove.

The invention claimed is:
1. An electronic device comprising:
an electronic component provided with a first electrode pad;
a die pad including an obverse surface perpendicular to a first direction, the electronic component being mounted on the obverse surface;
a first lead spaced apart from the die pad in a second direction perpendicular to the first direction;
a second lead separated from the die pad and the first lead; and
a first connection member electrically connecting the first electrode pad and the first lead to each other,
wherein the first lead and the second lead are disposed on a same side of the die pad in the second direction,
as viewed in the first direction, the first lead includes a first extended portion extending in a third direction perpendicular to the first direction and the second direction, the first extended portion including a first edge and a second edge that are spaced apart from each other in the second direction, the first edge being closer to the die pad than is the second edge in the second direction,
the first connection member is bonded to the first lead, as viewed in the first direction, the second lead includes a third edge and a fourth edge that are spaced apart from each other in the second direction, the third edge being greater in length than the fourth edge in the third direction, and the first edge of the first extended portion is placed closer to the die pad than is the third edge of the second lead in the second direction.

2. The electronic device according to claim 1, wherein the die pad comprises a protrusion extending in the third direction.

3. The electronic device according to claim 2, further comprising a third lead formed with a plurality of external terminals.

4. The electronic device according to claim 3, wherein the third lead is placed closer to the die pad than the second lead in the second direction.

5. The electronic device according to claim 4, further comprising a fourth lead and a fifth lead that are spaced apart from the die pad by a mutually equal distance in the second direction.

6. The electronic device according to claim 5, wherein the fourth lead and the fifth lead have a same shape.

7. The electronic device according to claim 6, further comprising a sixth lead, a seventh lead, an eighth lead, a ninth lead and a tenth lead that are opposite to the first lead with respect to the die pad in the second direction.

8. The electronic device according to claim 7, wherein the sixth lead, the seventh lead, the eighth lead, the ninth lead and the tenth lead have a mutually same shape.

9. The electronic device according to claim 8, wherein the sixth lead, the seventh lead, the eighth lead, the ninth lead and the tenth lead are spaced apart from the die pad by a mutually same distance in the second direction.

10. The electronic device according to claim 9, further comprising a molding resin that covers the die pad and the electronic component.

11. The electronic device according to claim 10, wherein the molding resin covers an entirety of the electronic component.

12. The electronic device according to claim 11, wherein said electronic device is configured as a small outline package (SOP).

13. The electronic device according to claim 12, wherein the electronic component comprises an active region.

14. The electronic device according to claim 13, wherein the first to the tenth leads comprise respective intermediate portions that extend generally along the first direction.

15. The electronic device according to claim 14, wherein the intermediate portions of the first to the fifth leads are aligned along the third direction.

16. The electronic device according to claim 15, wherein the intermediate portions of the sixth to the tenth leads are aligned along the third direction.

17. The electronic device according to claim 16, wherein the intermediate portions of the first to the tenth leads are disposed outside of the molding resin.

* * * * *